(12) United States Patent
Sumi

(10) Patent No.: US 6,522,183 B2
(45) Date of Patent: Feb. 18, 2003

(54) PLL DEVICE AND PROGRAMMABLE FREQUENCY-DIVISION DEVICE

(75) Inventor: Yasuaki Sumi, Tottori (JP)

(73) Assignees: Sanyo Electric Co., Ltd., Osaka-fu (JP); Tottori Sanyo Electric Co., Ltd., Tottori-ken (JP)

(*) Notice: Subject to any disclaimer, the term of this patent is extended or adjusted under 35 U.S.C. 154(b) by 0 days.

(21) Appl. No.: 09/888,175

(22) Filed: Jun. 22, 2001

(65) Prior Publication Data

US 2001/0048329 A1 Dec. 6, 2001

Related U.S. Application Data

(63) Continuation of application No. PCT/JP00/00390, filed on Jan. 26, 2000.

(30) Foreign Application Priority Data

| Jan. 29, 1999 | (JP) | ............................................ 11-022167 |
| May 25, 1999 | (JP) | ............................................ 11-145142 |
| May 27, 1999 | (JP) | ............................................ 11-148346 |
| May 28, 1999 | (JP) | ............................................ 11-150475 |
| Jul. 15, 1999 | (JP) | ............................................ 11-201752 |
| Jul. 29, 1999 | (JP) | ............................................ 11-215251 |
| Jan. 26, 2000 | (WO) | ................................. PCT/JP00/00390 |

(51) Int. Cl.$^7$ .............................................. H03L 7/06
(52) U.S. Cl. ...................... 327/159; 327/150; 327/160; 375/376; 331/DIG. 2
(58) Field of Search ......................... 327/144, 146–151, 327/155–157, 159, 160, 162, 163, 166; 331/10–12, 25, 1 A, DIG. 2, 177 R; 375/371, 373–376, 362; 365/233

(56) References Cited

U.S. PATENT DOCUMENTS 4,888,564 A * 12/1989 Ishigaki ...................... 331/1 A
5,254,959 A    10/1993 Wünch ......................... 331/12
5,521,948 A *  5/1996 Takeuchi ...................... 331/11
5,856,761 A *  1/1999 Jokura ......................... 331/1 A

FOREIGN PATENT DOCUMENTS

| EP | 0907252 | 4/1999 |
| GB | 2288931 | 1/1995 |
| JP | 05268079 | 10/1993 |
| JP | 06045925 | 2/1994 |
| JP | 07106959 | 4/1995 |
| JP | 07297713 | 10/1995 |
| JP | 09261048 | 10/1997 |
| JP | 10135822 | 5/1998 |
| JP | 10135826 | 5/1998 |
| JP | 11163722 | 6/1999 |

* cited by examiner

Primary Examiner—Minh Nguyen
(74) Attorney, Agent, or Firm—William E. Pelton, Esq.

(57) ABSTRACT

A PLL device has a voltage-controlled oscillator, a reference generator that generates reference signals with different phases, and a main divider that divides the frequency of the output signal of the voltage-controlled oscillator by a frequency-division ratio N1. An auxiliary divider divides the frequency of the output of the main divider by a frequency-division ratio N2. A distribution circuit distributes the output of the auxiliary divider as feedback signals. Phase detectors compare the reference signals and the feedback signals, and generate error signals. Each of the main divider and the auxiliary divider has a programmable divider or a counter. The main divider and the auxiliary divider are both operative during start-up to shorten PLL lock-up time, and the auxiliary divider then powers down to reduce power consumption.

4 Claims, 22 Drawing Sheets

PLL DEVICE AND PROGRAMMABLE FREQUENCY-DIVISION DEVICE

This application is a continuation of PCT International Application No. PCT/JP00/00390, filed Jan. 26, 2000, designating the United States of America, the contents of which are incorporated by reference into the present invention.

BACKGROUND OF THE INVENTION

1. Field of the Invention

The present invention relates to a PLL device. The present invention also relates to a programmable frequency-division device.

2. Background Art

An example of a device of this type is shown on page 32 of the Sanyo Technical Review, Vol. 10, No. 1, February 1978. The device shown in FIG. 1 therein includes a reference oscillator that generates a reference signal, a programmable divider that divides the frequency of the output signal to generate a feedback signal, and a single phase detector that compares the phase and frequency of the feedback signal FV with the phase and frequency of the reference signal and generates an error signal ER. Also provided are a low-pass filter that generates a control voltage corresponding to the error signal, and a voltage-controlled oscillator that generates the output signal corresponding to the control voltage.

If this PLL device is optimally designed, however, then in theory, there is a uniquely determined relationship between the frequency of the reference signal and the locking time. There is, accordingly, a disadvantage in that the locking time cannot be further shortened. To overcome this disadvantage, the present inventor has tried out configurations that generate a plurality of reference signals with different phases, and provide multiple phase-detector and programmable-divider stages. There is a disadvantage of high overall power consumption in these configurations, however, because power is consumed in the multiple phase-detector stages. Another disadvantage is that when there are multiple phase-detector and programmable-divider stages, the circuit becomes large in scale and difficult to implement in an LSI.

Moreover, because of the increasing number of subscribers in recent years, it has become impossible to provide the increased number of channels with existing frequency bands. A PLL device that can be used in high-frequency bands has therefore become necessary. Conventional programmable dividers, however, have the disadvantage of a limited maximum frequency value, due to the variability of their frequency-division ratios.

The fixed prescaler system has been devised to solve these problems. If a fixed divider with a frequency division ratio of four is provided in stages preceding and following the phase detector and programmable divider, for example, then the frequency of the reference signal becomes ¼ of the reference frequency. The number of phase comparisons then becomes ¼ of the original number, with the consequent disadvantage that the locking time is lengthened.

Other conventional PLL devices have been shown in Japanese Unexamined Patent Publications 10-190563 and 10-135822, but they also have the problems described above.

A programmable frequency-division device for use in a PLL device has been described in, for example, Japanese Unexamined Patent Publication 9-261048. This programmable frequency-division device includes a programmable divider that alternately divides the frequency of an output signal by N and N+1, a first output means, a second output means that delays the input signal by one-half period, and a selector circuit that selects the output of the second output means when the programmable divider divides by N, and selects the output of the first output means when the programmable divider divides by N+1; it outputs a signal with a frequency divided by N+½.

The programmable frequency-division device described above has the disadvantage of a poor jitter characteristic, however. That is, it does not output an accurate N+½ frequency division. When the present inventor identified the cause of this problem, it was found to be the insertion of an inverter between the input signal and the second output means. By inverting the input signal, this inverter causes a half-cycle delay with respect to the input signal in the second output means.

Because of the device characteristics of the inverter, the output of the second output means is delayed by more than one-half cycle, for which reason, it was found, frequency division by N+½ is not performed accurately.

The present invention addresses these types of past disadvantages, with the object of providing a PLL device that has a short locking time and low power consumption.

Another object of the invention is to provide a PLL device that can be used in high-frequency bands.

Still another object of the invention is to provide a PLL device that is low in cost and easy to implement in an LSI.

Yet another object of the invention is to provide a programmable frequency-division device with an improved jitter characteristic.

SUMMARY OF THE INVENTION

The foregoing and other objects are attained in accordance with a preferred embodiment of the invention by providing a PLL device comprising a voltage-controlled oscillator, a generating means that generates a plurality of reference signals with different phases, and a main divider that divides the frequency of the output signal of the voltage-controlled oscillator by a frequency-division ratio N1. An auxiliary divider divides the frequency of the output of the main divider by a frequency-division ratio N2. A distribution circuit distributes the output of the auxiliary divider as a plurality of feedback signals. Phase detectors compare the reference signals and the feedback signals, and generate error signals. Each of the main divider and the auxiliary divider has a programmable divider or a counter. The main divider and the auxiliary divider are both operative during start-up to shorten PLL lock-up time, and the auxiliary divider then powers down to reduce power consumption.

DISCLOSURE OF THE INVENTION

A PLL device according to one aspect of the invention comprises:
- a programmable frequency-division device (113, 114, 115, 116) that divides the frequency of the output of a voltage-controlled oscillator (112);
- a reference signal generating means (101, 102, 103, 104) generating a first reference signal and a second reference signal that differ in phase;
- a first comparator (106) that compares the phases of said first reference signal and the output of said programmable frequency-division device;
- a second comparator (110) that compares the phases of said second reference signal and the output of said programmable frequency-division device;

a detector (118, 120, 122, 124) for detecting a locked state; and a control unit (117);

wherein the control unit (117) causes both said first comparator (106) and said second comparator (110) to perform comparisons when the state is not locked, and causes one of said first comparator (106) and said second comparator (110) to perform comparisons when the state is locked.

A PLL device according to another aspect of the invention comprises:

a programmable frequency-division device (113, 114, 115, 116) that divides the frequency of the output of a voltage-controlled oscillator (112);

a reference signal generating means (101, 102, 103, 104) generating a first reference signal and a second reference signal that differ in phase;

a first comparator (106) that compares the phases of said first reference signal and the output of said programmable frequency-division device;

a second comparator (110) that compares the phases of said second reference signal and the output of said programmable frequency-division device; and a control unit (117); wherein when the control unit (117) alters the frequency-division ratio from a first value to a second value, it selects a predetermined one of said first comparator (106) and said second comparator (110) according to the difference between said first value and said second value, and causes that comparator to perform the comparison.

A PLL device according to another aspect of the invention comprises:

a reference signal generating means (133, 134, 135, 136, 137) generating a plurality of reference signals with different phases;

programmable dividers (145, 146, 147, 148) receiving, through a first fixed divider (143), the output of a voltage-controlled oscillator (144), and dividing the frequency thereof; and phase detectors (139, 140, 141, 142) comparing the phases of the outputs of said programmable dividers (145, 146, 147, 148) and said reference signals; wherein a plurality of said programmable dividers (145, 146, 147, 148) are provided, each performing frequency division with a frequency-division ratio of the form A+B/C (where A, B, and C are integers, and B<C).

A PLL device according to another aspect of the invention comprises:

a plurality of PLL circuits (202, 205), each having at least a first phase detector (204, 254) and a first programmable divider (205, 255);

a driving unit (216) having at least one second phase detector (220, 221, 222) and at least one second programmable divider (223, 224, 225); and a selective coupling means (235) selecting one PLL circuit (202, 252) from among said plurality of PLL circuits and coupling it to said driving unit (216).

A PLL device according to another aspect of the invention comprises:

a generating means (306) that generates a plurality of reference signals with different phases;

a plurality of programmable dividers (311 to 314) that divide the frequency of the output of a voltage-controlled oscillator (315) and output feedback signals;

a plurality of phase detectors (307 to 310) that compare the phases of said reference signals and said feedback signals; and a control unit (330) that starts the frequency division operations of said programmable dividers in synchronism with the phases of said reference signals.

A PLL device according to another aspect of the invention comprises:

a generating means (430) that generates a plurality of reference signals with different phases;

a main divider (430) that divides the frequency of the output signal of a voltage-controlled oscillator (429) by a frequency-division ratio N1;

an auxiliary divider (431) that divides the frequency of the output of said main divider (430) by a frequency-division ratio N2;

a distribution circuit (432) that distributes the output of said auxiliary divider (431) to a plurality of feedback signals; and phase detectors (412 to 419) that compare said reference signals and said feedback signals, and output error signals; wherein said main divider and said auxiliary divider each have a programmable divider or a counter.

A PLL device according to another aspect of the invention comprises:

a generating means (403) that generates a plurality of reference signals with different phases;

a first frequency-division unit (430, 431) and a second frequency-division unit (481), each dividing the frequency of the output signal of a voltage-controlled oscillator (429); and phase detectors (412 to 419) that compare the phases of feedback signals output by said first frequency-division unit and said second frequency-division unit and said reference signals, and output error signals.

A frequency-dividing device according to another aspect of the invention comprises:

a programmable divider (502, 542) that divides the frequency of an input signal alternately by N (where N is an integer) and by N+1;

a first output means (506, 546) that outputs a signal synchronized with the output of said programmable divider (502, 542);

a second output means (509, 549) that outputs a signal in which a signal synchronized with the output of said programmable divider is delayed by one-half cycle with respect to said input signal;

a selection circuit (510, 550) that selects the output of said first output means when said programmable divider performs frequency division by N, and selects the output of said second output means when said programmable divider performs frequency division by N+1; and a prevention means (507, 509; 534, 535) that prevents the output signal of said second output means from being delayed by more than said one-half cycle.

BEST MODES OF PRACTICING THE INVENTION

Embodiments of the invention will be described below with reference to the attached drawings.

Figure 1:
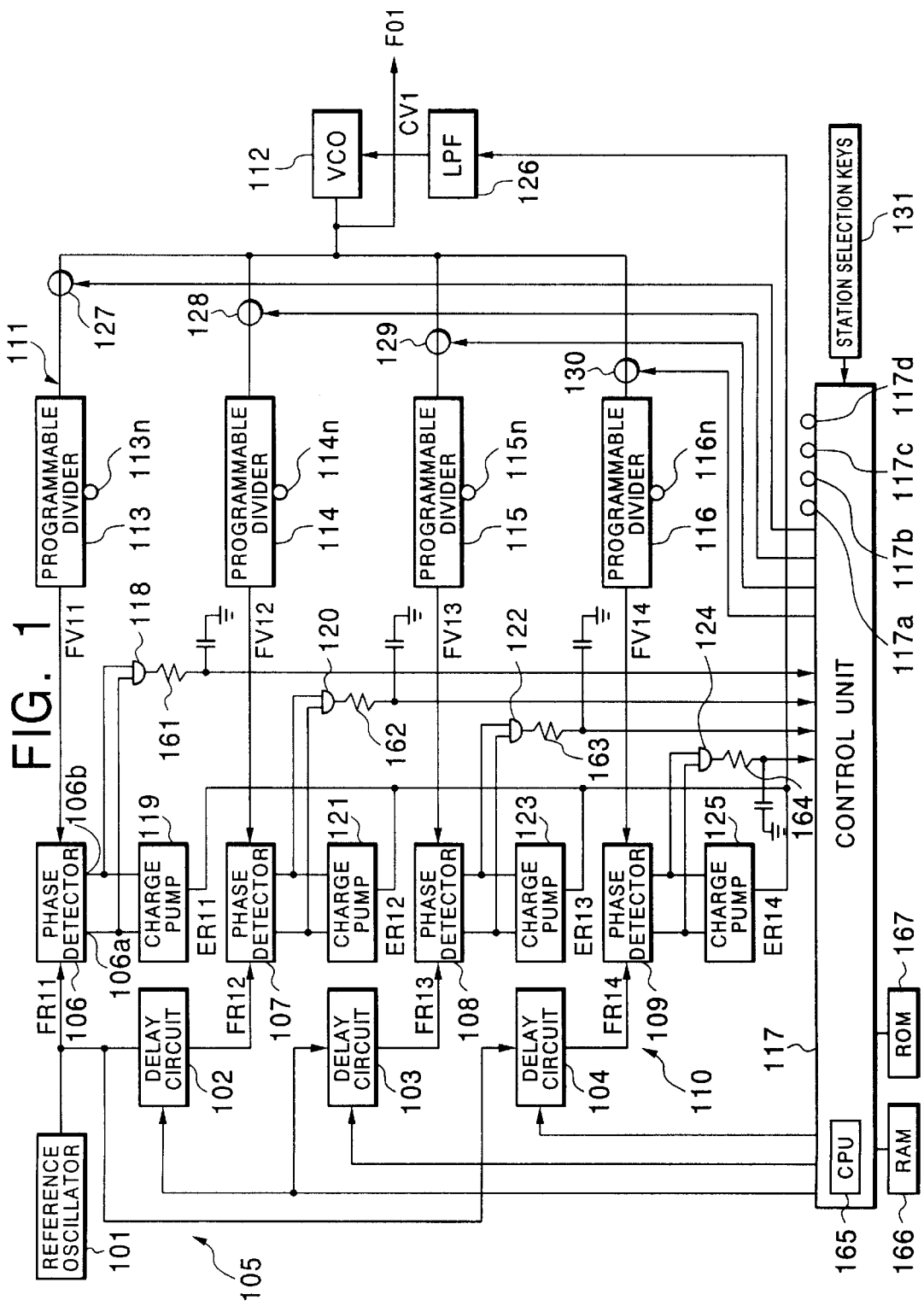
FIG. 1 is a block diagram of a PLL device according to a first embodiment of the invention.

FIG. 1 shows a PLL device according to a first embodiment of the invention. In FIG. 1, the reference oscillator 101 outputs a first reference signal FR11. The delay circuits 102, 103, 104 generate a plurality of second reference signals FR12, FR13, FR14, corresponding to the first reference signal FR11, but with mutually differing phases. The reference oscillator 101 and delay circuits 102, 103, 104 constitute a reference signal generating means 105.

The first reference signal FR11 is input to a first comparator (phase detector) 106. Delay circuit 102 delays the first reference signal FR11 by ¼ period and outputs it to a phase detector 107 as second reference signal FR12. Delay circuit 103 delays the first reference signal FR11 by ½ period and outputs it to a phase detector 108 as second reference signal FR13. Delay circuit 104 delays the first reference signal FR11 by ¾ period and outputs it to a phase detector 9 as second reference signal FR14. These phase detectors 107, 108, 109 constitute a second comparator 110.

A programmable frequency-division device 111 divides the frequency of an output signal FO1 from a voltage-controlled oscillator 112, and generates feedback signals FV11, FV12, FV13, FV14. The programmable frequency-division device 111 comprises, for example, programmable dividers 113, 114, 115, 116, the input terminals of which are coupled to the output terminal of the voltage-controlled oscillator 112, and which perform frequency division by integer ratios.

The first comparator 106 compares the phase and frequency of the output (feedback signal FV11) of programmable divider 113 with the phase and frequency of the first reference signal FR11. As a result of this comparison, the first comparator 106 outputs a pump-up signal and a pump-down signal at its two output terminals 106a and 106b. A detector 118, comprising an AND gate or the like, takes the logical AND of the pump-up signal and pump-down signal, and outputs an output signal (a lock detection signal) through an RC circuit 161 to a control unit 117 (comprising a CPU 165 etc.). The locked state is detected by this detector 118. The pump-up signal and pump-down signal are input to a charge pump 119, which outputs an error signal ER11.

Similarly, the second comparator 110 compares the phase and frequency of the outputs FV12, FV13, FV14 of the programmable frequency-division device 111 with the phase and frequency of the second reference signals FR12, FR13, FR14.

Specifically, phase detector 107 compares the phase and frequency of the feedback signal FV12 of programmable divider 114 with the phase and frequency of second reference signal FR12. As a result of this comparison, phase detector 107 outputs a pump-up signal and a pump-down signal to a detector 120, which takes the logical AND of these two signals, and outputs it through an RC circuit 162 to the control unit 117. Both of the two signals are input to a charge pump 121, which outputs an error signal ER12.

Phase detector 108 compares the phase and frequency of the feedback signal FV13 of programmable divider 115 with the phase and frequency of second reference signal FR13. As a result of this comparison, phase detector 108 outputs a pump-up signal and a pump-down signal to a detector 122, which takes the logical AND of the two signals, and outputs it through an RC circuit 163 to the control unit 117. Both of the two signals are input to a charge pump 123, which outputs an error signal ER13.

Phase detector 109 compares the phase and frequency of the feedback signal FV14 of programmable divider 116 with the phase and frequency of second reference signal FR14. As a result of this comparison, phase detector 109 outputs a pump-up signal and a pump-down signal to a detector 124, which takes the logical AND of the two signals, and outputs it through an RC circuit 164 to the control unit 117. Both of the two signals are input to a charge pump 125, which outputs an error signal ER14.

The second comparator 110 thus comprises a plurality of phase detectors 107, 108, 109 that compare the phases etc. of the second reference signals FR12, FR13, FR14 individually with those of the outputs FV12, FV13, FV14 of the programmable frequency-division device 111.

In response to the error signals ER11, ER12, ER13, ER14 from the phase detectors 106, 107, 108, 109, a low-pass filter 126 outputs a control voltage CV1 to the voltage-controlled oscillator 112. The voltage-controlled oscillator 112 generates the output signal FO1 in response to the above control voltage CV1.

The control unit 117 controls the delay circuits 102, 103, 104 and gate circuits 127, 128, 129, 130 according to the first reference signal FR11. The gate circuits 127 to 130 synchronize the start of frequency division by the programmable dividers 113 to 116 with respective delay circuits 102 to 104.

As a specific example of the way in which gate circuits 127 are opened when the frequency of the output of the voltage-controlled oscillator 112 is divided, first, gate circuit 127 is opened (is turned on) under the control of the control unit 117. Following this, gate circuit 128 opens, ¼ period later than gate circuit 127. Gate circuit 129 opens ¼ period later than gate circuit 128. Gate circuit 130 opens ¼ period later than gate circuit 129. Thus are formed a maximum of four loops that compare phases with a ¼-period delay.

Output terminals 117a, 117b, 117c, 117d of the control unit 117 are coupled to terminals 113n, 114n, 115n, 116n of programmable dividers 113, 114, 115, 116, respectively (to avoid complex drawings, the connecting signals are omitted). Station selection keys 131 are also coupled to the control unit 117. The above constituent elements form a PLL device 132.

Figure 2:
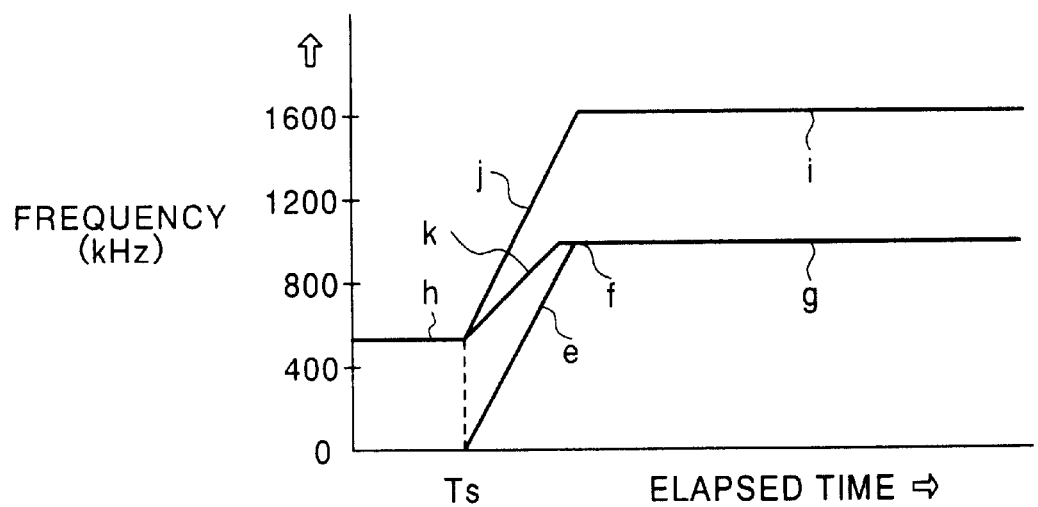
FIG. 2 is a drawing showing the operation of the PLL device in FIG. 1.
Figure 3:
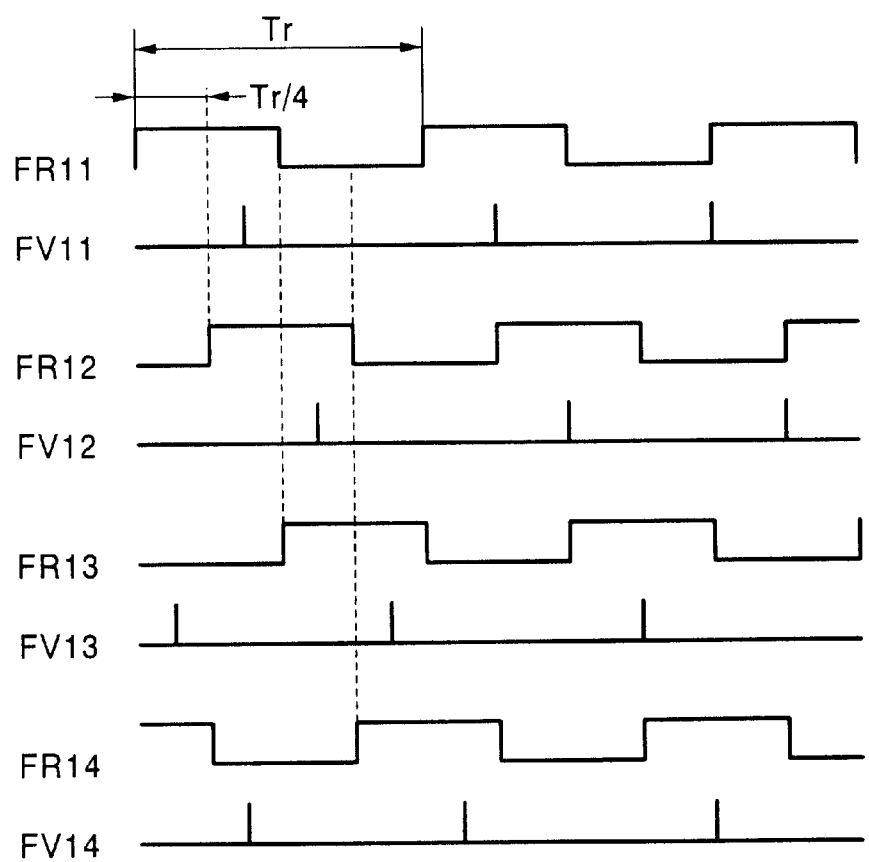
FIG. 3 is a timing diagram showing the operation of the PLL device in FIG. 1.

Next, the operation of this PLL device 132 will be described with reference to FIGS. 1 to 3. FIG. 2 shows changes in the frequency of the output of the PLL device 132; FIG. 3 is a timing diagram of the PLL device 132. It will be assumed later in these drawings that a 531-kHz station is currently selected. The upper superheterodyne system is used in the AM radio band, so the actual frequency of the output signal of the voltage-controlled oscillator 112 is 531 kHz+450 kHz=981 kHz.

It will also be assumed that at time Ts, the user operates a station selection key 131 and sets the frequency to, for example, 999 kHz. For the AM band, the frequency of the first reference signal FR11 is fixed at the channel spacing frequency of 9 kHz, so the control unit 117 sends the ratio (999+450)/9=161 to the programmable dividers 113, 114, 115, 116 through terminals 117a, 117b, 117c, 117d and terminals 113n, 114n, 115n, 116n.

At the initial rise of the output signal FO1, since the difference between the frequency of the first reference signal FR11 and the frequency of feedback signal FV11 is large, the logical AND signal of the pump-up signal and pump-down signal output by the first comparator 110 is at the low level (Low). As a result, detector 118 outputs a low-level signal to the control unit 117, and the control unit 117 recognizes the unlocked state.

When the control unit 117 recognizes the unlocked state, it has both the first comparator 106 and the second comparator 110 perform the above comparison, in a four-loop mode in which all of the phase detectors 106, 107, 108, 109 operate.

The reference oscillator 101 generates the first reference signal FR11 with a reference frequency fr (and period Tr=1/fr). The control unit 117 controls the delay circuits 102, 103, 104 so as to delay the second reference signals FR12, FR13, FR14 successively by ¼ of the period of the first reference signal FR11 (Tr/4). The frequencies of the reference signals furnished to the phase detectors 106, 107, 108, 109 are identical, but their phases are offset in steps of π/2.

In the first period of the first reference signal FR11, the control unit 117 controls the gate circuits 127, 128, 129, 130 so that they open individually in synchronization with the rise of the reference signals FR11, FR12, FR13, FR14. The output signal FO1 from the voltage-controlled oscillator 112 is thus divided by the designated frequency-division ratio by the programmable dividers 113, 114, 115, 116 at times successively ¼-period later, and supplied to the phase detectors 106, 107, 108, 109 as the feedback signals FV11, FV12, FV13, FV14.

The phases and frequencies of the feedback signals FV11, FV12, FV13, FV14 are compared with the phases and frequencies of the reference signals FR11, FR12, FR13, FR14 by the phase detectors 106, 107, 108, 109, and the resulting error signals ER11, ER12, ER13, ER14 are furnished to the low-pass filter 126. Overall, accordingly, the phase detectors 106, 107, 108, 109 perform four phase comparisons during one period of the first reference signal FR11.

The error signals ER11, ER12, ER13, ER14 are converted to a control voltage in the low-pass filter 126. The voltage-controlled oscillator 112 generates an output signal FO1 having a frequency proportional to the control voltage CV1. The frequency of the output signal FO1 thus rises as shown at 'e' in FIG. 2.

As the frequencies of the feedback signals FV11, FV12, FV13, FV14 (the frequency of the output signal FO1 divided by the frequency division ratio) approach the frequency of the reference signals FR11, FR12, FR13, FR14 (see 'f' in FIG. 2), the logical AND signals of the pump-up signals and pump-down signals output by the phase detectors 106, 107, 108, 109 go High (to the high level). Consequently, the detectors 118, 120, 122, 124 output high-level signals to the control unit 117, which recognizes the locked state.

When the control unit 117 recognizes the locked state, it has either the first comparator 106 or the second comparator 110 continue the above comparison, and has the other one stop the above comparison operation. For example, the control unit 117 establishes the single-loop mode, in which only the first comparator (phase detector) 106 operates. To allow only the first comparator 106 to operate, gate circuits 128, 129, 130 are closed and only gate circuit 127 is kept in the on-state; or the supply of an enable signal from the control unit 117 to the first comparator 106 is continued and the supply of an enable signal to the second comparator 110 is stopped.

The increased power consumption due to the multiple-stage loop can thus be mitigated because after lock-up, a single-loop mode is established, in which the first comparator 106 operates alone (see 'g' in FIG. 2).

Next, the operations will be described that take place when, from the state in which the 531-kHz frequency is selected (see FIG. 2), at time Ts, the user operates a station selection key 131 to switch to receiving another radio station, and alters the setting to a frequency of 1620 kHz (see 'i' in FIG. 2).

First, the control unit 117 stores the frequency-division ratio (531+450)/9=109 corresponding to the frequency of 531 kHz initially set by the station selection keys 131 in a first memory unit (comprising, for example, a RAM 166 or the like) connected to the control unit 117. The control unit 117 also stores the new frequency-division ratio (1620+450)/9=230 corresponding to the frequency of 1620 kHz set after that in the first memory unit.

Next, the control unit 117 calculates the difference between the initial frequency-division ratio and the new frequency-division ratio (230−109=121). The control unit 117 also reads a combination of phase detectors corresponding to the above difference from a table stored in a second memory unit (comprising, for example, a ROM 167 or the like) connected to the control unit 117. In the case above, for example, the control unit 117 selects the four-loop mode that operates all of the phase detectors 106, 107, 108, 109. As a result, the reference signals FR11, FR12, FR13, FR14 are compared with the feedback signals FV11, FV12, FV13, FV14 by the phase detectors 106, 107, 108, 109, by the same operation as described above. The result is that the output signal FO1 rapidly rises from position 'h' to position 'i' as shown by 'j' in FIG. 2.

The operations when, from the state in which the frequency of 531+450=981 kHz is set (see 'h' in FIG. 2), at time Ts, the user alters the setting to a frequency of 999+450=1449 kHz (see 'g' in FIG. 2) will also be described. This time, the control unit 117 calculates the difference (161−109=52) between the initial frequency-division ratio (531+450)/9=109 and the new frequency-division ratio (999+450)/9=161 and, using a table (ROM 167) in the second memory unit, selects a two-loop mode that operates phase detector 106 and phase detector 108, for example. Thus it opens gate circuits 127 and 129 and closes gate circuits 128, 130.

With this type of control, the output signal FO1 moves rapidly from position 'h' to position 'g' as indicated by 'k' in FIG. 2. The frequency alteration ('k') in this station change is slower than when it is driven up to position 'j' (1620 kHz) with four loops, but since the amount of change from position 'h' to position 'g' is small, even with two loops, the lock-up time is sufficiently small. Since two loops are being operated, the increase in power consumption can also be mitigated, as compared with operating four loops. Thus as described above, in the present invention, the control unit 117 selects certain phase detectors from among the first comparator 106 and the second comparator 110, according to the difference between the initial frequency-division ratio and the new frequency-division ratio (for example, one loop, two loops, three loops, or four loops), and has the above phase comparison performed by the selected phase detectors.

Figure 4:
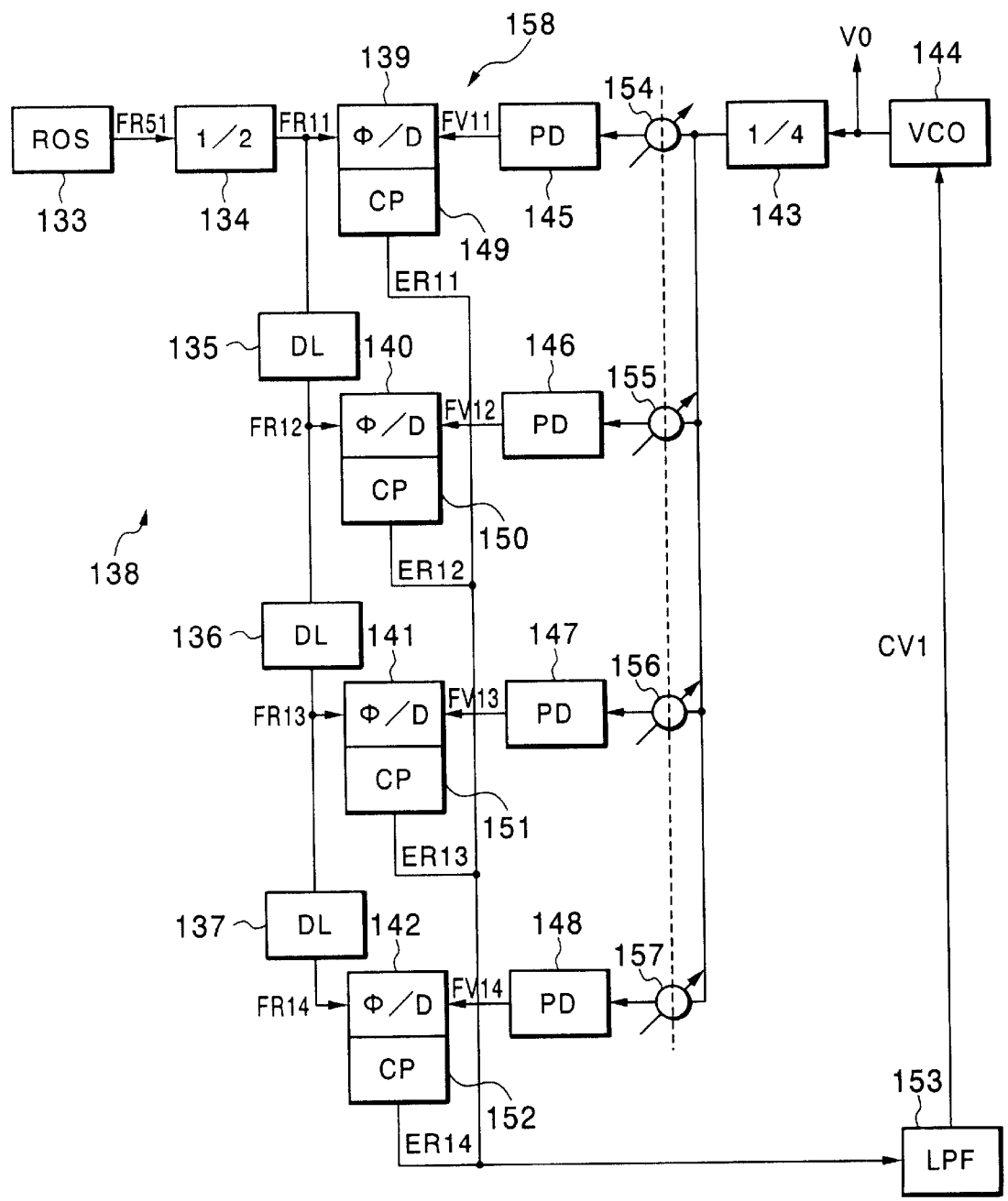
FIG. 4 is a block diagram of a PLL device according to a second embodiment of the invention.

Next, a PLL device according to a second embodiment of the invention will be described with reference to the block diagram in FIG. 4. The reference oscillator (ROS) 133 in FIG. 4 outputs a reference signal FR51 with a frequency of 9 kHz, for example, to a second fixed divider 134. The second fixed divider 134 has a frequency-division ratio of two, for example, and outputs a reference signal FR11 with a frequency of 4.5 kHz.

Delay circuits (DL) 135, 136, 137 generate a plurality of reference signals FR12, FR13, FR14 corresponding to reference signal FR11, but with mutually differing phases. The reference oscillator 133, the second fixed divider 134, and the delay circuits 135, 136, 137 constitute a reference signal generating means 138. This reference signal generating means 138 generates reference signals FR11, FR12, FR13, FR14 with different phases.

Reference signal FR11 is input to a phase detector (φ/D) 139. Delay circuit 135 delays reference signal FR11 by ½ period of reference signal FR11 and outputs it to a phase detector 140 as reference signal FR12. Delay circuit 136 outputs a signal delayed by ⅔ period of reference signal FR11 to a phase detector 141 as reference signal FR13. Delay circuit 137 outputs a signal delayed by ¾ period of reference signal FR11 to a phase detector 142 as reference signal FR14.

The input terminals of programmable dividers (PD) 145, 146, 147, 148 are all coupled to the output terminal of a first fixed divider 143 (with a frequency-division ratio of four, for example); they receive the output signal FO1 of a voltage-controlled oscillator (VCO) 144 through the first fixed divider 143, divide its frequency, and generate feedback signals. Each of the programmable dividers 145, 146, 147, 148 divides the ¼-prescaled frequency of the output signal by a ratio of the form A+B/C (where A, B, and C are integers and B<C), and outputs the divided signal. In the description below, B=1 and C=2.

Phase detector 139 compares the phase and frequency of the output (feedback signal FV11) of programmable divider 145 with the phase and frequency of reference signal FR11. As a result of this comparison, phase detector 139 outputs a pump-up signal and a pump-down signal at its two output terminals. A detector (not visible, but similar to detector 118 in FIG. 1), comprising an AND gate or the like, takes the logical AND of the pump-up signal and pump-down signal, and outputs a signal to a control unit 117 (similar to the control unit 117 in FIG. 1). The locked state is detected by this detector. The pump-up signal and pump-down signal are input to a charge pump (CP) 149, which outputs an error signal ER11.

Similarly, phase detector 140 compares the phase and frequency of the feedback signal FV12 of programmable divider 146 with the phase and frequency of reference signal FR12. As a result of this comparison, phase detector 140 outputs a pump-up signal and a pump-down signal to a detector (not visible, but similar to detector 120 in FIG. 1), which takes the logical AND of these two signals, and outputs it to the control unit 117. Both of the two signals are input to a charge pump 150, which outputs an error signal ER12.

Phase detector 141 compares the phase and frequency of the feedback signal FV13 of programmable divider 147 with the phase and frequency of reference signal FR13. As a result of this comparison, phase detector 141 outputs a pump-up signal and a pump-down signal to a detector (not visible, but similar to detector 122 in FIG. 1), which takes the logical AND of the two signals, and outputs it to the control unit 117. Both of the two signals are input to a charge pump 151, which outputs an error signal ER13.

Phase detector 142 compares the phase and frequency of the feedback signal FV14 of programmable divider 148 with the phase and frequency of reference signal FR14. As a result of this comparison, phase detector 142 outputs a pump-up signal and a pump-down signal to a detector (not visible, but similar to detector 124 in FIG. 1), which takes the logical AND of the two signals, and outputs it to the control unit 117. Both of the two signals are input to a charge pump 152, which outputs an error signal ER14.

In response to the error signals ER11, ER12, ER13, ER14 from the charge pumps 149 to 152, a low-pass filter (LPF) 153 outputs a control voltage CV1 to the voltage-controlled oscillator 144. The voltage-controlled oscillator 144 generates the output signal FO1 in response to the control voltage CV1.

The control unit 117 controls the delay circuits 135 to 137 and gate circuits 154 to 157 according to the reference signal FR11. The gate circuits 154 to 157 synchronize the start of frequency division by the programmable dividers 145 to 148 with respective delay circuits 135 to 137.

As a specific example of the way in which the gate circuits 154 are opened when the frequency of the output of the voltage-controlled oscillator 144 is divided, first, gate circuit 154 is opened by the control of the control unit 117. Following this, gate circuit 155 opens, ½ period later than gate circuit 154. Gate circuit 156 opens ½ period later than gate circuit 155. Similarly, gate circuit 157 opens ½ period later than gate circuit 156. Thus are formed a maximum of four loops that compare phases with respective ½-period delays.

Let P be the frequency-division ratio of the first fixed divider 143, P/2 be the frequency-division ratio of the second fixed divider 134, and N be the total number of phase detectors 139 to 142 and the total number of programmable dividers 145 to 148; P and N are made equal. The above constituent elements form a PLL device 158.

Figure 5:
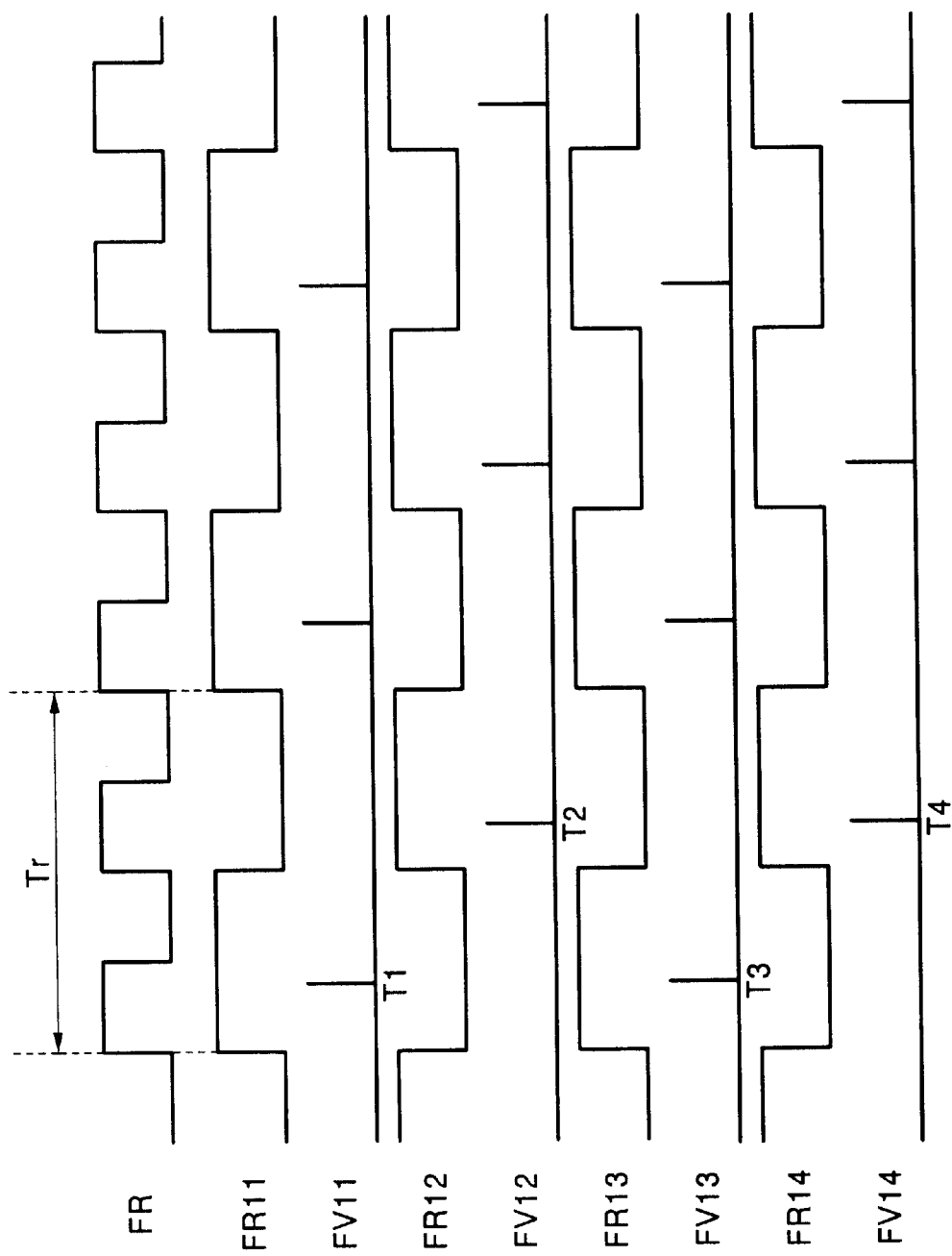
FIG. 5 is a timing diagram showing the operation of the PLL device in FIG. 4.

Next, the operation of this PLL device 158 will be described with reference to FIG. 4 and FIG. 5 (a timing diagram). The reference oscillator 133 outputs a reference signal FR51 with a frequency of, for example, 9 kHz. Reference signal FR41 is converted by the second fixed divider 134 to a 4.5-kHz reference signal FR11, which is supplied to phase detector 139.

Reference signal FR11 is delayed by ½ period by delay circuit 135, and furnished to phase detector 140 as reference signal FR12. Reference signal FR13, which is reference signal FR11 delayed by ²⁄₂ period, is furnished from delay circuit 136 to phase detector 141. Reference signal FR14, which is reference signal FR11 delayed by ³⁄₂ period, is furnished from delay circuit 137 to phase detector 142.

Meanwhile, the frequency of the output signal FO1 from the voltage-controlled oscillator 144 is divided by the first fixed divider 143 and programmable divider 145, and it is furnished as feedback signal FV11 to phase detector 139. Feedback signals FV12 to FV14 are similarly furnished to phase detectors 140 to 142.

The phase and frequency of feedback signal FV11 are compared with the phase and frequency of reference signal FR11 by phase detector 139, with the result that error signal ER11 is furnished to the low-pass filter 153. Error signals ER12, ER13, ER14 are similarly furnished to the low-pass filter 153. Overall, accordingly, the phase detectors 139 to 142 perform four phase comparisons during one period (Tr) of reference signal FR11, at timings T1 to T4.

The error signals ER11, ER12, ER13, ER14 are converted to a control voltage CV1 in the low-pass filter 153, and the voltage-controlled oscillator 144 generates an output signal FO1 having a frequency proportional to the control voltage CV1.

Phase detector 139 thus compares the phase and frequency of reference signal FR11 and feedback signal FV11, with timing T1 as a reference point. Phase detector 140 compares the phase and frequency of reference signal FR12 and feedback signal FV12, with timing T2 as a reference point. Phase detectors 141 and 142 perform similar operations. The output signal FO1 is thus synchronized in phase (locked up) with reference-signal FR11.

In this PLL device 158, the lock-up time is shortened because reference signals FR12, FR13, FR14 are offset in steps of 2π/2 with respect to reference signal FR11, and two phase comparisons are performed during one period (Tr) of reference signal FR11. As explained above, however, the frequency of reference signal FR11 in this embodiment is one-half the conventional frequency, because of the second fixed divider 134 (which divides the frequency by two). Accordingly, the lock-up time in this embodiment is about the same as before.

The overall power consumption in this circuit configuration can be reduced, however, because the first fixed divider 143 and second fixed divider 134 are low-power fixed dividers, and the programmable dividers 145 to 148, which use power comparatively inefficiently, can be operated at a lower frequency.

The features of the operation of the above PLL device 158 can be summarized as follows. The frequency-division ratios of the programmable dividers 145 to 148 used in the PLL device 158 are of the form A+B/C. If B=1 and C=2, for example, the programmable dividers 145 to 148 divide frequency by ratios of the form A+½, dividing the input frequency by half (D/2) the conventional frequency-division ratio D.

As a result, the separation between the pulses (FV11 to FV14) output by the programmable dividers 145 to 148 is one-half the conventional separation, so the number of phase comparisons performed in one period of the reference signals RF11 etc. is twice the conventional number. Therefore, even though the frequency of the reference signals RF11 etc. is one-half the conventional frequency, because a second fixed divider 134 (with a frequency division ratio of two, for example) is provided as a prescaler, the lock-up time can be kept at approximately the conventional value.

Figure 6:
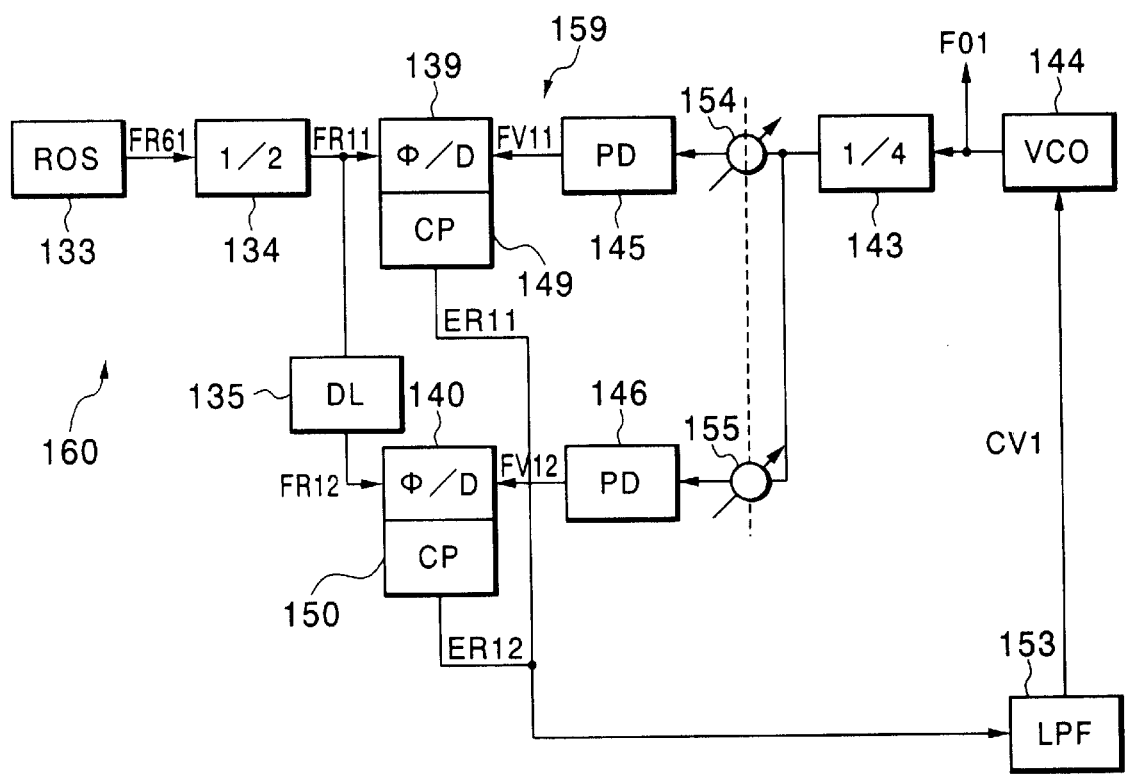
FIG. 6 is a block diagram of a PLL device according to a third embodiment of the invention.

Next, a PLL device according to a third embodiment of the invention will be described with reference to the block diagram in FIG. 6. The PLL device 159 in FIG. 6 removes delay circuits 136, 137, phase detectors 141, 142, programmable dividers 147, 148, and gate circuits 156, 157 from the PLL device 158 in FIG. 4.

The reference signal generating means 160, which comprises the reference oscillator 133, divider 134, and delay circuit 135, generates reference signals FR11, FR12 with different phases.

Programmable dividers 145, 146 divide the frequency of the output FO1 of the voltage-controlled oscillator 144, which is supplied through the first fixed divider 143. Phase detectors 139, 140 compare the phases of the outputs FV11, FV12 of programmable dividers 145, 146 with reference signals FR11, FR12, respectively.

Programmable dividers 145, 146 perform frequency division with ratios of the form A+B/C (where A, B, and C are integers and B<C).

In the illustrated example, B is one and C is two. Programmable dividers 145, 146 accordingly perform frequency division with ratios of the form A+½.

The second fixed divider 134 divides reference frequency FR61 with a frequency-division ratio of $2^{n-1}$ (where n is an integer equal to or greater than two). The frequency-division ratio of the first fixed divider 143 is set at $2^n$, and $2^{n-1}$ programmable dividers are provided (in the PLL device 159 shown in FIG. 6, n=2).

Next, the operation of this PLL device 159 will be explained with reference to FIGS. 5 and 6. In FIG. 5, the waveform of FR11 and the waveform of FR13 are identical, the waveform of FV11 and the waveform of FV13 are identical, the waveform of FR12 and the waveform of FR14 are identical, and the waveform of FV12 and the waveform of FV14 are identical. Since the first and third stages have the same waveforms, and the second and fourth stages have the same waveforms, the third and fourth stages are unnecessary. This is realized in the configuration of the above PLL device 159.

Thus the phase and frequency of feedback signal FV11 are compared with the phase and frequency of reference signal FR11 by phase detector 139, and the resulting error signal ER11 is furnished to the low-pass filter 153. Similarly, the phases of feedback signal FV12 and reference signal FR12 are compared, and the resulting error signal ER2 is furnished to the low-pass filter 153.

The error signals ER11, ER12, ER13, ER14 are converted to a control voltage CV1 in the low-pass filter 153, and the voltage-controlled oscillator 144 generates an output signal FO1 having a frequency proportional to the control voltage CV1.

The programmable dividers 145, 146 divide the input frequency by A+½, that is, by frequency-division ratios equal to one-half (D/2) of the conventional frequency-division ratio D. As a result, the separation between the pulses (FV11, FV12) output by the programmable dividers 145, 146 is one-half the conventional separation, so the number of phase comparisons performed in one period of the reference signals RF11 etc. is twice the conventional number. Therefore, even though the frequency of the reference signals RF11 etc. is one-half the conventional frequency, because a second fixed divider 134 (with a frequency division ratio of two) is provided, the lock-up time can be kept at approximately the conventional value.

In addition, as explained above, there are only half as many stages as in PLL device 158, because the third- and fourth-stage programmable dividers 147, 148 and third- and fourth-stage phase detectors 141, 142 are omitted. As a result, the PLL device 159 is a smaller circuit, which can more easily be implemented in an LSI, and its power consumption is also reduced.

Figure 7:
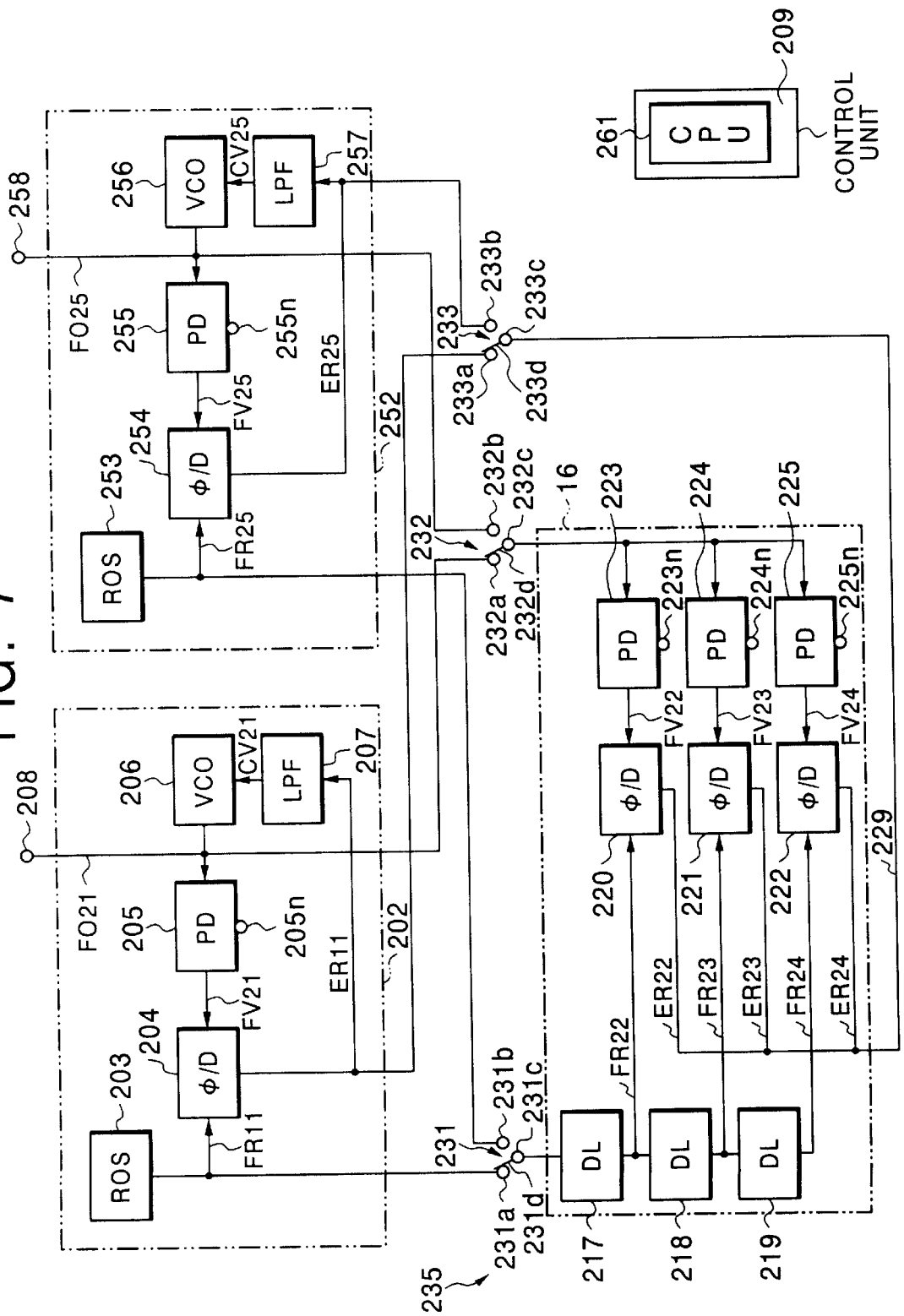
FIG. 7 is a block diagram of a PLL device according to a fourth embodiment of the invention.

FIG. 7 shows a PLL device 201 according to a fourth embodiment of the invention. The first PLL circuit 202 in FIG. 7 has, for example, a reference oscillator 203, a first phase detector 204, a first programmable divider 205, a voltage-controlled oscillator 206, and a low-pass filter 207.

The voltage-controlled oscillator 206 outputs an output signal FO21. A control unit 209 having a CPU 261 outputs a frequency-division ratio N1 to a terminal 205n of the first programmable divider 205.

The first programmable divider 205 receives the output signal FO21 of the voltage-controlled oscillator 206, divides its frequency by N1, and outputs the divided signal as a feedback signal FV21. The reference oscillator 203 outputs a first reference signal FR21 to the first phase detector 204.

The first phase detector 204 compares the phase and frequency of the output (feedback signal FV21) of the first programmable divider 205 with the phase and frequency of the first reference signal FR21. The first phase detector 204 outputs an error signal ER21.

The low-pass filter 207 outputs a control voltage CV21 corresponding to error signal ER21 from the first phase detector 204. The voltage-controlled oscillator 206 outputs the output signal FO21 in response to the control voltage CV21. A loop is thereby formed, and the frequency of the output signal FO21 is N1 times that of reference signal FR11 (satisfying FO21=N1×FR21). As a result, at output terminal 208, the first PLL circuit 202 outputs an output signal FO21 responsive to the set frequency-division ratio N1.

Similarly, the second PLL circuit 252 has, for example, a reference oscillator 253, a first phase detector 254, a first programmable divider 255, a voltage-controlled oscillator 256, and a low-pass filter 257.

The voltage-controlled oscillator 256 outputs an output signal FO25. The control unit 209 outputs a frequency-division ratio N2 to a terminal 255n of the first programmable divider 255.

The first programmable divider 255 receives the output signal FO25 of the voltage-controlled oscillator 256, divides its frequency by N2, and outputs the divided signal as a feedback signal FV25. The reference oscillator 253 outputs a first reference signal FR25 to the first phase detector 254.

The first phase detector 254 compares the phase and frequency of the output (feedback signal FV25) of the first programmable divider 255 with the phase and frequency of the first reference signal FR25, and outputs an error signal ER25.

The low-pass filter 257 outputs a control voltage CV25 corresponding to the error signal ER25 from the first phase detector 254. The voltage-controlled oscillator 256 outputs the output signal FO25 in response to the control voltage CV25. As a result, at output terminal 258, the second PLL circuit 252 outputs an output signal FO25 responsive to the set frequency-division ratio N2.

The PLL device 201 thus comprises a plurality of PLL circuits 202, 252 having respective first phase detectors 204, 254 and first programmable dividers 205, 255.

The first reference signal FR21 of the first PLL circuit 202 is applied to one input terminal 231a of a first selection switch 231, and the first reference signal FR25 of the second PLL circuit 252 is applied to the other input terminal 231b.

The input of the first programmable divider 205 in the first PLL circuit 202 is applied to one input terminal 232a of a second selection switch 232, and the input of the first programmable divider 255 in the second PLL circuit 252 is applied to the other input terminal 232b.

The output (ER21) of the first phase detector 204 in the first PLL circuit 202 is applied to one input terminal 233a of a third selection switch 233, and the output (ER25) of the first phase detector 254 in the second PLL circuit 252 is applied to the other input terminal 233b.

The driving unit 216 has series-coupled delay circuits 217, 218, 219, second phase detectors 220, 221, 222, and second programmable dividers 223, 224, 225.

The common terminal (output terminal) 231c of the first selection switch 231 is coupled to the input terminal of delay circuit 217, the output terminal of delay circuit 217 is coupled to the input terminal of delay circuit 218, and the output terminal of delay circuit 218 is coupled to the input terminal of delay circuit 219.

One input terminal of phase detector 220 is coupled to the output terminal of delay circuit 217, one input terminal of phase detector 221 is coupled to the output terminal of delay circuit 218, and one input terminal of phase detector 222 is coupled to the output terminal of delay circuit 219.

The input terminals of programmable dividers 223, 224, 225 are coupled to the common terminal (output terminal) 232c of the second selection switch 232, and the output terminals of programmable dividers 223, 224, 225 are coupled to the other input terminals of phase detectors 220, 221, 222.

The output terminals of the second phase detectors 220, 221, 222 are coupled through a lead wire 229 to the common terminal 233c of the third selection switch 233.

In addition to terminals 231a, 231b, 231c, the first selection switch 231 has a movable arm 231d. When the movable arm 231d is set toward terminal 231a (as in FIG. 7), the first reference signal FR21 of the first PLL circuit 202 is supplied to the driving unit 216. When the movable arm 231d is set toward terminal 231b, the first reference signal FR25 of the second PLL circuit 252 is supplied to the driving unit 216.

In addition to terminals 232a, 232b, 232c, the second selection switch 232 has a movable arm 232d. When the movable arm 232dc is set toward terminal 232a (as in FIG. 7), the output FO21 of the voltage-controlled oscillator 206 in the first PLL circuit 202 is supplied to the second programmable dividers 223, 224, 225 in the driving unit 216. When the movable arm 232*d* is set toward terminal 232*b*, the output FO25 of the voltage-controlled oscillator 256 in the second PLL circuit 252 is supplied to the second programmable dividers 223, 224, 225.

In addition to terminals 233*a*, 233*b*, 233*c*, the third selection switch 233 has a movable arm 233*d*. When the movable arm 233*d* is set toward terminal 233*a* (as in FIG. 7), the outputs ER22, ER23, ER24 of the phase detectors 220, 221, 222 in the driving unit 216 are supplied to the low-pass filter 207 in the first PLL circuit 202. When the movable arm 233*d* is set toward terminal 233*b*, the outputs ER22, ER23, ER24 of the phase detectors 220, 221, 222 in the driving unit 216 are supplied to the low-pass filter 257 in the second PLL circuit 252.

The first selection switch 231, second selection switch 232, and third selection switch 233 constitute a switching unit 235.

The driving unit 216 thus forms a single unit having at least one pair of second phase detectors 220, 221, 222 and second programmable dividers 223, 224, 225. The switching unit 235 can switch selectively between, and connect the driving unit 216 to, one of the two PLL circuits 202, 252 (the first PLL circuit 202 or the second PLL circuit 252). The above constituent elements form the PLL device 201.

Next, the operation of this PLL device 201 will be described. First, the control unit 209 selects, for example, the first PLL circuit 202. The control unit 209 supplies a signal designating a frequency-division ratio N1 to terminal 205*n* of the first programmable divider 205 provided in the first PLL circuit 202. The control unit 209 also supplies signals designating frequency-division ratio N1 to terminals 223*n*, 224*n*, 225*n* of the second programmable dividers 223, 224, 225 provided in the driving unit 216.

At the same time, the control unit 209 sets the first selection switch 231 to terminal 231*a*, the second selection switch 232 to terminal 232*a*, and the third selection switch 233 to the third terminal 233*a* (as in FIG. 7).

As a result, the first reference signal FR21 supplied to the first phase detector 204 is supplied to the driving unit 216. The first reference signal FR21 is delayed by ¼ period in delay circuit 217, and furnished to second phase detector 220 as a second reference signal FR22. The first reference signal FR21 is also delayed by ½ period by delay circuits 217, 218 and furnished to second phase detector 221 as a second reference signal FR23. The first reference signal FR21 is furthermore delayed by ¾ period by delay circuits 217, 218, 219 and furnished to second phase detector 222 as a second reference signal FR24.

The frequency of the output signal FO21 from voltage-controlled oscillator 206 is divided by the first programmable divider 205, and it is furnished to the first phase detector 205 as a feedback signal FV21. The frequency of the above output signal FO21 is also divided by the second programmable dividers 223, 224, 225, through the second selection switch 232, and it is furnished to the second phase detectors 220, 221, 222 as feedback signals FV22, FV23, FV24.

The four enable signal output terminals of the control unit 209 are coupled to terminals of the first programmable divider 205 and second programmable dividers 223, 224, 225 (these terminals are not visible), and enable signals are output to these terminals of the first programmable divider 205 and second programmable dividers 223, 224, 225 to synchronize them with the output timing of the delay circuits 217, 218, 219.

Thus, the phase and frequency of feedback signal FV21 are compared with the phase and frequency of the first reference signal FR21 by the first phase detector 204, and the resulting error signal ER21 is furnished to low-pass filter 207. Error signals ER22, ER23, ER24 are similarly furnished to low-pass filter 207 through the third selection switch 233. Accordingly, the phase detectors 204, 220, 221, 222 perform four phase comparisons in all during one period of the first reference signal FR21. The lock-up time is accordingly approximately one-fourth that of a conventional PLL device (with one stage).

The error signals ER21, ER22, ER23, ER24 are converted to control voltage CV21 by low-pass filter 207, and the voltage-controlled oscillator 206 outputs an output signal FO21 having a frequency proportional to the control voltage CV21.

To summarize the above operation, the switching unit 235 is set, and the first reference signal FR21 input to the first phase detector 204 in the PLL circuit coupled to the driving unit 216 (the first PLL circuit 202) differs in phase from the reference signals FR2, FR3, FR4 input to the second phase detectors 220, 221, 222 in the driving unit 216.

Next, the control unit 209 selects the second PLL circuit 252. The control unit 209 supplies a signal designating frequency-division ratio N2 to terminal 255*n* of the first programmable divider 255 provided in the second PLL circuit 252. The control unit 209 supplies signals designating frequency-division ratio N2 to terminals 223*n*, 224*n*, 225*n* of the second programmable dividers 223, 224, 225 provided in the driving unit 216. At the same time, the control unit 209 sets the first selection switch 231 to terminal 231*b*, sets the second selection switch to terminal 232*b*, and sets the third selection switch to terminal 233*b*.

As a result, the first reference signal FR25 supplied to the first phase detector 254 is supplied through the first selection switch 231 to the driving unit 216, and signals delayed by ¼, ½, and ¾ period from the first reference signal FR25, these signals being the second reference signals FR22, FR23, FR24, are furnished to the second phase detectors 220, 221, 222.

The frequency of the output signal FO25 from voltage-controlled oscillator 256 is divided by the first programmable divider 255, and it is furnished to the first phase detector 255 as a feedback signal FV25. The frequency of the above output signal FO25 is also divided by the second programmable dividers 223, 224, 225, through the second selection switch 232, and it is furnished to the second phase detectors 220, 221, 222 as feedback signals FV22, FV23, FV24.

Feedback signal FV25 is compared with the first reference signal FR25 by the first phase detector 254, and the resulting error signal ER25 is furnished to low-pass filter 257. Error signals ER22, ER23, ER24 are also furnished to low-pass filter 257, through the third selection switch 233. Accordingly, the phase detectors 254, 220, 221, 222 perform four phase comparisons in all during one period of the first reference signal FR25, and the lock-up time is shortened to approximately one-fourth that of a conventional PLL device.

Error signals ER25, ER22, ER23, ER24 are converted to control voltage CV25 by low-pass filter 257, and voltage-controlled oscillator 256 outputs an output signal FO25 having a frequency proportional to the control voltage CV25.

Thus a first selection switch 231 is provided to switch between the first reference signal FR21 used in the first PLL circuit 202 and the first reference signal FR25 used in the second PLL circuit 252 for input to delay circuit 217. In addition, a second selection switch 232 is provided to switch between the output of the voltage-controlled oscillator 206 in the first PLL circuit 202 and the output of the voltage-controlled oscillator 256 in the second PLL circuit 252 for input to the second phase detectors 223, 224, 225 in the driving unit 216. Moreover, a third selection switch 233 is provided to switch between supply of the outputs (error signals ER22, ER23, ER24) of the driving unit 216 to the LPF 207 in the first PLL circuit 202 and the LPF 257 in the second PLL circuit 252.

Figure 8:
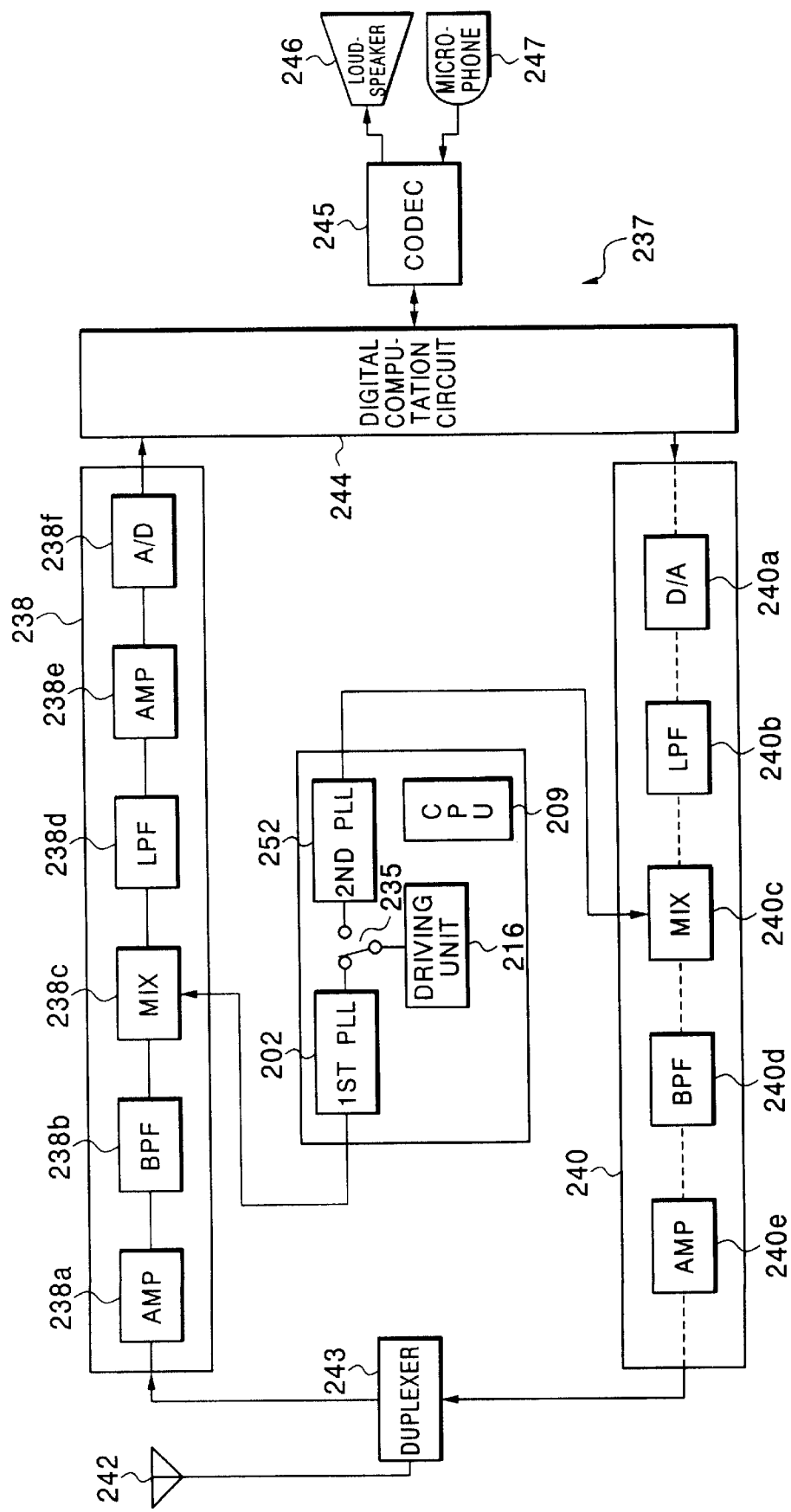
FIG. 8 is a block diagram of a mobile phone using the PLL device in FIG. 7.

Next a mobile phone 237 using this PLL device 201 will be described with reference to the block diagram in FIG. 8. The receiving section 238 in FIG. 8 has, for example, in order from the input end, a low-noise amplifier 238a, a bandpass filter 238b, a receive mixer 238c, a low-pass filter 238d, an amplifier 238e, and an A/D converter 238f. The transmitting section 240 has, for example, in order from the input end, a D/A converter 240a, a low-pass filter 240b, a transmit mixer 240c, a bandpass filter 240d, and a high-output amplifier 240e.

The antenna 242 is coupled through a duplexer 243 to the receiving section 238 and transmitting section 240. The receiving section 238 and transmitting section 240 are coupled through a digital computation circuit 244 and codec 245 to a loudspeaker 246 and microphone 247. These constituent elements form a mobile phone 237.

In receiving, the receive signal received by the antenna 242 is amplified by the low-noise amplifier 238a in the receiving section 238, and input through the bandpass filter 238b to the receive mixer 238c.

The control unit 209 in the PLL device 201 sets the switching unit 235 to select the first PLL circuit 202, coupling the first PLL circuit 202 to the driving unit 216, and output signal FO21 is output to the receive mixer 238c. The receive mixer 238c mixes the input signal mentioned earlier with the PLL output signal FO21, converting the former to an intermediate-frequency signal.

The intermediate-frequency signal passes through the low-pass filter 238d, is amplified by the amplifier 238e, and is converted to a digital signal by the A/D converter 238f. This digital signal is demodulated by the digital computation circuit 244, and output through the codec 245 to the loudspeaker 246.

Thus during receiving, the first PLL circuit 202 is coupled to the driving unit 216, shortening the lock-up time, and its output signal FO21 is output to the receive mixer 238c.

In transmitting, the speech spoken into the microphone 247 is converted to an electrical signal, and the electrical signal is supplied through the codec 245 to the digital computation circuit 244.

The digital computation circuit 244 converts the electrical signal to a baseband signal, and outputs it to the transmitting section 240. The D/A converter 240a in the transmitting section 240 converts this signal to an analog signal, and the analog signal is input through the low-pass filter 240b to the transmit mixer 240c.

The control unit 209 in the PLL device 201 sets the switching unit 235 to select the second PLL circuit 252, coupling the second PLL circuit 252 to the driving unit 216, and output signal FO25 is output to the transmit mixer 240c. The transmit mixer 240c mixes the input analog signal mentioned earlier with output signal FO25, converting the former to a radio-frequency signal.

The radio-frequency signal passes through the transmitting section 240d, is amplified by the transmitting section 240e, passes through the duplexer 243, and is radiated from the antenna 242. Thus during transmission, the second PLL circuit 252 is coupled to the driving unit 216, and its output signal FO25 is output to the transmit mixer 240c, shortening the lock-up time.

There are also applications that use the outputs of the first PLL circuit 202 and second PLL circuit 252 simultaneously, instead of using the first PLL circuit 202 and the second PLL circuit 252 at separate timings as in the above mobile phone. In that case, the control unit 209 causes the switching unit 235 to select the higher of the frequencies (frequency-division ratios) set in the PLL circuits 202, 252. That is, it couples the driving unit 216 to either the first PLL circuit 202 or the second PLL circuit 252, whichever has the higher frequency-division ratio and therefore has the higher-frequency output (FO21, FO25).

The PLL circuit with the lower frequency setting operates without being coupled to the driving unit 216. The driving unit remains coupled to the PLL circuit with the higher frequency setting until locked; after lock is achieved, power consumption can be reduced by disconnecting it from the driving unit.

Figure 9:
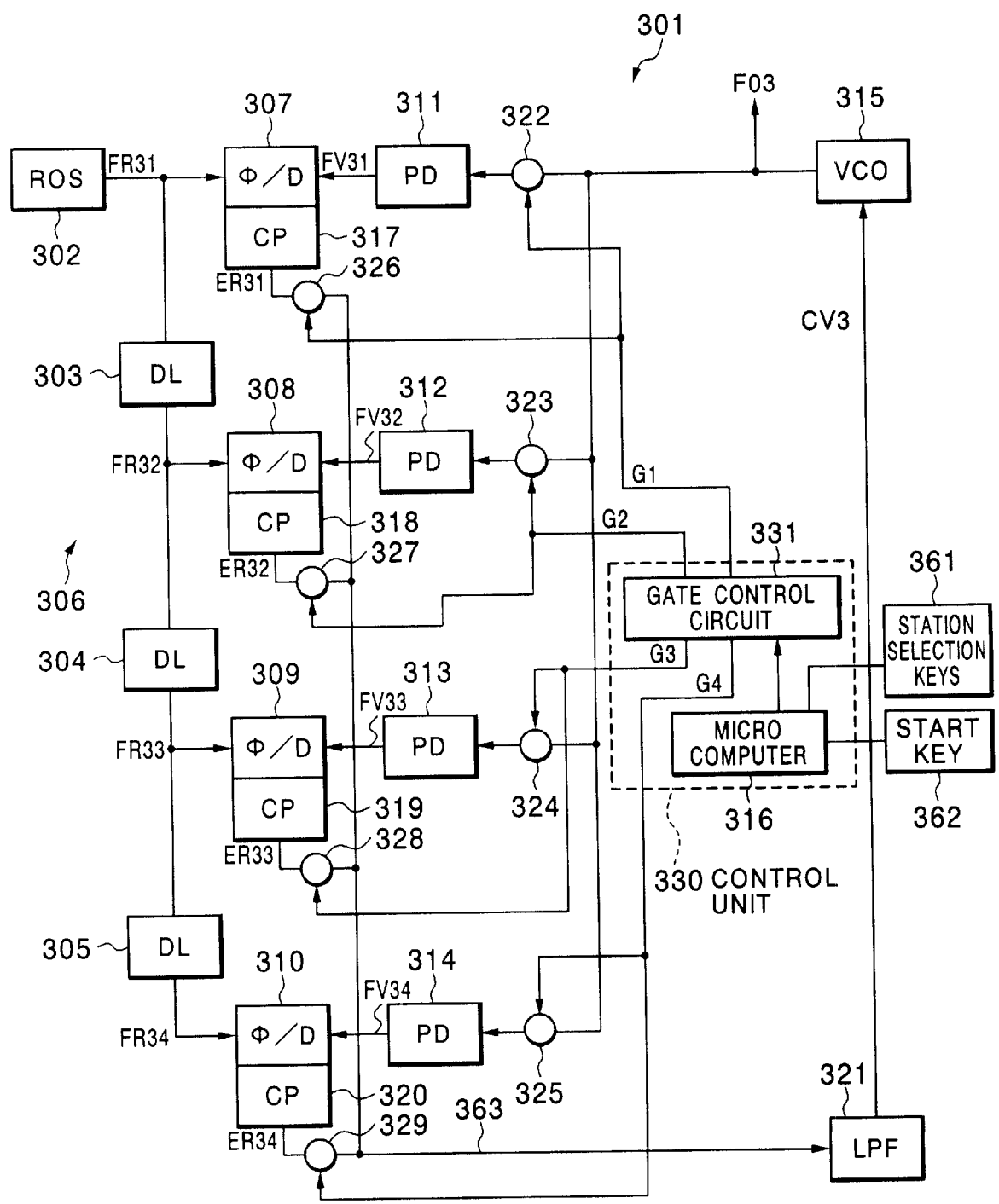
FIG. 9 is a block diagram of a PLL device according to a fifth embodiment of the invention.

FIG. 9 shows a PLL device according to a fifth embodiment of the invention. As shown in FIG. 9, the PLL device 301 of the fifth embodiment has a reference oscillator 302 that outputs a reference signal FR31. Delay circuits 303, 304, 305 generate a plurality of reference signals FR32, FR33, FR34 corresponding to reference signal FR31, but with mutually differing phases. The reference oscillator 302 and delay circuits 303, 304, 305 constitute a reference signal generating means 306.

Reference signal FR31 is input to a phase detector 307. Delay circuit 303 delays reference signal FR31 by ¼ period, and outputs it to a phase detector 308 as a reference signal FR32. Delay circuit 304 receives the output of delay circuit 303 and outputs a signal delayed by ½ period from reference signal FR31 to a phase detector 309 as a reference signal FR33. Delay circuit 305 receives the output of delay circuit 304 and outputs a signal delayed by ¾ period from reference signal FR31 to a phase detector 310 as a reference signal FR34.

The input terminals of programmable dividers 311, 312, 313, 314 are coupled in common to the output terminal of a voltage-controlled oscillator 15, and perform frequency division by integer ratios.

Phase detector 307 compares the phase and frequency of a feedback signal FV31 output from programmable divider 311 with the phase and frequency of reference signal FR31. As a result of this comparison, phase detector 307 outputs a pump-up signal and a pump-down signal at its two output terminals (not visible). A detector (not visible, but similar to detector 118 in FIG. 1), comprising an AND gate or the like, takes the logical AND of the pump-up signal and pump-down signal, and outputs a signal (a lock detection signal) to a control unit 330 including a microcomputer 316. The locked state is detected by this detector. The pump-up signal and pump-down signal are input to a charge pump 317, which outputs an error signal ER31.

Similarly, phase detector 308 compares the phase and frequency of feedback signal FV32 of programmable divider 312 with the phase and frequency of reference signal FR32. As a result of this comparison, phase detector 309 outputs a pump-up signal and a pump-down signal to a detector (not visible, but similar to detector 120 in FIG. 1), which takes the logical AND of these two signals, and outputs it to the control unit 330. Both of the two signals are input to a charge pump 318, which outputs an error signal ER32.

Phase detector 309 compares the phase and frequency of feedback signal FV33 of programmable divider 313 with the phase and frequency of reference signal FR33. As a result of this comparison, phase detector 309 outputs a pump-up signal and a pump-down signal to a detector (not visible, but similar to detector 122 in FIG. 1), which takes the logical AND of the two signals, and outputs it to the control unit 330. Both of the two signals are input to a charge pump 319, which outputs an error signal ER33.

Phase detector 310 compares the phase and frequency of feedback signal FV34 of programmable divider 314 with the phase and frequency of reference signal FR34. As a result of this comparison, phase detector 310 outputs a pump-up signal and a pump-down signal to a detector (not visible, but similar to the detector 124 in FIG. 1), which takes the logical AND of the two signals, and outputs it to the control unit 330. Both,of the two signals are input to a charge pump 320, which outputs an error signal ER34. The phase detectors 307 to 310 thus compare the phases of the reference signals FR31 to FR34 with the phases of the feedback signals FV31 to FV34, and output error signals ER31 to ER34 as results.

In response to the error signals ER31, ER32, ER33, ER34 from the phase detectors 307 to 310, a low-pass filter 321 outputs a control voltage CV3 to the voltage-controlled oscillator 315. The voltage-controlled oscillator 315 generates the output signal FO3 in response to the control voltage CV3.

Switching elements 322, 323, 324, 325 comprise gates, for example. Switching element 322 is disposed between the output terminal of the voltage-controlled oscillator 315 and the input terminal of programmable divider 311. Switching element 323 is disposed between the output terminal of the voltage-controlled oscillator 315 and the input terminal of programmable divider 312. Switching element 324 is disposed between the output terminal of the voltage-controlled oscillator 315 and the input terminal of programmable divider 313. Switching element 325 is disposed between the output terminal of the voltage-controlled oscillator 315 and the input terminal of programmable divider 314.

Similarly, a gate 326 is provided between the output terminal of charge pump 317 and the input terminal of the low-pass filter 321. A gate 327 is provided between the output terminal of charge pump 318 and the input terminal of the low-pass filter 321. A gate 328 is provided between the output terminal of charge pump 319 and the input terminal of the low-pass filter 321. A gate 329 is provided between the output terminal of charge pump 320 and the input terminal of the low-pass filter 321.

The control unit 330 comprises the microcomputer 316 and a gate control circuit 331. The gate control circuit 331 outputs control signals G1, G2, G3, G4 according to input of signals from the microcomputer 316 and the reference signals FR31 to FR34.

Control signal G1 is supplied to switching element 322 and gate 326, control signal G2 is supplied to switching element 323 and gate 327, control signal G3 is supplied to switching element 324 and gate 328, and control signal G4 is supplied to switching element 325 and gate 329.

Figure 10:
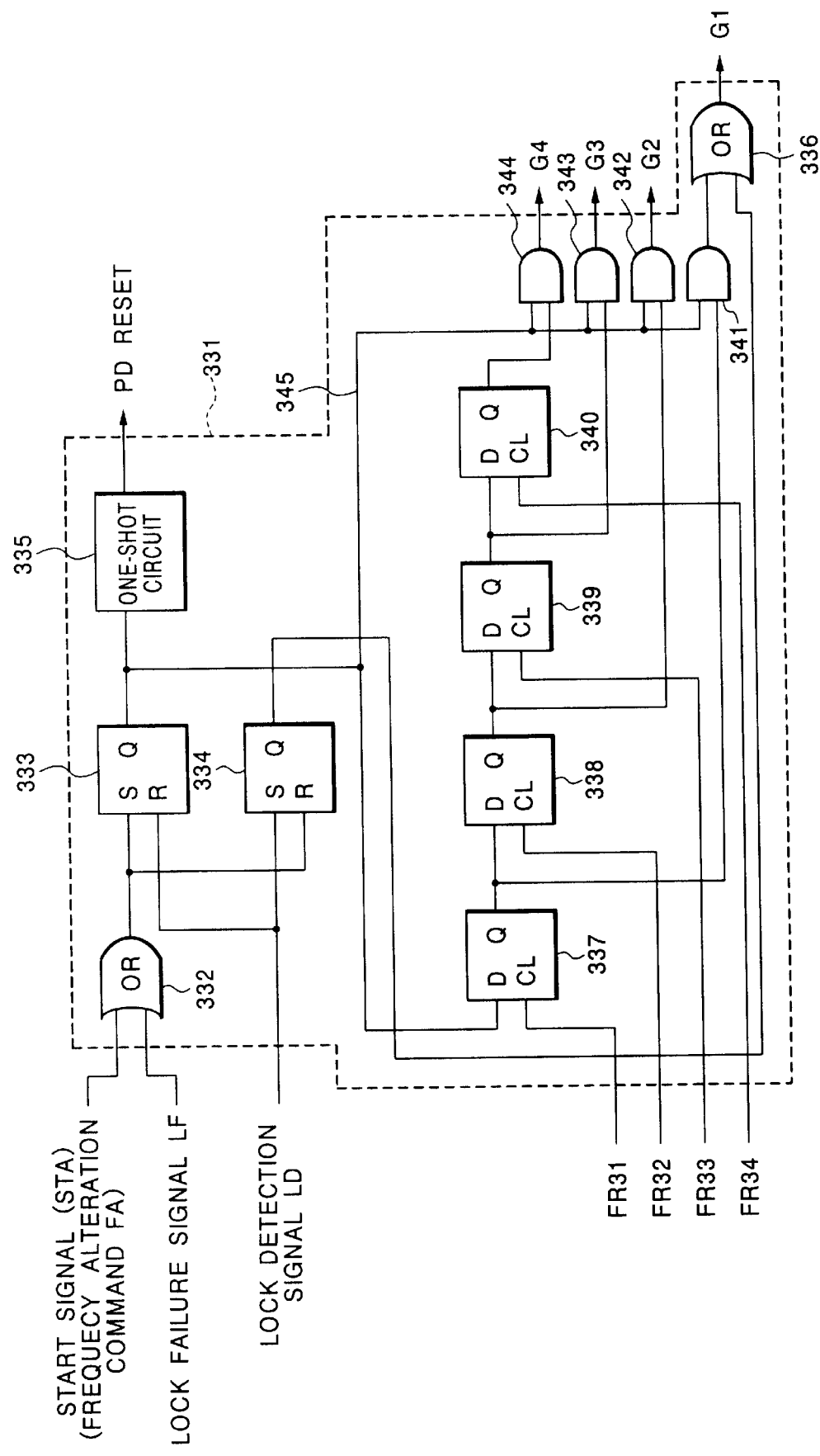
FIG. 10 is a block diagram of the gate control circuit used in the PLL device in FIG. 9.

Next, the gate control circuit 331 will be described with reference to the block diagram in FIG. 10. A start signal STA is input to one input terminal of an OR gate 332 in FIG. 10. Station selection keys 361 are coupled to the microcomputer 316 in the control unit 330; when the user selects, for example, 300 kHz with a station selection key 361 and presses the start key 362, the above start signal STA is input to the OR gate 332.

When a signal with a frequency of 300 kHz is being output, if the user uses a station selection key 361 to change the frequency to 500 kHz, for example, a frequency alteration command is input to the OR gate 332.

A lock failure signal LF is input to the other input terminal of the OR gate 332. The lock failure signal LF is a signal reporting that the output signal FO3 has slipped out of the locked state due to a cause (an external disturbance or the like, for example) other than the above input by the user.

The set input terminal S of an SR-type flip-flop 333 is coupled to the output terminal of the OR gate 332. The reset input terminal R of flip-flop 333 is coupled so as to receive a lock detection signal LD, and the output terminal Q of flip-flop 333 is coupled to a one-shot circuit 335.

The set input terminal S of a flip-flop 334 is also coupled so as to receive the lock detection signal LD. The lock detection signal LD is a signal that the detectors coupled to the phase detectors 307, 308, 309, 310 output through the microcomputer 316 as described above. The lock detection signal is thus a signal indicating that the output signal FO3 output by the voltage-controlled oscillator 315 has been detected as having reached the set frequency.

The reset input terminal R of flip-flop 334 is coupled so as to receive the output of OR gate 332. The output terminal Q of flip-flop 334 is coupled to one input terminal of an OR gate 336.

D-type flip-flop 337 has its input terminal D coupled to the output terminal Q of flip-flop 333; reference signal FR31 is input at its clock terminal CL; and its output terminal Q is coupled to one input terminal of an AND gate 341.

D-type flip-flop 338 has its input terminal D coupled to the output terminal Q of flip-flop 337; reference signal FR32 is input at its clock terminal CL; and its output terminal Q is coupled to one input terminal of an AND gate 342.

D-type flip-flop 339 has its input terminal D coupled to the output terminal Q of flip-flop 338; reference signal FR33 is input at its clock terminal CL; and its output terminal Q is coupled to one input terminal of an AND gate 343.

D-type flip-flop 340 has its input terminal D coupled to the output terminal Q of flip-flop 339; reference signal FR34 is input at its clock terminal CL; and its output terminal Q is coupled to one input terminal of an AND gate 344.

The other input terminals of AND gates 341 to 344 are coupled through a lead wire 345 to the output terminal Q of flip-flop 333.

The output terminal of AND gate 341 is coupled to the other input terminal of OR gate 336, and control signal G1 is output from the output terminal of OR gate 336. Control signals G2, G3, G4 are output from the output terminals of AND gates 342, 343, 344. The gate control circuit 331 comprises these constituent elements.

Figure 11:
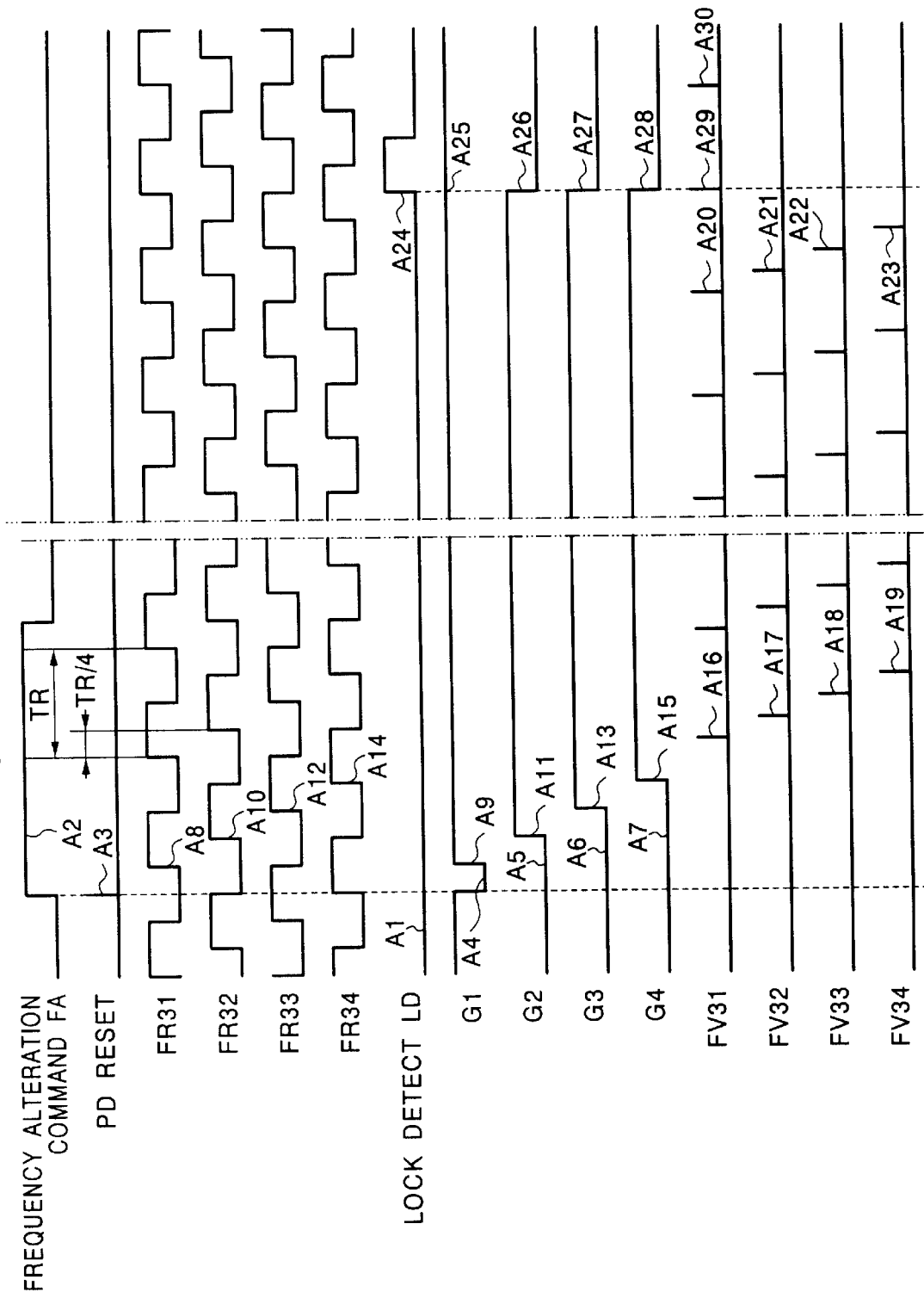
FIG. 11 is a timing diagram showing the operation of the PLL device in FIG. 9.

Next, the operation of this PLL device 301 will be described with reference to FIGS. 9 to 11. FIG. 11 is a timing diagram of the signals used in the PLL device 1. These drawings show an example in which the user selects a frequency of 300 kHz, for example, with the station selection keys 361 and presses the start key 362; a 300-kHz output signal FO3 is output; then the user changes to a frequency of 500 kHz, for example, with the station selection keys 361.

When the 300-kHz output signal FO3 is first being output (the output signal FO3 being locked at this time), the detectors output the lock signal LD, but the above signal is a one-shot signal (remaining at the high level only for a predetermined time after the transition from the non-locked state to the locked state), so at time A1 (FIG. 11), it is at the low level.

Next, suppose the user operates a station selection key 361 and changes from 300 kHz to 500 kHz. Accompanying this change, a frequency alteration command FA is input to the OR gate 332. The FA command is of the one-shot type, so it goes high for a short time, then goes low (see A2 in FIG. 11).

A high-level signal is input at this time to the S input terminal of flip-flop 333, and a low-level signal (the lock detection signal LD) is input to the R input terminal, so a high-level signal is output from the Q output terminal, and this signal is output through the one-shot circuit 335 as a reset signal (see A3 in FIG. 11). As for flip-flop 334, a low-level signal is input to its S terminal and a high-level signal is input to its R terminal, so its Q output terminal outputs a low-level signal.

The output at the Q output terminal of flip-flop 337 is at the low level, because the input (FR31) at its D input terminal was at the low level one clock cycle before; as a result, both inputs to OR gate 336 are at the low level until the next rising edge of FR31; control signal G1 switches from a high-level signal to a low-level signal and maintains the low-level state until a certain time has elapsed (until FR31 next rises). Similarly, control signals G2 to G4 maintain the low-level state for a certain time (during the intervals until FR32 to FR34, respectively, next rise) after the reset signal is output (A3 in FIG. 11). Switching elements 322 to 325 are in the off-state at this time, so the output signal FO3 is not supplied to the programmable dividers 311 to 314. Programmable dividers 311 to 314 stop counting, and set their count values to a predetermined value (for example, zero).

Gates 326 to 329 are also in the off-state, so error signals ER31 to ER34 are not input to the low-pass filter 321. In this way, the control unit 330 resets (initializes) the programmable dividers 311 to 314 before they begin frequency division operations.

Even after the elapse of the above certain time, flip-flop 333 continues to output a high-level signal, and a high-level signal continues to be input at the D input terminal of D-type flip-flop 337. At the rise of the reference signal FR31 input from the clock terminal CL of D-type flip-flop 337 (see A8 in FIG. 11), its output rises, becoming a high-level signal.

High-level signals are now supplied to both input terminals of AND gate 341, so it outputs a high-level signal; one input terminal of OR gate 336 is at the low level while the other is at the high level, so control signal G1 rises, becoming a high-level signal (see A9 in FIG. 11).

Similarly, a high-level signal is input to the D input terminal of D-type flip-flop 338, so in response to the rise of the reference signal FR32 input at its clock terminal CL (see A10 in FIG. 11), the output of D-type flip-flop 338 rises, becoming a high-level signal, which is input to one input terminal of AND gate 342. The other input terminal of AND gate 342 is also at the high level at this time, so control signal G2 rises, becoming a high-level signal (see A11 in FIG. 11).

A high-level signal is input to the D input terminal of D-type flip-flop 339, so in response to the rise of the reference signal FR33 input at its clock terminal CL (see A12 in FIG. 11), the output of D-type flip-flop 339 rises, becoming a high-level signal, which is input to one input terminal of AND gate 343. The other input terminal of AND gate 343 is also at the high level at this time, so control signal G3 rises, becoming a high-level signal (see A13 in FIG. 11).

A high-level signal is furthermore input to the D input terminal of D-type flip-flop 340, so in response to the rise of the reference signal FR34 input at its clock terminal CL (see A14 in FIG. 11), the output of D-type flip-flop 340 rises, becoming a high-level signal, which is input to one input terminal of AND gate 344. The other input terminal of AND gate 344 is also at the high level at this time, so control signal G4 rises, becoming a high-level signal (see A15 in FIG. 11).

Thus in response to the rise of reference signal FR31 (A8), control signal G1 rises (A9), switching element 322 turns on, output signal FO3 is supplied to programmable divider 311, and programmable divider 311 begins frequency division. In response to the rise of control signal G1 (A9), gate 326 also turns on, and an error signal ER31, generated as the result of a phase comparison in phase detector 307 between reference signal FR31 and the output signal FO3 as divided by programmable divider 311 to become feedback signal FV31, is supplied through node 363 to the LPF 321.

Similarly, in response to the rise of reference signal FR32 (A10), control signal G2 rises (A11), switching element 323 turns on, output signal FO3 is supplied to programmable divider 312, and programmable divider 312 begins frequency division. In response to the rise of control signal G2 (A11), gate 327 also turns on, and an error signal ER32, generated as the result of a phase comparison in phase detector 308 between reference signal FR32 and the output signal FO3 as divided by programmable divider 312 to become feedback signal FV32, is supplied through node 363 to the LPF 321.

In response to the rise of reference signal FR33 (A12), control signal G3 rises (A13), switching element 324 turns on, output signal FO3 is supplied to programmable divider 313, and programmable divider 313 begins frequency division. In response to the rise of control signal G3 (A13), gate 328 also turns on, and an error signal ER33, obtained as the result of a phase comparison in phase detector 309 between reference signal FR33 and feedback signal FV33, is supplied through node 363 to the LPF 321.

Moreover, in response to the rise of reference signal FR34 (A14), control signal G4 rises (A15), switching element 325 turns on, output signal FO3 is supplied to programmable divider 314, and programmable divider 314 begins frequency division. In response to the rise of control signal G4 (A15), gate 329 also turns on, and an error signal ER34, obtained as the result of a phase comparison in phase detector 310 between reference signal FR34 and feedback signal FV34, is supplied through node 363 to the LPF 321.

The control unit 330 thus starts the frequency division operations of programmable dividers 311 to 314 in synchronism with the phases of reference signals FR31 to FR34 (rising transitions A8, A10, A12, A14, for example). Specifically, the gate control circuit 331 in the control unit 330 turns on switching elements 322 to 25, by means of control signals G1 to G4, in synchronism with the phases of the reference signals FR31 to FR34.

As also described above, the reference oscillator 302 generates a reference signal FR31 having a reference frequency FR3 (period TR=1/FR3). Delay circuits 303, 304, 305 have delay times of ¼ period (TR/4) each, so the reference signals FR32, FR33, FR34 generated by delay circuits 303, 304, 305 are delayed by ¼ period, ½ period, and ¾ period, respectively, with respect to reference signal FR31.

The frequency division operations by programmable dividers 311 to 314 begin in synchronism with the phases of reference signals FR31 to FR34. The starting times of the frequency division operations are therefore sequentially delayed in steps of TR/4, and the phase comparison timings in the phase detectors 307 to 310 are likewise delayed in steps of TR/4.

Having the programmable dividers 311 to 314 start frequency division in synchronism with reference signals FR31 to FR34 thus substantially equalizes the intervals between the phase comparison timings of the phase detectors 307 to 310, enabling accurate phase comparison.

The reference signals FR31 to FR34 furthermore differ in phase (for example, in the description above their phases are mutually offset in steps of $\pi/2$), and phase comparisons are performed for each of the reference signals FR31 to FR34. As a result, phase comparisons are performed multiple times during one period (TR) of reference signal FR31 (four times in the description above, at A16, A17, A18, and A19), so the lock-up time is shortened to approximately ¼ of the conventional time.

The description above described the time of input of a frequency alteration command (FA). The output signal of OR gate 332 also goes to the high level when a lock failure signal (LF) is input, however, even if there is no frequency alteration command (the signal level is low). The PLL device 301 performs the same operations as described above at this time; the control unit 330 has the programmable dividers 311 to 314 start frequency division in synchronism with the phases of the reference signals FR31 to FR34.

As time elapses and the above phase comparisons are repeated (see A20, A21, A22, and A23 in FIG. 11), the output signal FO3 reaches (locks onto) the set frequency. The detector coupled to one of the phase detectors 307 to 310 then outputs a lock detection signal (LD) to the microcomputer 316. The microcomputer 316 outputs a lock detection signal (LD) to the gate control circuit 331 (see A25 in FIG. 11); the lock detection signal LD is of the one-shot type (that is, it remains at the high level for a predetermined interval after a transition from the non-detect state to the detect state).

A high-level signal (a reset signal) is furthermore input to the R input terminal of flip-flop 333, which then outputs a low-level signal. As a result, a low-level signal is input through lead wire 345 to one input terminal of AND gates 341 to 344, which then output low-level signals. Control signals G2, G3, and G4 thus become low-level signals (see A26, A27, and A28 in FIG. 11).

One input terminal of OR gate 336 is also coupled to the Q output terminal of flip-flop 334. A high-level lock detection signal LD is input to the S input terminal of flip-flop 334, so flip-flop 334 outputs a high-level signal, and a high-level signal is input to one input terminal of OR gate 336. As a result, the control signal G1 output by OR gate 336 is at the high level, and the high-level state is maintained (see A24 in FIG. 11).

The result is that switching elements 323, 324, 325 are off, and programmable dividers 312, 313, 314 stop frequency division. The gates 327, 328, 329 controlled by control signals G2, G3, G4 are also off at this time. Consequently, error signals ER32, ER33, ER34 are not output to low-pass filter 321. The amount of power consumed can thus be lessened by stopping the frequency-division operation of programmable dividers 312, 313, 314 after lock detection.

Since control signal G1 is kept in the high-level state, switching element 322 remains in the on-state, and programmable divider 311 continues its frequency-division operation. Phase detector 307 also compares the phases of the feedback signal FV31 output by programmable divider 311 and reference signal FR31 (see A29 and A30 in FIG. 11).

The gate 326 controlled by control signal G1 is in the on-state at this time, so charge pump 317 outputs an error signal ER31 to the low-pass filter 321. The low-pass filter 321 outputs a control voltage CV3 to the voltage-controlled oscillator 315, and the voltage-controlled oscillator 315 continues to output an output signal FO3 at the set frequency.

To summarize the material above, when lock has been detected (when a lock detection signal is input to the control unit 330), the control unit 330 continues the frequency-division operation of one particular programmable divider (programmable divider 311 in the description above). The control unit 330 also stops the frequency-division operations of the other programmable dividers (programmable dividers 312, 313, 314 in the description above).

Instead of doing as above when one of the detectors coupled to the phase detectors 307 to 310 detects lock (for example, when the detector coupled to phase detector 310 detects lock), the control unit 330 can be configured to continue the frequency-division operation of only the programmable divider from which the lock was detected (programmable divider 314, coupled to the detector coupled to phase detector 310 in the description above), and stop the frequency-division operation of the other programmable dividers 311, 312, 313.

Figure 12:
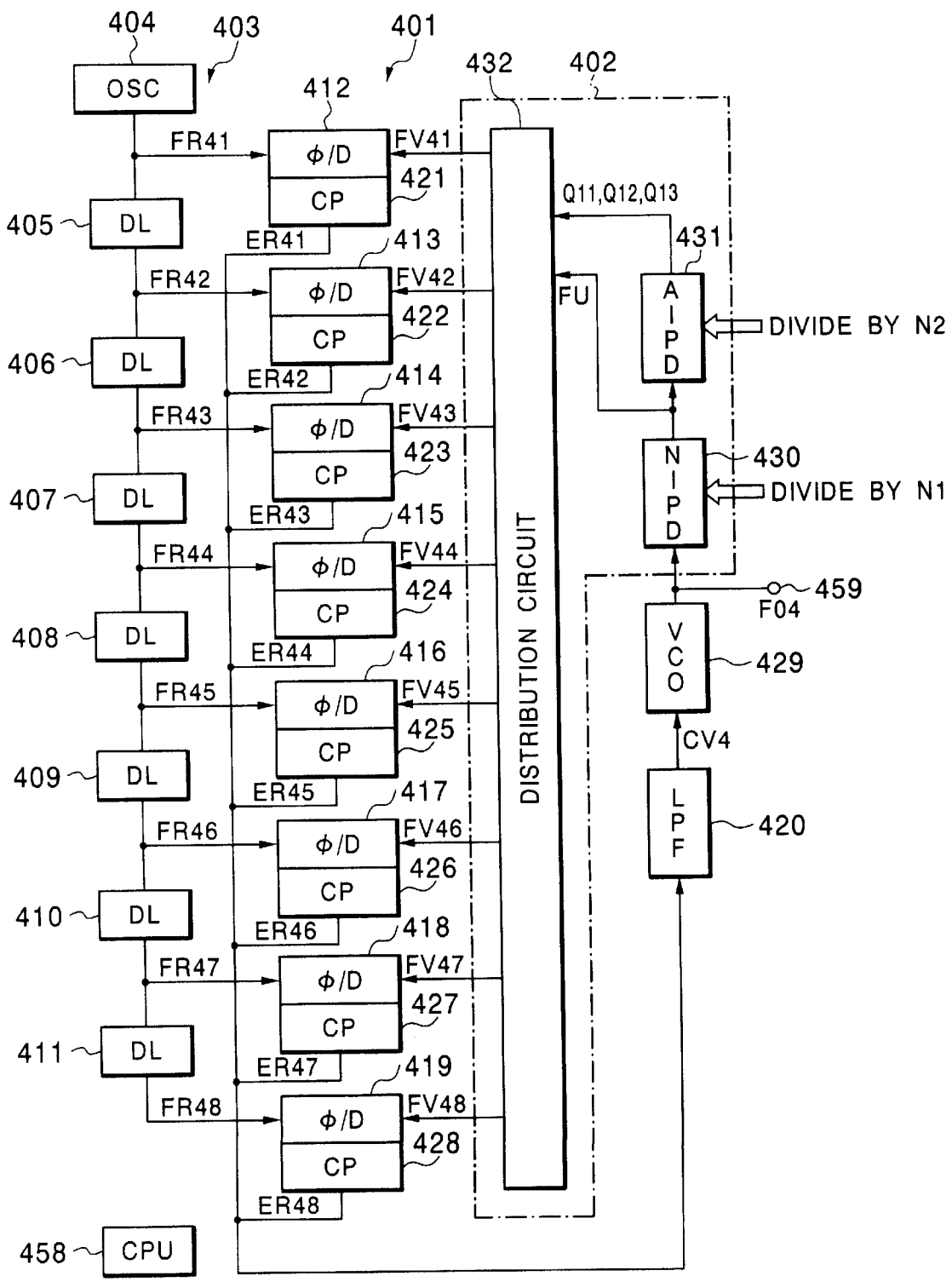
FIG. 12 is a block diagram of a PLL device according to a sixth embodiment of the invention.
Figure 13:
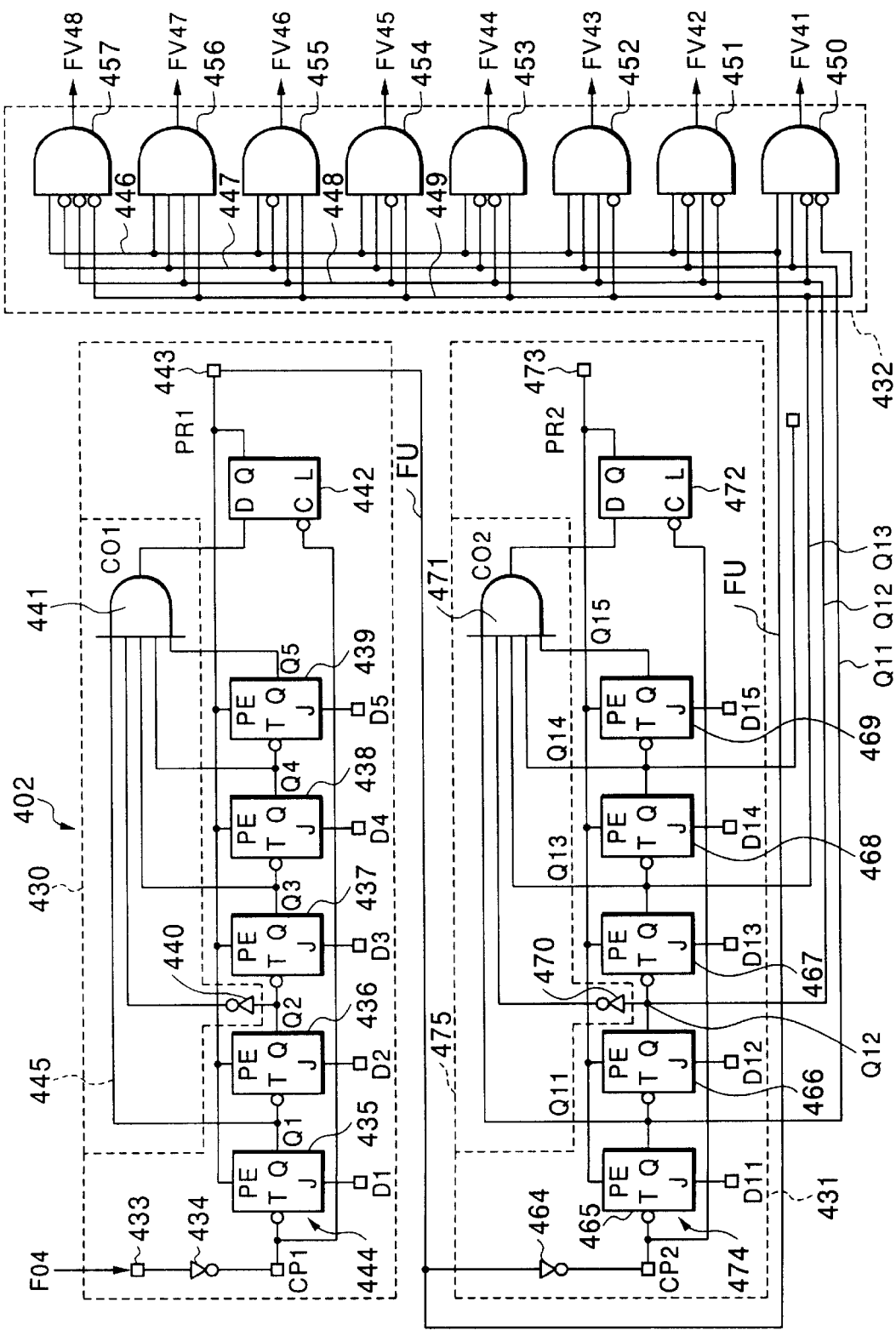
FIG. 13 is a block diagram of a frequency-division unit used in the PLL device of FIG. 12.

A PLL device 401 according to a sixth embodiment of the invention will be described below with reference to FIGS. 12 and 13. FIG. 12 is a block diagram of the PLL device 401; FIG. 13 is a detailed block diagram of the frequency-division unit 402 used in the PLL device 401.

Figure 15:
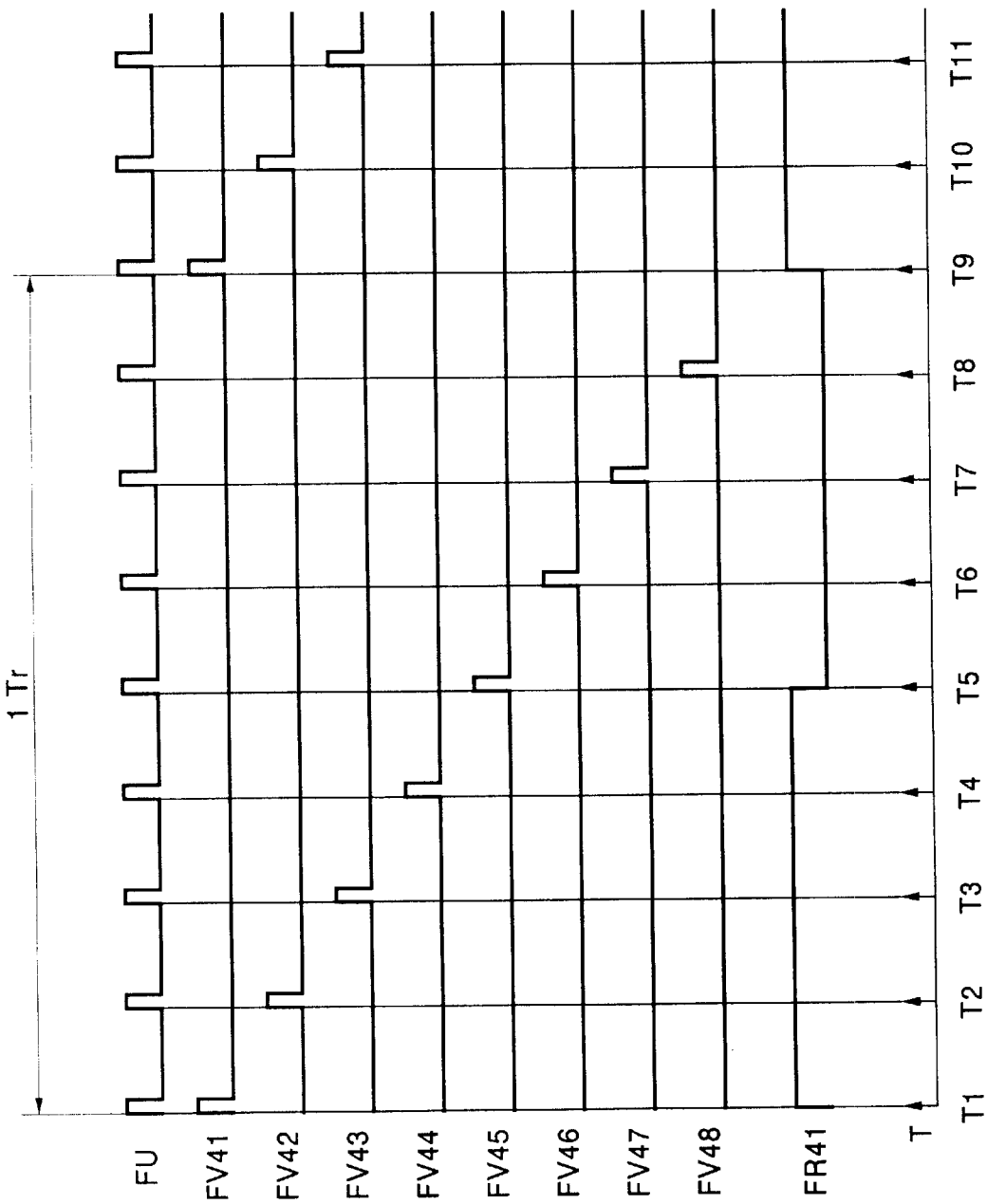
FIG. 15 is a timing diagram showing feedback signals FV41 to FV44 etc. that appear in the PLL device in FIG. 12.

In these drawings, the reference generating means 403 comprises, for example, a reference oscillator 404 and seven delay circuits 405, 406, 407, 408, 409, 410, 411 coupled in series. The reference oscillator 404 outputs, for example, a 10-kHz reference signal FR41. The timing diagram in FIG. 15 shows the waveform of reference signal FR401. Reference signal FR41 rises at timings T1 and T9. Reference signal FR41 is input to one input terminal of a phase detector 412. Delay circuits 405 to 411 have respective delay times of ⅛ of one period of reference signal FR41. Signals delayed by ⅛, ⅔, ⅜, ⅘, ⅝, ⅞, and ⅞ of one period (1Tr) of reference signal FR41 thus appear at the output terminals of delay circuits 405 to 411. These are input as reference signals FR42 to FR48 to the input terminals of phase detectors 413 to 419.

The reference generating means 403 thus generates a plurality of reference signals FR41 to FR48 with mutually differing phases. The reference signals FR41 to FR48 rise at the times indicated by T1 to T8, respectively (see FIG. 15).

Feedback signals FV41 to FV48 (described later) are input to the other input terminals of the phase detectors 412 to 419.

Phase detector 412 compares the phase of feedback signal FV41 with the phase of reference signal FR41, and outputs a pump-up signal and a pump-down signal to a charge pump 421 as a result of this comparison. Charge pump 421 supplies an error signal ER41 through a node 460 to a low-pass filter 420 responsive to these two signals.

Similarly, phase detectors 413 to 419 compare the phases of feedback signals FV42 to FV48 with the phases of reference signals FR42 to FR48.

As results of the above comparisons, phase detectors 413 to 419 output pump-up signals and pump-down signals to respective charge pumps 422 to 428. Responsive to these pairs of signals, charge pumps 422 to 428 supply respective error signals ER42 to ER48 through node 460 to the low-pass filter 420.

In response to the error signals ER41 to ER48, the low-pass filter 420 outputs a control voltage CV4 to the voltage-controlled oscillator 429. The voltage-controlled oscillator 429 generates an output signal FO4 in response to the control voltage CV4.

The frequency-division unit 402 comprises a main divider 430, an auxiliary divider 431, and a distribution circuit 432. The main divider 430 divides the frequency of the output signal FO4 of the voltage-controlled oscillator 429 with a frequency-division ratio N1, and outputs an intermediate signal FU.

The auxiliary divider 431 divides the frequency of the output (intermediate signal FU) of the main divider 430 with a frequency-division ratio N2, and outputs signals (Q11, Q12, Q13). The distribution circuit 432 generates a plurality of feedback signals FV41 to FV48 from the intermediate signal FU and the outputs of the auxiliary divider 431 (signals Q11, Q12, Q13), and outputs them to the phase detectors 412 to 419.

As shown in FIG. 13, the main divider 430 comprises, for example, an input terminal 433, an inverter 434, toggle flip-flops 435 to 439, another inverter 440, an AND gate 441, a D-flip-flop 442, and an output terminal 443.

Inverter 434 has its input terminal coupled to input terminal 433, and its output terminal coupled to toggle flip-flop 435. Toggle flip-flops 435 to 439 are coupled in series, and have, for example, built-in input inverting functions. The J terminals of toggle flip-flops 435 to 439 are coupled to input terminals D1 to D5.

Toggle flip-flops 435 to 439 constitute a counter 444 that uses an inverted version of the output signal FO4 as a clock pulse CP1, presets a frequency-division ratio N1 furnished to the input terminals D1 to D5 according to a signal PR1 applied to terminal PE, and counts down from the preset value.

A coincidence circuit 445 comprises inverter 440 and AND gate 441. The Q output terminals of toggle flip-flops 435 and 437 to 439 are coupled to input terminals of the AND gate 441. The Q output terminal of toggle flip-flop 436 is coupled through inverter 440 to an input terminal of the AND gate 441. A detection signal CO1 thus goes high when the outputs Q1 to Q5 of toggle flip-flops 435 to 439 are 'high-level,' 'low-level,' 'high-level,' 'high-level,' 'high-level.'

D-flip-flop 442 has, for example, a built-in input inverting function, and outputs a signal PR1 from its Q terminal in which the detection signal CO1 of the coincidence circuit 445 is delayed by one cycle of output signal FO4, using the inverted version of output signal FO4 as a clock pulse. Signal PR1 (intermediate signal FU) is output from the output terminal 443.

The input at input terminals D1, D2, D3, D4, D5 thus determines the frequency-division ratio N1, and an intermediate signal FU, in which the frequency of output signal FO4 is divided by N1, is output from the output terminal 443.

The auxiliary divider 431 comprises, for example, an inverter 464, toggle flip-flops 465 to 469, another inverter 470, an AND gate 471, a D-flip-flop 472, and an output terminal 473.

Inverter 464 has its input terminal coupled to the output terminal 443 of the main divider 430, and its output terminal coupled to toggle flip-flop 465. Toggle flip-flops 465 to 469 are coupled in series, and have, for example, built-in input inverting functions. The J terminals of toggle flip-flops 465 to 469 are coupled to input terminals D11 to D15.

Toggle flip-flops 465 to 469 constitute a counter 474 that uses an inverted version of the intermediate signal FU as a clock pulse CP2, presets a frequency-division ratio N2 furnished to the input terminals D11 to D15 according to a signal PR2 applied to terminal PE, and counts down from the preset value.

A coincidence circuit 475 comprises inverter 470 and AND gate 471. The Q output terminals of toggle flip-flops 465 and 457 to 469 are coupled to input terminals of AND gate 470. The Q output terminal of toggle flip-flop 476 is coupled through inverter 470 to another input terminal of AND gate 470. The coincidence circuit 475 thus outputs a detection signal CO2 that goes high when the output of counter 474 is '2.'

D-flip-flop 472 has, for example, a built-in input inverting function, and outputs a signal PR2 in which the detection signal CO2 of the coincidence circuit 475 is delayed by one cycle of the intermediate signal FU, using the inverted version of the intermediate signal FU as a clock pulse.

The combination of signals (binary signals) input at input terminals D11, D12, D13, D14, D15 thus determines the frequency-division ratio N2. Flip-flop 465 outputs the intermediate frequency signal FU with its frequency divided by two.

A signal Q12 in which the frequency of the intermediate signal FU is divided by four is output from the Q output terminal of toggle flip-flop 466. A signal Q13 in which the frequency of the intermediate signal FU is divided by eight is output from the Q output terminal of toggle flip-flop 467.

The distribution circuit 432 is, for example, a decoder comprising conductive wires 446 to 449 and AND gates 450 to 457. The conductive wires 446 to 449 are coupled to the intermediate signal FU and signals Q11 to Q13, respectively. The conductive wires 446 to 449 are also coupled to a first terminal to a fourth terminal provided in each of the AND gates 450 to 457.

In this configuration, AND gate 450 outputs a signal FV41 representing the logical AND of signals FU, Q11, Q12-inverted, and Q13-inverted. AND gate 451 outputs a signal FV42 representing the logical AND of signals FU, Q11-inverted, Q12, and Q13-inverted. AND gate 452 outputs a signal FV43 representing the logical AND of signals FU, Q11, Q12, and Q13-inverted. AND gate 453 outputs a signal FV44 representing the logical AND of signals FU, Q11-inverted, Q12-inverted, and Q13. AND gate 454 outputs a signal FV45 representing the logical AND of signals FU, Q11, Q12-inverted, and Q13. AND gate 455 outputs a signal FV46 representing the logical AND of signals FU, Q11-inverted, Q12, and Q13. AND gate 456 outputs a signal FV47 representing the logical AND of signals FU, Q11, Q12, and Q13. AND gate 457 outputs a signal FV48 representing the logical AND of signals FU, Q11-inverted, Q12-inverted, and Q13-inverted.

The above constituent elements form the PLL device 401.

Figure 14:
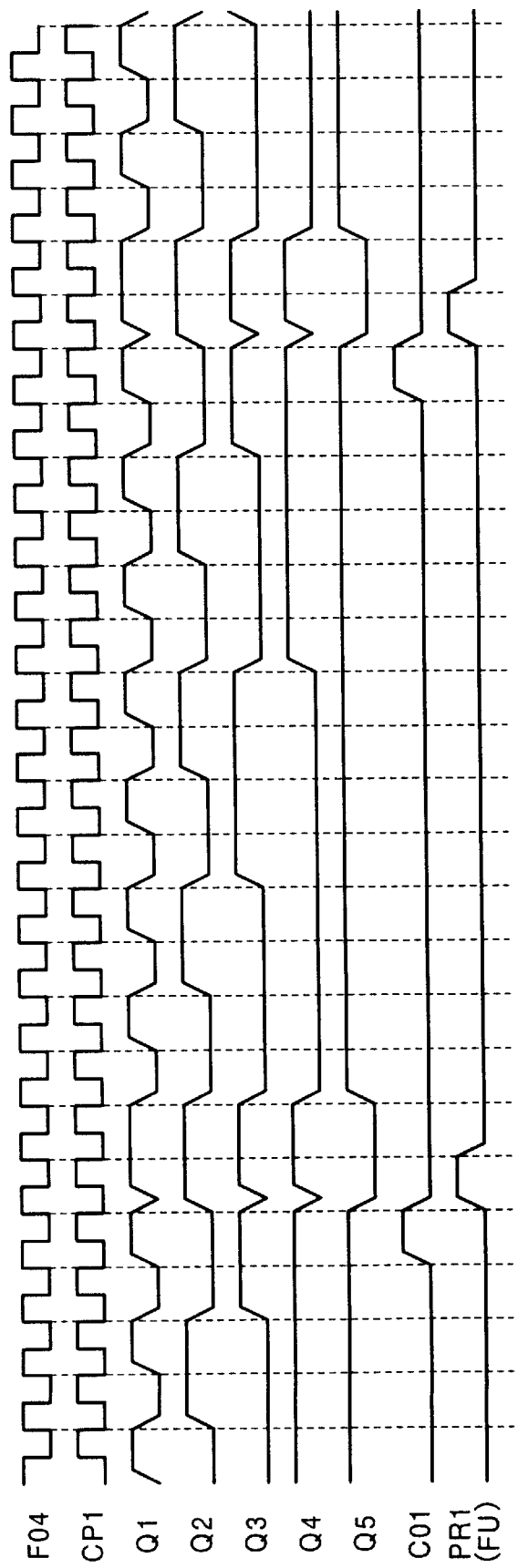
FIG. 14 is a timing diagram showing signals Q1 to Q5 that appear in the PLL device in FIG. 12.

Next, the operation of this PLL device 401 will be described with reference to FIGS. 12 to 15. FIG. 14 is a timing diagram of the signals FO4, CP1, Q1, Q2, Q3, Q4, Q5, CO1, and PR1 used in the PLL device 401; FIG. 15 is a timing diagram of signals FU and FV41 to FV48.

First, 1280 kHz is input as a frequency setting of the output signal FO4 through an input means (not visible) to a control unit 458. The control unit 458 calculates the frequency-division ratio N to be set for the output signal FO4 as N=1280 kHz/10 kHz=128. That is because the frequency of the reference signals is 10 kHz.

For the set frequency-division ratio N=128, the control unit 458 also decides that the frequency-division ratio N1 of the main divider 430 will be sixteen and the frequency-division ratio N2 of the auxiliary divider 431 will be eight. That is, the control unit 458 exercises control so that the product of frequency-division ratio N1 and frequency-division ratio N2 matches the set frequency-division ratio N of the output signal FO4.

According to the above decision that N1=16, the signals input to the input terminals D1 to D5 provided in the main divider 430 are 'high-level,' 'high-level,' 'high-level,' 'high-level,' 'low-level.' The main divider 430 is thus configured from a programmable divider or counter that can divide the frequency of the output signal FO4 with a variable (programmable) frequency-division ratio N1 by inputting certain inputs (high-level or low-level) at its input terminals D1 to D5.

Since clock pulse CP1 is inverted from the output signal FO4, it has the waveform shown as CP1 in FIG. 14. As shown in FIG. 14, signal Q1 has a waveform in which the frequency of the output signal FO4 is divided by two, with a delay of one cycle of the output signal FO4. Signal Q2 has a waveform in which the frequency of signal Q1 is divided by two. Signal Q3 has a waveform in which the frequency of signal Q2 is divided by two. Signal Q4 has a waveform in which the frequency of signal Q3 is divided by two. Signal Q5 has a waveform in which the frequency of signal Q4 is divided by two.

AND gate 441 takes the logical AND of signals Q1, Q2-inverted, Q3, Q4, and Q5, and outputs signal CO1 (see the waveform drawing of CO1 in FIG. 14). Signal CO1 is delayed by one cycle of the output signal FO4 and output as signal PR1 (FU). Signals Q1 to Q5 have waveforms that count down from the preset value when signal PR1 is applied to the PE terminals of toggle flip-flops 435 to 439. The main divider 430 thus outputs an intermediate signal FU in which the frequency of the output signal is divided by N1 (N1=16).

The intermediate signal FU is input through inverter 464 in the auxiliary divider 431 to toggle flip-flop 465. Since frequency-division ratio N2 is eight, signals that are 'high-level,' 'high-level,' 'high-level,' 'low-level,' and 'high-level' are input to the input terminals D11 to D15 provided in the auxiliary divider 431, as explained above.

The auxiliary divider 431 is thus configured from a programmable divider or counter that can divide the frequency of the intermediate signal FU with a variable (programmable) frequency-division ratio N2 by inputting certain inputs (high-level or low-level) at its input terminals D11 to D15.

In a manner similar to FIG. 14, signal Q11 has a waveform in which the frequency of the intermediate signal FU is divided by two. Signal Q12 has a waveform in which the frequency of signal Q11 is divided by two. Signal Q13 has a waveform in which the frequency of signal Q12 is divided by two. Signal Q14 has a waveform in which the frequency of signal Q13 is divided by two. Signal Q15 has a waveform in which the frequency of signal Q14 is divided by two.

AND gate 471 takes the logical AND of signals Q11, Q12-inverted, Q13, Q14, and Q15, and outputs signal CO2. D-flip-flop 472 inputs signal CO2 and thereby outputs signal PR2. Signal PR2 is applied to the PE terminals of toggle flip-flops 465 to 469, producing waveforms of signals Q11 to Q15 that count down from the preset value.

In the configuration above, the auxiliary divider 431 outputs a signal Q11 with one-half the frequency of the intermediate signal FU, a signal Q12 with one-fourth the frequency of the intermediate signal FU, and a signal Q13 with one-eighth the frequency of the intermediate signal FU (N2=8) to the distribution circuit 432.

The intermediate signal FU and signals Q11 to Q13 are input through conductive wires 446 to 449 to AND gates 450 to 457 in the distribution circuit 432.

AND gate 450 outputs a feedback signal FV41 obtained by taking the logical AND of signals FU, Q11, Q12-inverted, and Q13-inverted. Consequently, feedback signal FV41 is synchronized with the intermediate signal FU (no difference in phase) and has a waveform in which the frequency of the intermediate signal FU is divided by eight.

AND gate 451 outputs a feedback signal FV42 obtained by taking the logical AND of signals FU, Q11-inverted, Q12, and Q13-inverted. Consequently, feedback signal FV42 lags feedback signal FV41 by one cycle of the intermediate signal FU, and has a waveform in which the frequency of the intermediate signal FU is divided by eight.

Similarly, feedback signal FV41 is delayed by two to seven cycles of the intermediate signal FU in feedback signals FV43 to FV48, which have waveforms in which the frequency of the intermediate signal FU is divided by eight.

Next, the frequency of reference signal FR41 will be derived. FR41 is FO4/N. FO4 is N1×FU, and N is N1×N2. Accordingly, FR41=(N1×FU)/(N1×N2)=FU/N2=FU/8.

In other words, reference signal FR41 has one-eighth the frequency of the intermediate signal FU. One period Tr of reference signal FR41 is thus as shown in FIG. 15. It can be seen that the rises of feedback signals FV41 to FV48 coincide with the timings T1 to T8 of the rises of the above-mentioned reference signals FR41 to FR48 (see FIG. 15).

In this way, the phase detectors 412 to 419 compare the phases of feedback signals FV41 to FV48 with the phases of reference signals FR41 to FR48 at timings T1 to T8, respectively.

Due to this configuration, phase comparisons are performed eight times during one period (Tr) of reference signal FR41, so the lock-up time (the time until synchronization with the output signal FO4 is reached) is shortened to approximately ⅛ that in the conventional type with one phase detector stage.

As a result of the above comparisons, the phase detectors 412 to 419 output pump-up signals and pump-down signals to the charge pumps 421 to 428. Responsive to these pairs of signals, charge pumps 421 to 428 output respective error signals ER41 to ER48 to the low-pass filter 420.

In response to the error signals ER41 to ER48, the low-pass filter 420 outputs a control voltage CV4 to the voltage-controlled oscillator 429. The voltage-controlled oscillator 429 generates the output signal FO4 in response to the control voltage CV4.

Through repetition of the operations in the above loops, the PLL device 401 outputs an output signal FO4 having the set frequency of 1280 kHz to the output terminal 459 coupled to the output terminal of the voltage-controlled oscillator 429. This completes the description of the operation of the PLL device 401.

In the above PLL device 401, incidentally, the frequency-division ratio N2 of the auxiliary divider 431 is placed at or below the number of phase detectors 412 to 419 that compare the reference signals FR41 to FR48 and the feedback signals FV41 to FV48.

For another example, suppose that 320 kHz is input through the input means to the control unit 458 as the frequency setting of the output signal FO4. The control unit 458 calculates the frequency-division ratio setting N of the output signal as N=320 kHz/10 kHz=32.

For a frequency-division ratio setting of N=32, the control unit 458 decides that the frequency-division ratio N of the main divider 430 will be sixteen, and the frequency-division ratio N2 of the auxiliary divider 431 will be two. Thus for the comparatively small frequency-division ratio setting of N=32, the control unit 458 chooses a comparatively small value (two, for example) for the frequency-division ratio N2 of the auxiliary divider 431.

By reducing frequency-division ratio N2 in this way, it can reduce the amount of power consumed by the auxiliary divider 431. As mentioned above, frequency-division ratio N2 is also placed at or below the number of phase detectors 412 to 419 (eight in the description above). For example, the frequency-division ratio N2 is selected from the range of integers from one to eight.

As described above, an appropriate value is selected for frequency-division ratio N2 from the set size of frequency-division ratio N1, the desired lock-up time, the desired amount of power consumption, and so on. The auxiliary divider 431 comprises a programmable divider or counter, so an appropriate frequency-division ratio N2 can be selected as explained above.

For another example, suppose that 1290 kHz is input through the input means to the control unit 458 as the frequency setting of the output signal FO4. In this case, the control unit 458 calculates N=129 as the frequency-division ratio setting N of the output signal FO4.

For a frequency-division ratio setting of N=129, the control unit 458 decides that the frequency-division ratio N1 of the main divider 430 will be sixteen, and the frequency-division ratio N2 of the auxiliary divider 431 will be eight. That is, it determines N1 and N2 so that their product matches a value near the frequency-division ratio setting N. As a result, the PLL device 401 outputs an output signal FO4 having a frequency-division ratio 128 equal to the product of N1 and N2 at output terminal 459, as described above.

The control unit 458 can detect that the output signal FO4 has reached the product (128) of N1 and N2 (that the frequency division operation with a frequency-division ratio of N has reached a stable state, that is, has locked) if, for example, AND gates (not visible) that take the logical AND of the pump-up signals and pump-down signals output by the phase detectors 412 to 419 are provided in correspondence to the phase detectors 412 to 419, and their outputs are sent to the control unit 458.

After making this detection, the control unit 458 stops the operation of the auxiliary divider 431, and simultaneously alters the frequency-division ratio of the main divider 430 to N1=129. As a result, the main divider 430 outputs the intermediate signal FU, in which the frequency of the output signal FO4 is divided by a ratio of N1=129, to the distribution circuit 432. The PLL device 401 also outputs output signal FO4 having a frequency-division ratio of N=129 (and the set frequency of 1290 kHz) to output terminal 459.

In this way, in regard to the proper frequency-division ratio setting (N=129, for example) applying to the output signal FO4, at first, the frequency of the output signal FO4 is divided by the main divider 430 and auxiliary divider 431 with a frequency-division ratio (N1×N2=128) close to the frequency-division ratio setting; then the frequency can be divided with the set frequency-division ratio (N=129), using the main divider 430 alone.

With this configuration, even if the frequency-division ratio setting N cannot be expressed as a product of the frequency-division ratio N1 of the main divider 430 and the frequency-division ratio N2 of the auxiliary divider 431 (N=129, for example), an output signal FO4 having the set frequency-division ratio N can be output.

Moreover, if the frequency-division ratio setting N (N=128, for example) can be expressed as a product of the frequency-division ratio N1 (N1=16, for example) of the main divider 430 and the frequency-division ratio N2 (N2=8, for example) of the auxiliary divider 431, after the frequency of the output signal FO4 has been divided by the main divider 430 and auxiliary divider 431, it can be divided by the main divider 430 alone.

Thus the lock-up time is shortened by having frequency division performed initially by the main divider 430 and auxiliary divider 431. Afterward (for example, when a frequency-division ratio equal to the product of N1 and N2 and close to the set frequency-division ratio N has been reached), the amount of power consumed can be reduced by stopping the operation of the auxiliary divider 431 and having frequency division performed by the main divider 430 alone.

Figure 16:
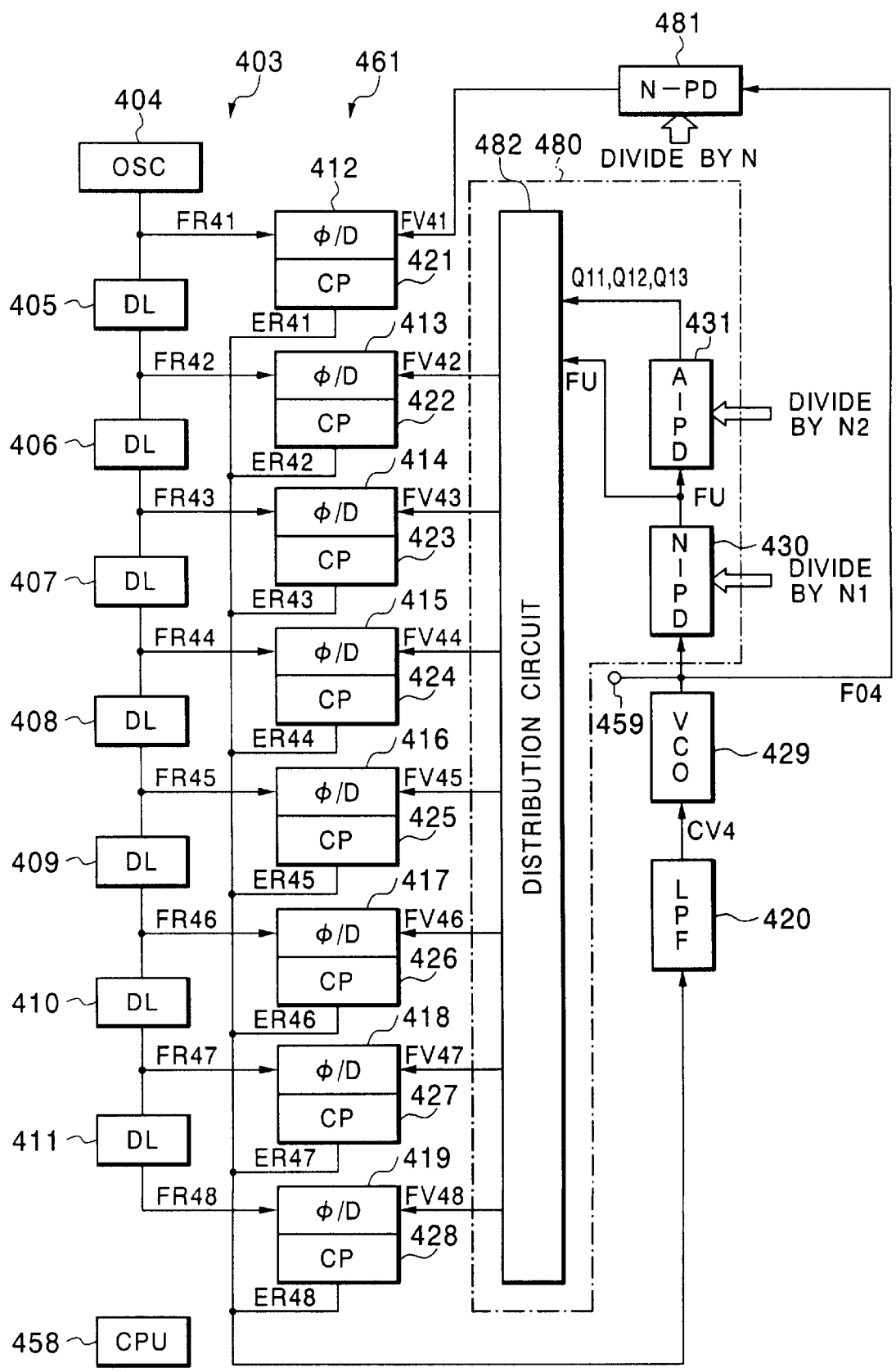
FIG. 16 is a block diagram of a PLL device according to a seventh embodiment of the invention.
Figure 17:
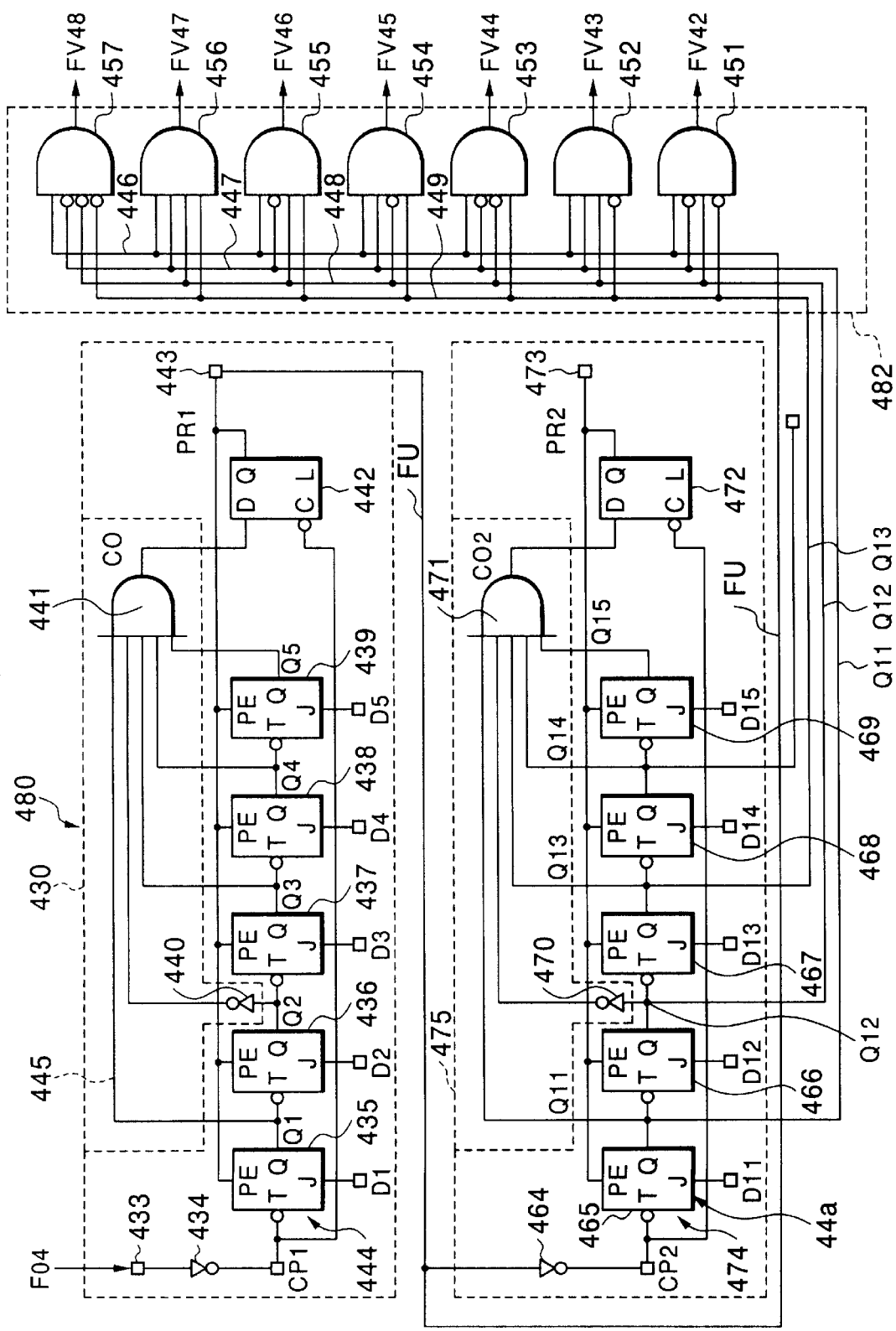
FIG. 17 is a block diagram of the first frequency-division unit used in the PLL device in FIG. 16.

A PLL device 401 according to a seventh embodiment of the invention will be described below with reference to FIGS. 16 and 17. FIG. 16 is a block diagram of the PLL device 401; FIG. 17 is a detailed block diagram of the first frequency-division unit 480 used in the PLL device 401.

This seventh embodiment is generally the same as the preceding sixth embodiment; identical reference characters are used for identical or corresponding parts.

In these drawings, the reference generating means 403 comprises, for example, a reference oscillator 404 and seven delay circuits 405, 406, 407, 408, 409, 410, 411 coupled in series. The reference oscillator 404 outputs, for example, a 10-kHz reference signal FR41. The timing diagram in FIG. 15 shows the waveform of reference signal FR401. Reference signal FR41 rises at timings T1 and T9. Reference signal FR41 is input to one input terminal of phase detector 412. Delay circuits 405 to 411 have respective delay times of ⅛ of one period of reference signal FR41. Signals delayed by ⅛, ⅖, ⅜, ⅘, ⅝, ⅝, and ⅞ of one period (1Tr) of reference signal FR41 thus appear at the output terminals of delay circuits 405 to 411. These are input as reference signals FR42 to FR48 to the input terminals of phase detectors 413 to 419.

The reference generating means 403 thus generates a plurality of reference signals FR41 to FR48 with mutually differing phases. The reference signals FR41 to FR48 rise at the times indicated by T1 to T8, respectively (see FIG. 15).

Feedback signals FV41 to FV48 (described later) are input to the other input terminals of the phase detectors 412 to 419.

Phase detector 412 compares the phase of feedback signal FV41 with the phase of reference signal FR41, and outputs a pump-up signal and a pump-down signal to a charge pump 421 as a result of this comparison. Charge pump 421 supplies an error signal ER41 through a node 460 to a low-pass filter 420 responsive to these two signals.

Similarly, phase detectors 413 to 419 compare the phases of feedback signals FV42 to FV48 with the phases of reference signals FR42 to FR48.

As results of the above comparisons, phase detectors 413 to 419 output pump-up signals and pump-down signals to respective charge pumps 422 to 428. Responsive to these pairs of signals, charge pumps 422 to 428 supply respective error signals ER42 to ER48 through node 460 to the low-pass filter 420.

In response to the error signals ER41 to ER48, the low-pass filter 420 outputs a control voltage CV4 to the voltage-controlled oscillator 429. The voltage-controlled oscillator 429 generates an output signal FO4 in response to the control voltage CV4.

The first frequency-division unit 480 is analogous to the frequency-division unit 402 of the sixth embodiment. The distribution circuit 482 analogous to the distribution circuit 432 in the sixth embodiment, however, generates only FV42 to FV48, without generating FV41.

The first frequency-division unit 480 comprises a main divider 430, an auxiliary divider 431, and the distribution circuit 482. The main divider 430 divides the frequency of the output signal FO4 of the voltage-controlled oscillator 429 with a frequency-division ratio N1, and outputs an intermediate signal FU. The auxiliary divider 431 divides the frequency of the output (intermediate signal FU) of the main divider 430 with a frequency-division ratio N2, and outputs signals (Q11, Q12, Q13).

The second frequency-division unit 481 comprises, for example, a thirteen-bit programmable divider, the input terminal of which is coupled so as to receive the output of the voltage-controlled oscillator 429, the output terminal of which is coupled to the other input terminal of phase detector 412. The control unit 458 (described later) sets a frequency-division ratio setting N (N being an integer) in the second frequency-division unit 481.

With this configuration, the second frequency-division unit 481 outputs the output signal FO4 of the voltage-controlled oscillator 429 with a set frequency-division ratio N; that output (feedback signal FV41) is supplied to phase detector 412. Thus the second frequency-division unit 481 outputs feedback signal FV41 to at least one phase detector (phase detector 412 in the example above). If necessary, the second frequency-division unit 481 may output feedback signals to two or more phase detectors.

The distribution circuit 482 converts the intermediate signal FU and the outputs of the auxiliary divider 431 (signals Q11, Q12, Q13) and outputs them as feedback signals FV42 to FV48 to phase detectors 413 to 419.

As shown in FIG. 13, the main divider 430 comprises, for example, an input terminal 433, an inverter 434, toggle flip-flops 435 to 439, another inverter 440, an AND gate 441, a D-flip-flop 442, and an output terminal 443.

Inverter 434 has its input terminal coupled to input terminal 433, and its output terminal coupled to toggle flip-flop 435. Toggle flip-flops 435 to 439 are coupled in series, and have, for example, built-in input inverting functions. The J terminals of toggle flip-flops 435 to 439 are coupled to input terminals D1 to D5.

Toggle flip-flops 435 to 439 constitute a counter 444 that uses an inverted version of the output signal FO4 as a clock pulse CP1, presets a frequency-division ratio N1 furnished to the input terminals D1 to D5 according to a signal PR1 applied to terminal PE, and counts down from the preset value.

A coincidence circuit 445 comprises inverter 440 and AND gate 441. The Q output terminals of toggle flip-flops 435 and 437 to 439 are coupled to input terminals of the AND gate 441. The Q output terminal of toggle flip-flop 436 is coupled through inverter 440 to an input terminal of the AND gate 441. The coincidence circuit 445 thus outputs a detection signal CO1 when the output of the counter 444 is '2.' That is, the detection signal CO1 goes high when the output of the counter 444 is '2.'

D-flip-flop 442 has, for example, a built-in input inverting function, and outputs a signal PR1 from its Q terminal in which the detection signal CO1 of the coincidence circuit 445 is delayed by one cycle of output signal FO4, using the inverted version of output signal FO4 as a clock pulse. Signal PR1 (intermediate signal FU) is output from the output terminal 443.

The input at input terminals D1, D2, D3, D4, D5 thus determines the frequency-division ratio N1, and an intermediate signal FU, in which the frequency of output signal FO4 is divided by N1, is output from the output terminal 443.

The auxiliary divider 431 comprises, for example, an inverter 464, toggle flip-flops 465 to 469, another inverter 470, an AND gate 471, a D-flip-flop 472, and an output terminal 473.

Inverter 464 has its input terminal coupled to the output terminal 443 of the main divider 430, and its output terminal coupled to toggle flip-flop 465. Toggle flip-flops 465 to 469 are coupled in series, and have, for example, built-in input inverting functions. The J terminals of toggle flip-flops 465 to 469 are coupled to input terminals D11 to D15.

Toggle flip-flops 465 to 469 constitute a counter 474 that uses an inverted version of the intermediate signal FU as a clock pulse CP2, presets a frequency-division ratio N2 furnished to the input terminals D11 to D15 according to a signal PR2 applied to terminal PE, and counts down from the preset value.

A coincidence circuit 475 comprises inverter 470 and AND gate 470. The Q output terminals of toggle flip-flops 465 and 457 to 469 are coupled to input terminals of AND gate 470. The Q output terminal of toggle flip-flop 476 is coupled through inverter 470 to another input terminal of AND gate 470. The coincidence circuit 475 thus outputs a detection signal CO2 that goes high when the output of counter 474 is '2.'

D-flip-flop 472 has, for example, a built-in input inverting function, and outputs a signal PR2 in which the detection signal CO2 of the coincidence circuit 475 is delayed by one cycle of the intermediate signal FU, using the inverted version of the intermediate signal FU as a clock pulse.

The combination of signals (binary signals) input at input terminals D11, D12, D13, D14, D15 thus determines the frequency-division ratio N2. Flip-flop 465 outputs the intermediate frequency signal FU with its frequency divided by two.

A signal Q12 in which the frequency of the intermediate signal FU is divided by four is output from the Q output terminal of toggle flip-flop 466. A signal Q13 in which the frequency of the intermediate signal FU is divided by eight is output from the Q output terminal of toggle flip-flop 467. The auxiliary divider 431 thus comprises, for example, a three-bit programmable divider, a counter, or the like.

The distribution circuit 432 is, for example, a decoder comprising conductive wires 446 to 449 and AND gates 451 to 457. The conductive wires 446 to 449 are coupled to the intermediate signal FU and signals Q11 to Q13, respectively. The conductive wires 446 to 449 are also coupled to a first terminal to a fourth terminal provided in each of the AND gates 451 to 457.

In this configuration, AND gate 451 outputs a signal FV42 representing the logical AND of signals FU, Q11-inverted, Q12, and Q13-inverted. AND gate 452 outputs a signal FV43 representing the logical AND of signals FU, Q11, Q12, and Q13-inverted. AND gate 453 outputs a signal FV44 representing the logical AND of signals FU, Q11-inverted, Q12-inverted, and Q13. AND gate 454 outputs a signal FV45 representing the logical AND of signals FU, Q11, Q12-inverted, and Q13. AND gate 455 outputs a signal FV46 representing the logical AND of signals FU, Q11-inverted, Q12, and Q13. AND gate 456 outputs a signal FV47 representing the logical AND of signals FU, Q11, Q12, and Q13. AND gate 457 outputs a signal FV48 representing the logical AND of signals FU, Q11-inverted, Q12-inverted, and Q13-inverted.

The above constituent elements form the PLL device 401.

Figure 18:
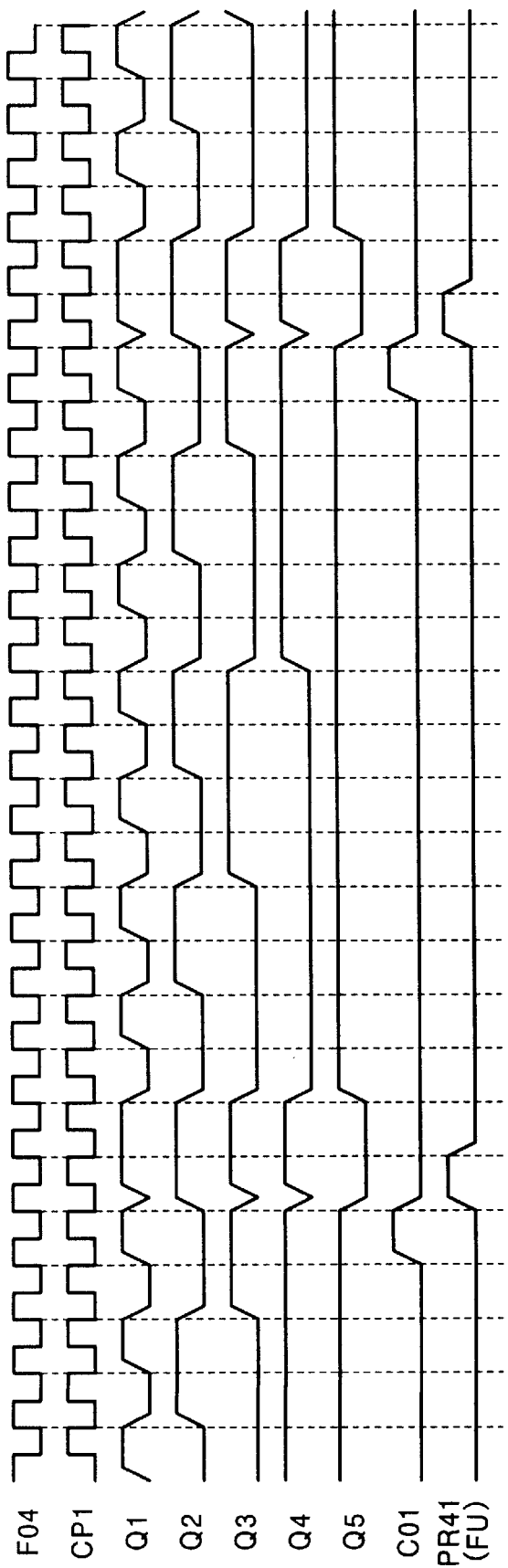
FIG. 18 is a timing diagram showing signals Q1 to Q5 that appear in the PLL device in FIG. 16.
Figure 19:
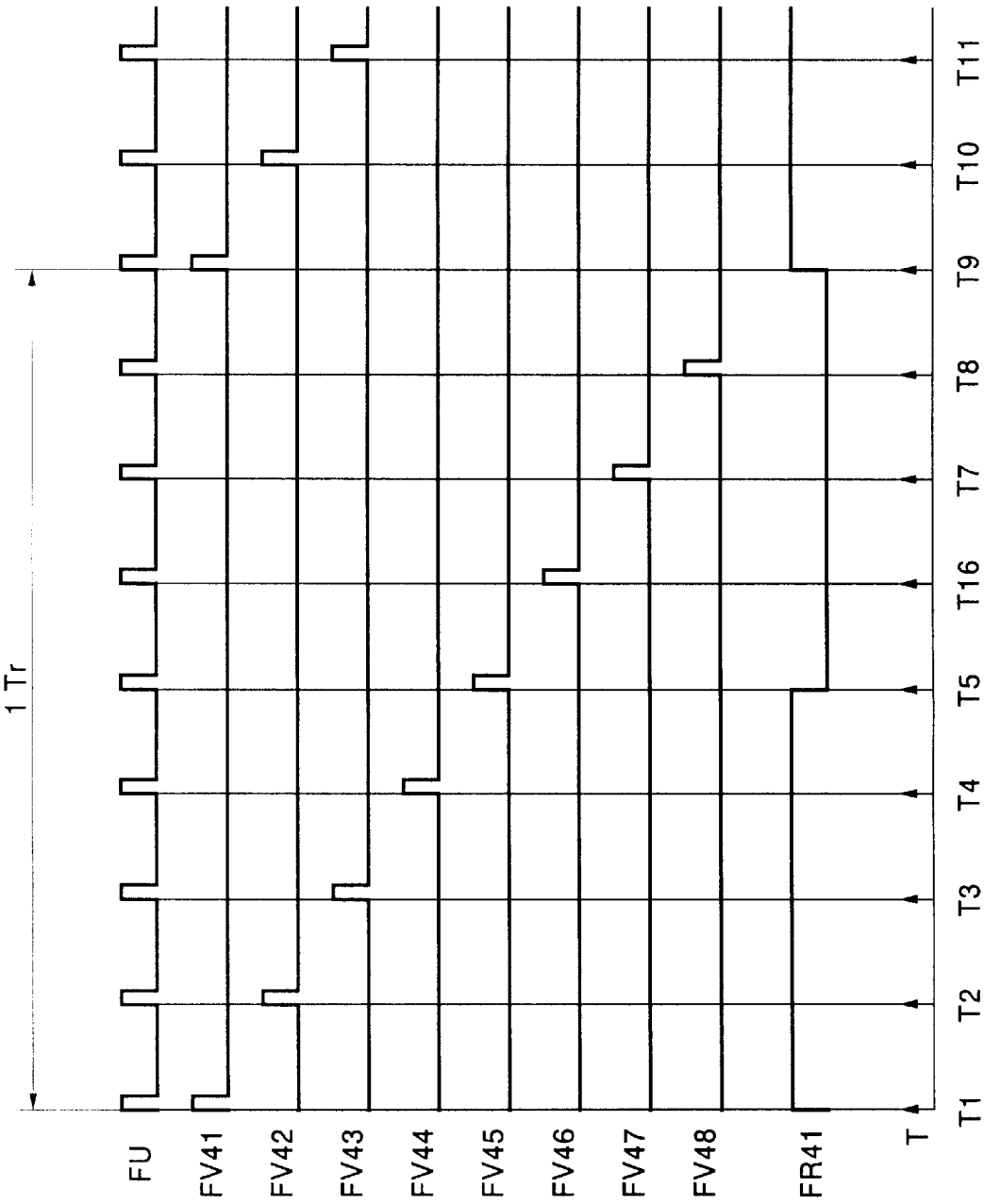
FIG. 19 is a timing diagram showing feedback signals FV41 to FV44 etc. that appear in the PLL device in FIG. 16.

Next, the operation of this PLL device 401 will be described with reference to FIGS. 16 to 19. FIG. 18 is a timing diagram of the signals FO4, CP1, Q1 to Q5, CO1, and PR1 used in the PLL device 401; FIG. 19 is a timing diagram of signals FU and FV41 to FV48.

First, 1280 kHz, for example, is input as a frequency setting of the output signal FO4 through an input means (not visible) to a control unit 458. The control unit 458 calculates the frequency-division ratio N of the second frequency-division unit 481 as N=1280 kHz/10 kHz=128 (because the frequency of the reference signals is 10 kHz).

For the-set frequency-division ratio N=128, the control unit 458 also decides that the frequency-division ratio N1 of the main divider 430 will be sixteen and the frequency-division ratio N2 of the auxiliary divider 431 will be eight. That is, the control unit 458 exercises control so that the product of frequency-division ratio N1 and frequency-division ratio N2 matches the set frequency-division ratio N of the output signal FO4.

According to the above decision that N1=16, the signals input to the input terminals D1 to D5 provided in the main divider 430 are 'high-level,' 'high-level,' 'high-level,' 'high-level,' 'low-level.' The main divider 430 is thus configured from a programmable divider or counter that can divide the frequency of the output signal FO4 with a variable (programmable) frequency-division ratio N1 by inputting certain inputs (high-level or low-level) at its input terminals D1 to D5.

Since clock pulse CP1 is inverted from the output signal FO4, it has the waveform shown as CP1 in FIG. 14. As shown in FIG. 14, signal Q1 has a waveform in which the frequency of the output signal FO4 is divided by two, being delayed by one cycle of the output signal FO4. Signal Q2 has a waveform in which the frequency of signal Q1 is divided by two. Signal Q3 has a waveform in which the frequency of signal Q2 is divided by two. Signal Q4 has a waveform in which the frequency of signal Q3 is divided by two. Signal Q5 has a waveform in which the frequency of signal Q4 is divided by two.

AND gate 441 takes the logical AND of signals Q1, Q2-inverted, Q3, Q4, and Q5, and outputs signal CO1 (see the waveform drawing of CO1 in FIG. 14). Signal CO1 is delayed by one cycle of the output signal FO4 and output as signal PR1 (FU). Signals Q1 to Q5 have waveforms that count down from the preset value when signal PR1 is applied to the PE terminals of toggle flip-flops 435 to 439. The main divider 430 thus outputs an intermediate signal FU in which the frequency of the output signal is divided by N1 (N1=16).

The intermediate signal FU is input through inverter 464 in the auxiliary divider 431 to toggle flip-flop 465. Since frequency-division ratio N2 is eight, signals that are 'high-level,' 'high-level,' 'high-level,' 'low-level,' and 'high-level' are input to the input terminals D11 to D15 provided in the auxiliary divider 431, as explained above.

The auxiliary divider 431 is thus configured from a programmable divider or counter that can divide the frequency of the intermediate signal FU with a variable (programmable) frequency-division ratio N2 by inputting certain inputs (high-level or low-level) at its input terminals D11 to D15.

In a manner similar to FIG. 14, signal Q11 has a waveform in which the frequency of the intermediate signal FU is divided by two. Signal Q12 has a waveform in which the frequency of signal Q11 is divided by two. Signal Q13 has a waveform in which the frequency of signal Q12 is divided by two. Signal Q14 has a waveform in which the frequency of signal Q13 is divided by two. Signal Q15 has a waveform in which the frequency of signal Q14 is divided by two.

AND gate 471 takes the logical AND of signals Q11, Q12-inverted, Q13, Q14, and Q15, and outputs signal CO2. D-flip-flop 472 inputs signal CO2 and thereby outputs signal PR2. Signal PR2 is applied to the PE terminals of toggle flip-flops 465 to 469, producing waveforms of signals Q11 to Q15 that count down from the preset value.

In the configuration above, the auxiliary divider 431 outputs a signal Q11 with one-half the frequency of the intermediate signal FU, a signal Q12 with one-fourth the frequency of the intermediate signal FU, and a signal Q13 with one-eighth the frequency of the intermediate signal FU (N2=8) to the distribution circuit 482.

The intermediate signal FU and signals Q11 to Q13 are input through conductive wires 446 to 449 to AND gates 450 to 457 in the distribution circuit 432.

The control unit 458 controls the second frequency-division unit 481 so that the feedback signal FV41 output by the distribution circuit 482 is synchronized with the intermediate signal FU (with no phase difference), and has a waveform in which the frequency of the intermediate signal FU is divided by eight.

AND gate 451 outputs a feedback signal FV42 obtained by taking the logical AND of signals FU, Q11-inverted, Q12, and Q13-inverted. Consequently, feedback signal FV42 lags feedback signal FV41 by one cycle of the intermediate signal FU, and has a waveform in which the frequency of the intermediate signal FU is divided by eight, as shown in FIG. 19.

Similarly, feedback signal FV41 is respectively delayed by two, three, four, five, six, and seven cycles of the intermediate signal FU in feedback signals FV43 to FV48, which have waveforms in which the frequency of the intermediate signal FU is divided by eight.

Next, the frequency of reference signal FR41 will be derived. FR41 is FO4/N. FO4 is N1×FU, and N is N1×N2. Accordingly, FR41=(N1×FU)/(N1×N2)=FU/N2=FU/8.

In other words, reference signal FR41 has one-eighth the frequency of the intermediate signal FU. One period Tr of reference signal FR41 is thus as shown in FIG. 19. It can be seen that the rises of feedback signals FV41 to FV48 coincide with the timings T1 to T8 of the rises of the above-mentioned reference signals FR41 to FR48 (see FIG. 19).

In this way, the phase detectors 412 to 419 compare the phases of feedback signals FV41 to FV48 with the phases of reference signals FR41 to FR48 at timings T1 to T8, respectively.

That is, the control unit 458 has the second frequency-division unit 481 output feedback signal FV41 in synchronism with the timing at which reference signal FR41 is generated, and phase detector 412 compares the phases of feedback signal FV41 and reference signal FR41. After lock, power consumption can be reduced by stopping the operation of the first frequency-division unit 480 and operating only the second frequency-division unit 481. The distribution circuit 482 generates feedback signals FV42 to FV48 in synchronism with the timing at which reference signals FR42 to FR48 are generated, and phase detectors 22 to 428 compare the phases of feedback signals FV42 to FV48 and reference signals FR42 to FR48.

Due to this configuration, phase comparisons are performed eight times during one period (Tr) of reference signal FR41, so the lock-up time (the time until synchronization with the output signal FO4 is reached) is shortened to approximately ⅛ that in the conventional type with one phase detector stage.

As a result of the above comparisons, the phase detectors 412 to 419 output pump-up signals and pump-down signals to the charge pumps 421 to 428. Responsive to these pairs of signals, charge pumps 421 to 428 output respective error signals ER41 to ER48 to the low-pass filter 420.

In response to the error signals ER41 to ER48, the low-pass filter 420 outputs a control voltage CV4 to the voltage-controlled oscillator 429. The voltage-controlled oscillator 429 generates the output signal FO4 in response to the control voltage CV4.

Through repetition of the operations in the above loops, the PLL device 401 outputs an output signal FO4 having the set frequency of 1280 kHz to the output terminal 459 coupled to the output terminal of the voltage-controlled oscillator 429.

For another example, suppose that 320 kHz is input through the input means to the control unit 458 as the frequency setting of the output signal FO4. The control unit 458 calculates the frequency-division ratio setting N of the output signal as N=320 kHz/10 kHz=32.

For a frequency-division ratio setting of N=32, the control unit 458 decides that the frequency-division ratio N1 of the main divider 430 will be sixteen, and the frequency-division ratio N2 of the auxiliary divider 431 will be two. Thus for the comparatively small frequency-division ratio setting of N=32, the control unit 458 chooses a comparatively small value (two, for example) for the frequency-division ratio N2 of the auxiliary divider 431.

By reducing frequency-division ratio N2 in this way, it can reduce the amount of power consumed by the auxiliary divider 431. As mentioned above, frequency-division ratio N2 is also placed at or below the number of phase detectors 412 to 419 (eight in the description above). For example, the frequency-division ratio N2 is selected from the range of integers from one to eight.

As described above, an appropriate value is selected for frequency-division ratio N2 from the set size of frequency-division ratio N1, the desired lock-up time, the desired amount of power consumption, and so on. The auxiliary divider 431 comprises a programmable divider or counter, so an appropriate frequency-division ratio N2 can be selected as explained above.

For another example, suppose that 1290 kHz is input through the input means to the control unit 458 as the frequency setting of the output signal FO4. In this case, the control unit 458 calculates N=129 as the frequency-division ratio setting N of the second frequency-division unit 481.

For a frequency-division ratio setting of N=129, the control unit 458 decides that the frequency-division ratio N1 of the main divider 430 will be sixteen, and the frequency-division ratio N2 of the auxiliary divider 431 will be eight. It also sets the frequency-division ratio of the second frequency-division unit 481 to a value equal to the product of N1 and N2. The control unit 458 thus makes the product of frequency-division ratios N1 and N2 match the frequency-division ratio setting N, or a value close thereto. As a result, the PLL device 401 outputs an output signal FO4 in which the reference frequency is multiplied by the frequency-division ratio N1×N2=128 at output terminal 459, as described above.

The control unit 458 can detect that the output signal FO4 has reached the frequency-division ratio product N1×N2=128 (at which time the control unit 458 determines that lock has been reached) if, for example, AND gates (not visible) that take the logical AND of the pump-up signals and pump-down signals output by the phase detectors 412 to 419 are provided, and their outputs are sent to the control unit 458.

After making this detection, the control unit 458 stops the operation of the main divider 430 and auxiliary divider 431, changes the frequency-division ratio of the second frequency-division unit 481 to N=129, and has it continue frequency division. As a result, the second frequency-division unit 481 outputs feedback signal FV41, in which the frequency of the output signal FO4 is divided by the set ratio of N1=129, to the phase detector 412. The PLL device 401 also outputs an output signal FO4 multiplied by the set frequency-division ratio of N=129 (having the set frequency of 1290 kHz) to output terminal 459.

In this way, in regard to the proper frequency-division ratio setting (N=129, for example) applying to the output signal FO4, at first, the frequency of the output signal FO4 is divided by the main divider 430, the auxiliary divider 431, and the second frequency-division unit 481 with a frequency-division ratio equal to the product of N1 and N2; after it has locked, the frequency is divided by the second frequency-division unit 481 alone.

The second frequency-division unit 481 thus performs frequency division with a frequency-division ratio of N=128 before lock, and the frequency-division ratio is switched over to 129 after lock.

When lock is detected and the frequency-division ratio is altered from N1×N2 to N, therefore, the frequency-division ratio varies smoothly (without overshoot and the like, because the difference between the value of N1×N2 and the value of N is comparatively small). Accordingly, compared with the configuration (in the sixth embodiment) that stops frequency division by the auxiliary divider 431 and switches the frequency-division ratio of the main divider 430 from N1 to N (where the difference between the value of N1 and the value of N is comparatively large), the seventh embodiment has an even shorter lock-up time, because it can switch the frequency-division ratio more smoothly.

With this configuration, even if the frequency-division ratio setting N cannot be expressed as a product of the frequency-division ratio N1 of the main divider 430 and the frequency-division ratio N2 of the auxiliary divider 431 (N=129, for example), an output signal FO4 having a frequency equal to the product of the reference frequency and the set frequency-division ratio N can be obtained.

Moreover, if the frequency-division ratio setting N (N=128, for example) can be expressed as a product of the frequency-division ratio N1 (N1=16, for example) of the main divider 430 and the frequency-division ratio N2 (N2=8, for example) of the auxiliary divider 431, after the frequency of the output signal FO4 has been divided by the main divider 430, the auxiliary divider 431, and the second frequency-division unit 481 and lock has been achieved, it can be divided by the second frequency-division unit 481 alone.

Thus the lock-up time is shortened by having frequency division performed initially (before lock) by the main divider 430, the auxiliary divider 431, and the second frequency-division unit 481. Afterward (after lock), the amount of power consumed can be reduced by stopping the operation of the main divider 430 and auxiliary divider 431 and having frequency division performed by the second frequency-division unit 481 alone.

Figure 20:
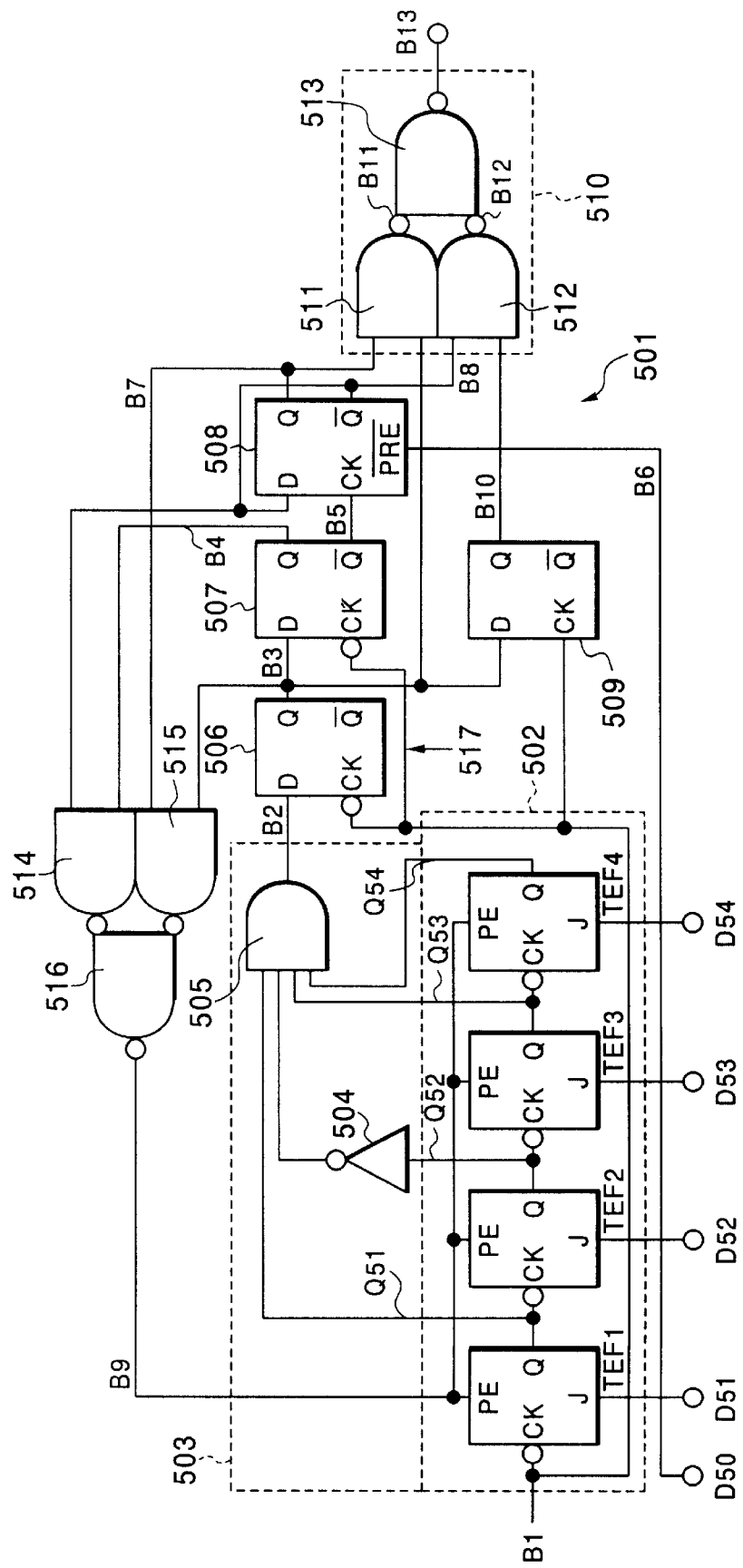
FIG. 20 is a block diagram of a programmable frequency-division device according to an eighth embodiment of the invention.

A programmable frequency-division device 1 according to an eighth embodiment of the invention will be described below with reference to the block diagram in FIG. 20. In FIG. 20 a signal D50 designating whether or not to divide frequency in half, signals D51 to D54 designating a frequency-division ratio N (where N is an integer), and an input signal B1 from a voltage-controlled oscillator (described later) are input to the programmable frequency-division device 501. D50 to D54 are low-level (0) or high-level (1) signals; A1 is, for example, a pulse signal in which the low-level time and high-level time are mutually equal.

The programmable divider 502 comprises, for example, four toggle flip-flops TFF1, TFF2, TFF3, TFF4 coupled in series. Each of the toggle flip-flops TFF1 to TFF4 has a built-in input inverting function.

Using an inverted version of input signal B1 as a clock pulse, the programmable divider 502 presets the frequency-division ratio N applied to input terminals D51 to D54 when the signal B9 (described later) applied to terminal PE is at the low level, and counts down from the preset value.

The coincidence circuit 503 has an inverter and an AND gate 505. The Q output terminals of toggle flip-flops TFF1, TFF3, and TFF4 are coupled to input terminals of AND gate 505. The Q output terminal of toggle flip-flop TFF2 is coupled through inverter 504 to another input terminal of AND gate 505. The coincidence circuit 503 thus outputs a detection signal B2 that goes high when the output of the programmable divider 502 is '2.'

A first output means comprises, for example, a D-flip-flop 506 having a built-in input inverting function. Using an inverted version of input signal B1 as a clock pulse, this D-flip-flop 506 outputs a signal B3 in which the output signal B2 of the coincidence circuit 503 is delayed by one-half cycle (period of the frequency to be divided) of input signal B1 from its Q terminal.

Flip-flop 507 is, for example, a D-flip-flop with a built-in input inverting function. Using an inverted version of input signal B1 as a clock pulse, flip-flop 507 outputs a signal B4 in which B3 is delayed by one cycle of B1 from its Q terminal, and a signal B5 in which signal B4 is inverted from its inverting output terminal (inverting Q).

Flip-flop 508 is, for example, a D-flip-flop. Using B5 as a clock pulse, flip-flop 508 feeds its own inverted output signal B8 back as an input signal to its D terminal. If the signal B6 input to its 'inverting PRE' terminal (the output of terminal D50) is at the high level, it outputs a signal B7 that alternates between on and off from its Q terminal in synchronization with the rise of B5, and outputs a signal B8 in which B7 is inverted from its inverting output terminal 'inverting Q.' When signal B6 is at the low level, B7 is at the high level and B8 is at the low level.

A second output means comprises, for example, a D-flip-flop 509. Using input signal B1 as a clock pulse, this D-flip-flop 509 outputs a signal B10 in which B3 is delayed by one-half cycle of input signal B1 from its Q terminal.

This is because the first output means 506 receives signal B1 as a clock pulse at an inverting clock terminal CK, and the second output means 509 receives signal B1 as a clock pulse at a non-inverting clock terminal CK.

Selection circuit 510 has, for example, NAND gates 511, 512, 513. NAND gate 511 outputs a signal B11 that is the logical NOT-AND of signal B3 and signal B7. NAND gate 512 outputs a signal B12 that is the logical NOT-AND of signal B10 and signal B8. NAND gate 513 outputs a signal B13 that is the logical NOT-AND of signal B11 and signal B12. Signal B13 is equal to the logical OR of the logical AND of signal B7 and signal B3 and the logical AND of signal B8 and signal B10.

Signal B7 and signal B8 are in a mutually inverted relation, so signal B13 is a signal that outputs signal B11 and signal B12 alternately, in synchronization with signal B7 and signal B8. The selection circuit 510 comprising the three NAND gates 511, 512, 513 thus switches between the two signals B3, B10 alternately and outputs them, synchronized by flip-flop 508.

NAND gate 14 outputs a signal, which is the logical NOT-AND of signal B8 and signal B4. NAND gate 15 outputs a signal, which is the logical NOT-AND of signal B7 and signal B3. NAND gate 16 outputs a signal B9 that is the logical NOT-AND of the output signals of NAND gates 14 and 15. Signal B9 is equal to the logical OR of the logical AND of signal B7 and signal B3 and the logical AND of signal B8 and signal B4; this signal B9 is output to the PE terminal of the programmable divider 502. The above constituent elements form the programmable frequency-division device 501.

Next, the operation of this programmable frequency-division device 501 will be described with reference to FIG. 20 and FIG. 21 (which shows waveforms of the signals). The operation of dividing a frequency by N+½=5.5, for example, when N=5, will be described. The inputs to terminals D50 to D54 are, respectively, '1,' '1,' '0,' '1,' '0.' In this state, the input signal B1, which has a local oscillatory frequency, is input to programmable divider 502, and when '2' is detected by the coincidence circuit 503, a detection signal B2 that goes high at '2' is output (see FIG. 21).

The output signal B3 of the first output means 506 is delayed by one-half cycle from signal B2. The output signals B4, B5 of flip-flop 507 are delayed by one cycle from signal B3. The output signals B7, B8 of flip-flop 508 alternately go on (rise) and go off (fall) in synchronization with the rise of signal B5, because signal B6 is at the high level. The output signal B10 of the second output means 509 is delayed by one-half cycle from signal B3, as explained above (see FIG. 21).

The output signal B11 of NAND gate 511 is the logical NOT-AND of signal B3 and signal B7, and extracts the high level of B3 on the divide-by-five side. The output signal B12 of NAND gate 512 is the logical NOT-AND of signal B10 and signal B8, and extracts the high level of signal B10 on the divide-by-six side. The output signal B13 of NAND gate 513 is the logical NOT-AND of signal B11 and signal B12, and combines the extracted parts of signal B11 and signal B12 (the extracted high-level part of signal B3 and the extracted high-level part of signal B10). Signal B13 is thus a signal that outputs signal B3 and signal B10 alternately, synchronized with flip-flop 508, as stated above. Signal B3 and signal B11 are offset by one-half cycle of signal B1, so signal B13 is divided by 5.5.

To summarize the material above, a programmable divider 502 that divides the frequency of input signal B1 alternately by N (for example, N=5) and N+1 is provided, and a first output means 506 that outputs a signal synchronized with the output of the programmable divider is provided. A second output means 509 that outputs a signal B10 delayed by one-half cycle with respect to the input signal B1, synchronized with the output of the programmable divider 502, is also provided.

When the programmable divider divides by N (divides by five), the selection circuit 510 selects the output signal B3 of the first output means 506. When the programmable divider 502 divides by N+1 (divides by six), the selection circuit 510 selects the output signal B10 of the second output means 509.

The prevention means 517 comprises the first output means 506, the second output means 509, etc. As stated above, the first output means 506 is, for example, a D-flip-flop with a built-in input inverting function for its clock input terminal CK, and the second output means 509 is, for example, a D-flip-flop not having an input inverting function for its clock input terminal CK.

With this structure, the first output means 506 operates with a signal obtained by inverting the input signal B1 as its clock. The second output means 509 operates with the input signal B1 as its clock pulse. The prevention means 517 thus prevents the second output means 509 from being delayed by more than one-half cycle with respect to the output of the first output means 506.

Figure 21:
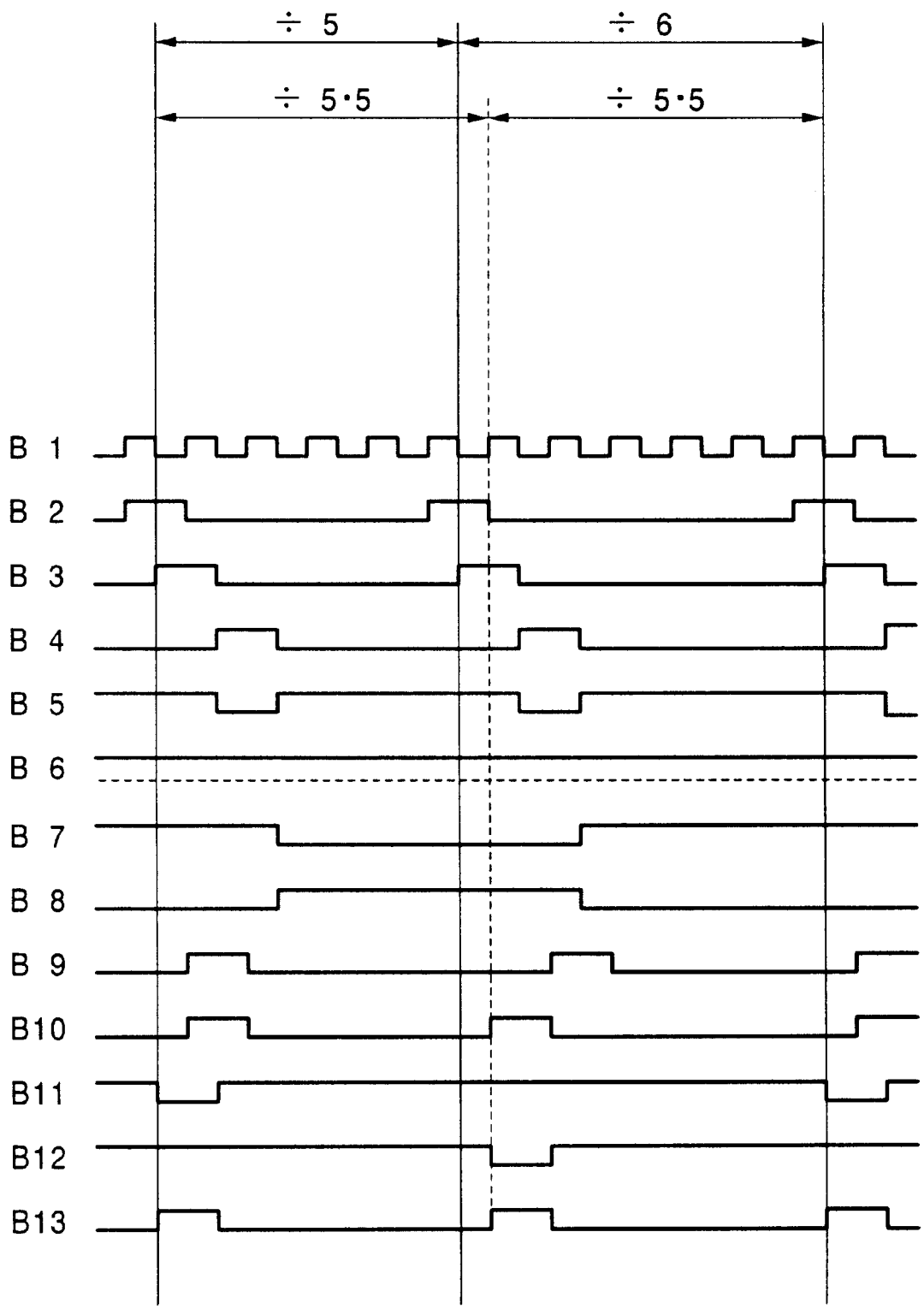
FIG. 21 is a timing diagram showing signals that appear in various parts of the programmable frequency-division device in FIG. 20.

By this prevention means 517, when the output signal B6 of terminal D50 is '1,' the programmable frequency-division device 501 can divide the frequency of the input signal B1, which has a local oscillator frequency, precisely by N+½ (for example, by 5.5 in FIG. 21). When signal B6 is '0,' the programmable frequency-division device 501 divides the frequency of the input signal B1 by N.

It is also permissible to use a D-flip-flop not having an inverting function for its clock input terminal as the first output means, and a D-flip-flop having an inverting function for its clock input terminal as the second output means, this being opposite to the above description.

Figure 22:
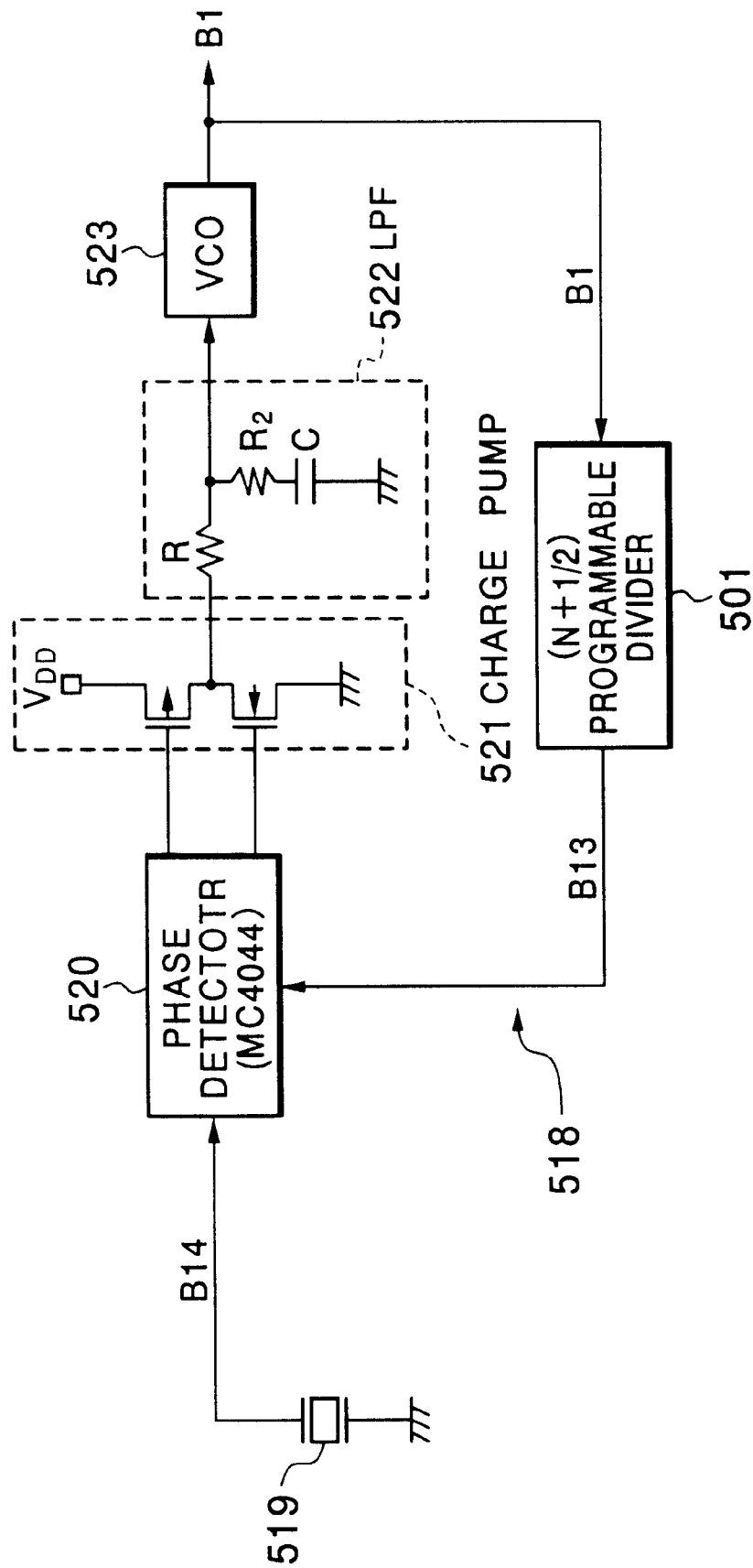
FIG. 22 is a block diagram of a PLL device using the programmable frequency-division device in FIG. 20.

Next, a PLL device 518 using the programmable frequency-division device 501 will be described with reference to the block diagram in FIG. 22. In FIG. 22, a reference signal output from a reference oscillator 519 is input to a phase detector 520 (MC4044). The signal (feedback signal) B13 output from the programmable frequency-division device 501 is also input to the phase detector 520.

The phase detector 520 compares the phase and frequency of feedback signal B13 with the phase and frequency of reference signal B14. As a result of the above comparison, the phase detector 520 outputs a pump-up signal and a pump-down signal to a charge pump 521.

In response to the above two signals, the charge pump 521 outputs an error signal to a low-pass filter 522. The low-pass filter 522 outputs a control voltage responsive to the error signal to a voltage-controlled oscillator 523. The voltage-controlled oscillator 523 outputs an output signal B1 responsive to the control voltage.

Next, the characteristics of the output signal B1 in this PLL device 518 were measured. The results of the measurements showed good jitter characteristics (almost no output of signals having frequencies other than the set frequency).

Figure 23:
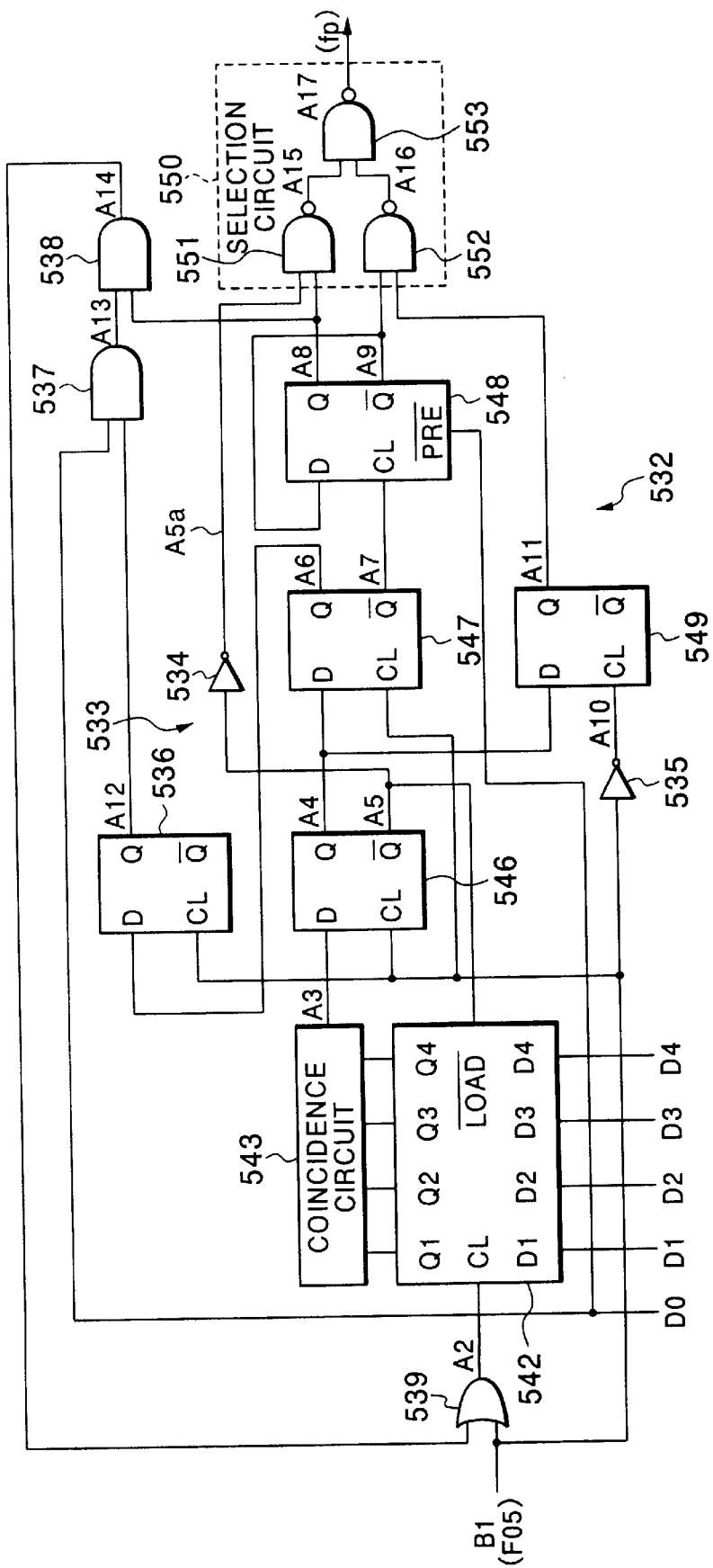
FIG. 23 is a block diagram of a programmable frequency-division device according to a ninth embodiment of the invention.

Next, the programmable frequency-division device 532 of a ninth embodiment of the invention will be described with reference to the block diagram in FIG. 23. The features of the programmable frequency-division device 532 in FIG. 23 are that instead of the first output means 506 in FIG. 20, which had an input inverting function, it uses a first output means 546 that does not have an input inverting function, inserts an inverter 534 between the inverting output terminal 'inverting Q' of the first output means 546 and NAND gate 551 in the selection circuit 550, and provides a second inverter 535 on the input side of the second output means 549.

The second inverter 535, which has, for example, generally the same device characteristics as the first inverter 534, is disposed between the input signal B1 and the second output means 549. These inverters 534, 535 form a prevention means 533.

In this configuration, signal A5 is an inverted version of the output signal A4 of the first output means 546. Signal A5 is again inverted by the first inverter 534, becoming a signal A5a that is delayed by a characteristic value with respect to the output A4 by the first inverter 534. The characteristic value depends on the device characteristics possessed by the first inverter 534 (arising from its resistive and capacitive components and the like).

The second inverter 535 is disposed between the input signal B1 and the clock terminal CL of the D-flip-flop that forms the second output means 549. The output signal A11 of the second output means 549 is accordingly a signal delayed with respect to the output signal A4 of the first output means 546 by one-half cycle of the input signal A1, and the characteristic value added by the second inverter 535.

Because the device characteristics of the first inverter 534 and the second inverter 535 are generally identical, their characteristic values are also generally identical. The phase difference between signal A5a and signal A11 is accordingly the sum of one-half cycle of the input signal B1 and the characteristic value of the second inverter 535, minus the characteristic value of the first inverter 534. As the above two characteristic values are identical, the above phase difference is precisely one-half cycle of the input signal A1.

The prevention means 533 can thus almost completely prevent the output signal A11 of the second output means 549 from being delayed by more than one-half cycle of the input signal A1 from the output signal A4 of the first output means 546. The result is that the programmable frequency-division device 532 can perform frequency division by precisely N+½.

INDUSTRIAL APPLICABILITY

A PLL device of one aspect of the invention comprises
a programmable frequency-division device (113, 114, 115, 116) that divide the frequency of the output of a voltage-controlled oscillator (112),
a reference signal generating means (101, 102, 103, 104) generating a first reference signal and a second reference signal that differ in phase,
a first phase detector (106) that compares the phases of said first reference signal and the output of said programmable frequency-division device,
a second phase detector (110) that compares the phases of said second reference signal and the output of said programmable frequency-division device,
a detector (118, 120, 122, 124) for detecting a locked state, and
a control unit (117),
wherein the control unit (117) causes both said first comparator (106) and said second comparator (110) to perform comparisons when the state is not locked, and causes one of said first comparator (106) and said second comparator (110) to perform comparisons when the state is locked, so as a result of this type of structure, when the state is not locked, it performs phase comparisons with a plurality of phase detectors at different timings, and phase comparisons are performed a plurality of times within one period of the reference signals, whereby the locking time is shortened. Moreover, in the locked state, it performs phase comparisons with one phase detector, so the increase in power consumption due to having multiple loops can be mitigated.

If a device that generates a lock detection signal from a pump-up signal and a pump-down signal output from the first comparator or the second comparator is used as said detector (118, 120, 122, 124), it can determine accurately whether or not the state is locked.

A PLL device according to another aspect of the invention comprises a programmable frequency-division device (113, 114, 115, 116) that divides the frequency of the output of a voltage-controlled oscillator (112), a reference signal generating means (101, 102, 103, 104) generating a first reference signal and a second reference signal that differ in phase, a first comparator (106) that compares the phases of said first reference signal and the output of said programmable frequency-division device, a second comparator (110) that compares the phases of said second reference signal and the output of said programmable frequency-division device, and a control unit (117), wherein when the control unit (117) alters the frequency-division ratio from a first value to a second value, it selects a predetermined one of said first comparator (106) and said second comparator (110) according to the difference between said first value and said second value, and causes that comparator to perform the comparison.

In this type of structure, when the difference between the first value and the second value is large, for example, it causes phase comparisons to be performed by both the first phase detector and the second phase detector. Consequently, the locking time is shortened because phase comparisons are performed multiple times in one period of the reference signals. When the above difference is small, for example, it causes phase comparisons to be performed by one of the first phase detector and the second phase detector. Since phase comparisons are performed by one phase detector, the power consumption due to having multiple loops can be mitigated.

If a device that generates said first reference signal (FR11) and a plurality of second reference signals (FR12, FR13, FR14) having different phases is used as said reference signal generating means (101, 102, 103, 104), and said second comparator (110) comprises a plurality of phase detectors (106, 107, 108, 109) that respectively compare the phases of said second reference signals and the output of said programmable frequency-division device, then phase comparisons can be performed even more times within one period of the reference signals, and the locking time can be further shortened.

A PLL device according to another aspect of the invention comprises a reference signal generating means (133, 134, 135, 136, 137) generating a plurality of reference signals with different phases, programmable dividers (145, 146, 147, 148) receiving, through a first fixed divider (143), the output of a voltage-controlled oscillator (144), and dividing the frequency thereof, and phase detectors (139, 140, 141, 142) comparing the phases of the outputs of said programmable dividers (145, 146, 147, 148) and said reference signals, wherein a plurality of said programmable dividers (145, 146, 147, 148) are provided, each performing frequency division with a frequency-division ratio of the form A+B/C (where A, B, and C are integers, and B<C).

It can thus be used in high frequency bands because, by a prescaler system using the first fixed divider, it can reduce the programmable dividers to an operating frequency that can be varied.

Moreover, since it provides a plurality of programmable dividers having frequency-division ratios of the form A+B/C, the spacing of the pulses (feedback signals) output by the programmable dividers is greatly reduced as compared with a conventional PLL device (with one programmable divider having a frequency-division ratio A). Consequently, the number of phase comparisons in one period of the reference signals is greater than the conventional number, so the lock-up time is shortened.

If B is one and C is two, the programmable dividers can divide the input frequency with half the conventional number of frequency divisions, without changing the operating frequency. Consequently, the spacing between the pulses output by the programmable dividers is half the conventional spacing, the number of phase comparisons performed in one period of the reference signals is greater than the conventional number, and the lock-up time is shortened to approximately half the conventional time.

If a second fixed divider dividing the reference frequency with a frequency-division ratio $2^{n-1}$ (where n is an integer equal to or greater than two) is provided, the frequency-division ratio of said first fixed divider is set to $2^n$, and there are $2^{n-1}$ of said programmable dividers, then the lock-up time can be kept at substantially the conventional time, even if the frequency of the reference signals is less than the conventional frequency, because the number of phase comparisons in one period of the reference signals is larger than the conventional number, since the programmable dividers have frequency-division ratios of A+½.

Moreover, since $2^{n-1}$ programmable dividers are provided, the number of programmable dividers and phase detectors can be reduced by half, in comparison with the PLL device according to the second embodiment. Consequently, the PLL device is small in size and easy to implement in an LSI, and its power consumption is lessened.

A PLL device according to another aspect of the invention comprises a plurality of PLL circuits (202, 205), each having at least a first phase detector (204, 254) and a first programmable divider (205, 255), a driving unit (216) having at least one second phase detector (220, 221, 222) and at least one second programmable divider (223, 224, 225), and a selective coupling means (235) selecting one PLL circuit (202, 252) from among said plurality of PLL circuits and coupling it to said driving unit (216), so the lock-up time (the time until synchronization with the output signal) is shortened, because a selectively switched one of the PLL circuits is coupled to the driving unit. Moreover, a single driving unit suffices for the two selected PLL circuits, so the cost is lower than in a configuration providing a driving unit for each PLL circuit.

If the first reference signal (FR21, FR25) input to said first phase detector in said coupled PLL circuit differs in phase from the second reference signal (FR22, FR23, FR24), which is input to said second phase detector, phase comparisons can be performed a plurality of times in one period of the first reference signal, because phase comparisons are performed with the first reference signal and the second reference signal, which differ in phase. Consequently, the lock-up time is shortened.

If said selective coupling means (235) comprises a first selection switch (231) selecting one of the reference signals output from said plurality of PLL circuits and supplying it to said driving unit (216), a second selection switch (231) selecting one of the oscillator outputs of voltage-controlled oscillators in said plurality of PLL circuits and supplying it to said driving unit, and a third selection switch (233) selectively supplying the output of the phase detector in said driving unit to (LPFs) in said plurality of PLL circuits, then one PLL circuit among the plurality of PLL circuits (the desired one) can be reliably coupled to the driving unit, and a closed phase-locked loop can be reliably formed.

If said plurality of PLL circuits (202, 252, 216) are allowed to output simultaneously to loads, and one of said PLL circuits having a high set frequency is selected and coupled to said driving unit, then the lock-up time can be further shortened, because a PLL circuit with a high set frequency is selected from among the PLL circuits and coupled to the driving unit.

A PLL device according to another aspect of the invention comprises a generating means (306) that generates a plurality of reference signals with different phases, a plurality of programmable dividers (311 to 314) that divide the frequency of the output of a voltage-controlled oscillator (315) and output feedback signals, a plurality of phase detectors (307 to 310) that compare the phases of said reference signals and said feedback signals, and a control unit (330) that starts the frequency division operations of said programmable dividers in synchronism with the phases of said reference signals, so since the frequency division operations of the programmable dividers are started in synchronism with the phases of the reference signals, the phase comparison timings of the phase detectors are substantially equally spaced, and accurate phase comparisons can be made. Each of the reference signals also has a different phase, and phase comparisons are performed for each reference signal. Consequently, phase comparisons are performed a plurality of times during one reference signal period, and the lock-up time is shorter than the conventional time.

Switching elements (322 to 325) may be provided between said voltage-controlled oscillator (315) and respective programmable dividers (311 to 314), a gate control circuit (331) formed from logic circuits may be provided in said control unit (330), and said gate control circuit (331) may turn said switching elements on in synchronism with the phases of said reference signals.

The reference signal frequency is, for example, about 10 kHz. If a plurality (four, for example) of reference signals with different phases are used, as stated above, the phase differences of the reference signals are 1 period/4=10−4× ¼=25 microseconds. With the microcomputers widely used at present, it is generally impossible to control the above phase differences.

Extremely small phase differences such as the above can be controlled accurately, however, by a gate control circuit comprising logic circuits, as above.

If said control unit causes said frequency division operations to begin when a frequency alteration command or a lock failure signal is input, then when a frequency alteration command is generated, this command occurring when the user alters the frequency, or when a lock failure signal is input, this signal occurring when the output signal loses its lock due to an external disturbance or the like, the control unit starts said frequency division operations. Accordingly, the lock-up time can be shortened and convenience can be improved by performing accurate phase comparisons when the frequency is altered or lock is lost.

Said control unit may reset said programmable dividers before starting said frequency division operations.

The phase comparison operations can be carried out accurately by having the control unit reset (initialize) the programmable dividers in this way.

If when said control unit detects lock, it causes a particular one of said programmable dividers to continue frequency division operation, and causes the other ones of said programmable dividers to stop frequency division operations, then the amount of power consumed can be reduced. An output signal having the set frequency can also be output in a stable manner by the frequency division operation of a particular one programmable divider.

If when said control unit detects lock, it causes the one of said programmable dividers on which the lock detection was performed to continue frequency division operation, and causes the other ones of said programmable dividers to stop frequency division operations, then accurate phase comparison can be performed and an output signal having the set frequency can be output in a stable manner even after lock is detected, by having the programmable divider for which lock was detected continue to perform the frequency division operation.

A PLL device according to another aspect of the invention comprises a generating means (430) that generates a plurality of reference signals with different phases, a main divider (430) that divides the frequency of the output signal of a voltage-controlled oscillator (429) by a frequency-division ratio N1, an auxiliary divider (431) that divides the frequency of the output of said main divider (430) by a frequency-division ratio N2, a distribution circuit (432) that distributes the output of said auxiliary divider (431) to a plurality of feedback signals, and phase detectors (412 to 419) that compare said reference signals and said feedback signals, and output error signals, wherein said main divider and said auxiliary divider each have a programmable divider or a counter.

Lock-up time is shortened because phase comparisons are performed multiple times within one period of the reference signals, by comparing the feedback signals with reference signals having different phases. Since there are two dividers, a main divider and an auxiliary divider, that divide the frequency of the output signal, it is not necessary to have four or more as previously. The cost is therefore low, LSI implementation is easy, and the amount of power consumed is small. Moreover, since the main divider and auxiliary divider comprise programmable dividers or counters, the combination of the frequency-division ratio N1 of the main divider and the frequency-division ratio N2 of the auxiliary divider can be selected freely.

The product of said frequency-division ratio N1 and said frequency-division ratio N2 may match a set frequency-division ratio of said output signal.

In such a structure, if the reference-signal frequency is FR41, the output-signal frequency is FO4, the frequency of the intermediate signal output by the main divider is FU, and the set frequency-division ratio is N, then FR41=FO4/N, FO4=N1×FU, and N=N1×N2. Therefore, FR41=(N1×FU)/(N1×N2)=FU/N2. The reference signals are therefore the intermediate signal with its frequency divided by N2, that is, and the rise timings of the reference signals match the rise timings of the feedback signals. The comparisons between the feedback signals and the reference signals that have different phases are therefore performed at the same timing, whereby the phase comparisons are performed accurately.

If the value of said frequency-division ratio N2 of said auxiliary divider is determined in response to the size of said set frequency-division ratio, then the amount of power consumed by the auxiliary divider can be reduced by reducing the frequency-division ratio N2 of the auxiliary divider when the set frequency-division ratio is small.

If the PLL device includes a plurality of phase detectors that compare said reference signals and said feedback signals, and said frequency-division ratio N2 is equal to or less than the number of said phase detectors, then the optimal frequency-division ratio N2 can be selected according to the size of the set frequency-division ratio, the desired lock-up time, the desired amount of power consumption, and soon.

The PLL device of claim 18, adapted to have said main divider and said auxiliary divider divide the frequency of said output signal, then afterward to have only said main divider divide the frequency, for a certain set frequency-division ratio applying to said output signal.

With this structure, even if the frequency-division ratio setting N cannot be expressed as a product of the frequency-division ratio N1 of the main divider and the frequency-division ratio N2 of the auxiliary divider, an output signal having the set frequency-division ratio N can be obtained by having operations performed to perform frequency division by both dividers with a value close to the frequency-division ratio N, and (for example, when a frequency-division ratio equal to the product of N1 and N2 has been achieved, that is, after the locked state has been reached), having frequency division by N performed with the main divider only.

Moreover, even if the set frequency-division ratio setting N can be expressed as a product of frequency-division ratio N1 and frequency-division ratio N2, the lock-up time can be shortened by having the frequency divided by the main divider and the auxiliary divider. After start-up (for example, when the set frequency-division ratio N has been reached, that is, when the locked state has been reached), the amount of power consumed can be further reduced by having the frequency divided by the main divider 430 alone.

A PLL device according to another aspect of the invention comprises a generating means (403) that generates a plurality of reference signals with different phases, a first frequency-division unit (430, 431) and a second frequency-division unit (481), each dividing the frequency of the output signal of a voltage-controlled oscillator (429), and phase detectors (412 to 419) that compare the phases of feedback signals output by said first frequency-division unit and said second frequency-division unit and said reference signals, and output error signals.

Lock-up time is shortened because phase comparisons are performed multiple times within one period of the reference signals, by comparing the feedback signals with reference signals having different phases. Since the dividers that divide the frequency of the output signal are only the first frequency-division unit and the second frequency-division unit, it is not necessary to have eight or more as previously. The cost is therefore low, LSI implementation is easy, and the amount of power consumed is small.

Said first frequency-division unit (430+431) may comprise a main divider (430) that divides the frequency of said output signal by a frequency-division ratio N1, an auxiliary divider (431) that divides the frequency of the output of said main divider (430) by a frequency-division ratio N2, and a distribution circuit (482) that distributes the output of said auxiliary divider (431) to a plurality of said feedback signals, said main divider (430) and said auxiliary divider (431) having programmable dividers or counters.

Configuring the main divider and auxiliary divider with programmable dividers or counters in this way enables the frequency-division ratio N1 of the main divider and the frequency-division ratio N2 of the auxiliary divider to be selected freely. That is, an appropriate value can be selected for the frequency-division ratio N2 of the auxiliary divider from the size of the set frequency-division ratio, the desired lock-up time, the desired amount of power consumption, and so on.

Said second frequency-division unit (481) may comprise a programmable divider that performs frequency division with a set frequency-division ratio N, and the product of said frequency-division ratio N1 and said frequency-division ratio N2 may match said set frequency-division ratio N or a value close thereto.

As a result of this structure, if the frequency of the reference signals is FR41, the frequency of the output signal is FO4, the frequency of the intermediate signal output by the main divider is FU, and the set frequency-division ratio is N, then FR41 FO4/N. In addition, FO4=N1×FU, and N=N1×N2. Accordingly, FR41=(N1×FU)/(N1×N2)=FU/N2. The reference signals are therefore the intermediate signal with its frequency divided by N2, and the rise timings of the reference signals match the rise timings of the feedback signals.

If said first frequency-division unit is operated before lock, and said first frequency-division unit is stopped after lock, and if said second frequency-division unit is caused to perform frequency division with a frequency-division ratio equal to the product of said set frequency-division ratios N1 and N2 before lock, and said second frequency-division unit is caused to perform frequency division with said set frequency-division ratio N after lock, then even if the set frequency-division ratio N cannot be expressed as a produce of the frequency-division ratio N1 of the main divider and the frequency-division ratio N2 of the auxiliary divider that constitute the first frequency-division unit, the first frequency-division unit and second frequency-division unit are made to perform frequency division in parallel. Before lock the second frequency-division unit performs frequency division with a frequency-division ratio equal to the product of N1 and N2; after lock, the frequency-division ratio is switched to N, but since the product of N1 and N2 is close to N, the switching of the frequency-division ratio can be performed smoothly. Since it can be altered smoothly, the lock-up time can be further shortened. After lock, power consumption becomes still less because the first frequency-division unit is stopped. Moreover, even if the set frequency-division ratio N can be expressed as a product of frequency-division ratio N1 and frequency-division ratio N2, the lock-up time is shortened by having the frequency divided by the first frequency-division unit and second frequency-division unit at start-up (before lock). After start-up (after lock-up), the amount of power consumed can be further reduced by having the frequency divided by the second frequency-division unit alone.

Said distribution circuit (482) may output said feedback signals in synchronism with the timing of the generation of said reference signals, and a plurality of phase detectors that compare the phases of said feedback signals and said reference signals may be provided.

With this structure, the comparisons between the feedback signals and the reference signals that have different phases are performed at the same timing in the plurality of phase detectors, so the phase comparisons are performed accurately.

A programmable frequency-division device according to another aspect of the invention comprises a programmable divider (502, 542) that divides the frequency of an input signal alternately by N (where N is an integer) and by N+1, a first output means (506, 546) that outputs a signal synchronized with the output of said programmable divider (502, 542), a second output means (509, 549) that outputs a signal in which a signal synchronized with the output of said programmable divider is delayed by one-half cycle with respect to said input signal, a selection circuit (510, 550) that selects the output of said first output means when said programmable divider performs frequency division by N, and selects the output of said second output means when said programmable divider performs frequency division by N+1, and a prevention means (507, 509; 534, 535) that prevents the output signal of said second output means from being delayed by more than said one-half cycle, so the output signal of the second output means (509, 549) is delayed from the output signal of the first output means (509, 549) by precisely one-half cycle of the input signal. Consequently, frequency division by precisely N+½ is performed, and the jitter characteristic is improved.

Said first output means (506) may have an input inverting function, said second output means may not have an input inverting function, and the first output means (506) and the second output means (509) may constitute the prevention means.

Said first output means (506) may not have an input inverting function, said second output means may have an input inverting function, and the first output means (506) and the second output means (509) may constitute the prevention means.

If a device having an input inverting function is used for just one of the first output means and the second output means in this way, the delay having a particular value due to the device characteristics of the conventional external inverter is eliminated. Consequently, the output signal of the second output means is delayed from the output signal of the first output means by precisely one-half cycle of the input signal.

If said prevention means comprises a first inverter (534) disposed between said first output means (546) and said selection circuit (550), and a second inverter (535) disposed between said input signal (B1) and said second output means (549), then the characteristic delay of the first inverter (534) and the characteristic delay of the second inverter (535) cancel out in the phase difference between the output of the first output means (546) and the output of the second output means (549), so it becomes approximately equal to one-half the cycle of the input signal. Consequently, frequency division by precisely N+½ is performed, and the jitter characteristic is improved.

What is claimed is:

1. A PLL device, comprising:

a voltage-controlled oscillator;

a generating means that generates a plurality of reference signals with different phases;

a main divider that divides the frequency of the output signal of the voltage-controlled oscillator by a frequency-division ratio N1;

an auxiliary divider that divides the frequency of the output of said main divider by a frequency-division ratio N2;

a distribution circuit that distributes the output of said auxiliary divider as a plurality of feedback signals; and phase detectors that compare said reference signals and said feedback signals, and output error signals; wherein each of said main divider and said auxiliary divider has a programmable divider or a counter, and said main divider and said auxiliary divider are both operative during start-up to shorten PLL lock-up time and the auxiliary divider then powers down to reduce power consumption.

2. The PLL device of claim 1, further comprising means for making the product of said frequency-division ratio N1 and said frequency-division ratio N2 match a set frequency-division ratio of said output signal of the voltage-controlled oscillator.

3. The PLL device of claim 2, further comprising means for determining the value of said frequency-division ratio N2 of said auxiliary divider in response to the size of said set frequency-division ratio.

4. The PLL device of claim 1, wherein said frequency-division ratio N2 is equal to or less than the number of said phase detectors.

* * * * *